(12) United States Patent
Takizawa et al.

(10) Patent No.: US 7,588,863 B2
(45) Date of Patent: *Sep. 15, 2009

(54) HOLOGRAM RECORDING METHOD AND HOLOGRAM RECORDING MATERIAL

(75) Inventors: Hiroo Takizawa, Kanagawa (JP); Noriko Inoue, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 618 days.

This patent is subject to a terminal disclaimer.

(21) Appl. No.: 10/925,086

(22) Filed: Aug. 25, 2004

(65) Prior Publication Data

US 2005/0058910 A1 Mar. 17, 2005

(30) Foreign Application Priority Data

Aug. 25, 2003 (JP) ............................. 2003-300057

(51) Int. Cl.
*G03H 1/04* (2006.01)
*G03C 1/675* (2006.01)

(52) U.S. Cl. ............................. 430/1; 430/2; 430/280.1; 430/394; 359/3

(58) Field of Classification Search ........................ None
See application file for complete search history.

(56) References Cited

U.S. PATENT DOCUMENTS

| | | | | |
|---|---|---|---|---|
| 3,615,454 A | * | 10/1971 | Cescon et al. | 430/292 |
| 3,658,526 A | * | 4/1972 | Haugh | 430/1 |
| 3,784,378 A | | 1/1974 | Gramas | |
| 4,288,861 A | | 9/1981 | Swainson et al. | |
| 4,917,977 A | * | 4/1990 | Smothers | 430/1 |
| 5,256,520 A | | 10/1993 | Smothers | |
| 5,543,251 A | * | 8/1996 | Taylor | 430/1 |
| 5,858,614 A | | 1/1999 | Sato et al. | |
| 6,127,085 A | * | 10/2000 | Yamamura et al. | 430/177 |
| 6,432,610 B1 | | 8/2002 | Rentzepis et al. | |
| 2001/0026381 A1 | * | 10/2001 | Shirakura et al. | 359/35 |

(Continued)

FOREIGN PATENT DOCUMENTS

EP     408227     * 1/1991

(Continued)

OTHER PUBLICATIONS

Turberfield, Photonic Crystals made by Holographic Lithography, MRS Bull. pp. 632-636 (Aug. 2001).*

(Continued)

*Primary Examiner*—Martin J Angebranndt
(74) *Attorney, Agent, or Firm*—Sughrue Mion, PLLC

(57) ABSTRACT

To provide a hologram recording method capable of satisfying high sensitivity and at the same time, satisfying high diffraction efficiency, good preservability, low shrinkage percentage, dry processing and multiplex recording properties, a hologram recording method comprises a first step of producing a latent image upon holographic exposure, and a second step of causing a polymerization reaction due to the latent image, to form a interference fringe providing a refractive index modulation, wherein the first and second steps are dry process; particularly, the first step is a step of producing a colored material to form the latent image and the second step is a step of causing the polymerization reaction upon irradiating the colored material with a light having a wavelength different from that of the holographic exposure, to form the interference fringe providing the refractive index modulation.

16 Claims, 1 Drawing Sheet

U.S. PATENT DOCUMENTS

| | | | |
|---|---|---|---|
| 2002/0064728 A1 | 5/2002 | Weed et al. | |
| 2002/0182530 A1 | 12/2002 | Takashima et al. | |
| 2003/0086137 A1 | 5/2003 | Pastor | |
| 2003/0129501 A1* | 7/2003 | Megens et al. | 430/1 |
| 2004/0245432 A1* | 12/2004 | Takizawa | 250/208.1 |
| 2005/0003133 A1* | 1/2005 | Akiba et al. | 428/64.2 |
| 2005/0046915 A1* | 3/2005 | Takizawa et al. | 359/3 |
| 2005/0221198 A1* | 10/2005 | Takizawa et al. | 430/1 |
| 2006/0078803 A1* | 4/2006 | Takizawa et al. | 430/1 |
| 2006/0188790 A1* | 8/2006 | Takizawa | 430/1 |
| 2006/0194122 A1* | 8/2006 | Takizawa | 430/1 |
| 2007/0047038 A1* | 3/2007 | Takizawa | 359/3 |
| 2007/0048666 A1* | 3/2007 | Takizawa | 430/281.1 |

FOREIGN PATENT DOCUMENTS

| | | | |
|---|---|---|---|
| EP | 0 613 028 A2 | | 8/1994 |
| EP | 0 762 208 A2 | | 3/1997 |
| JP | 74015490 | * | 4/1974 |
| JP | 59-178448 | * | 10/1984 |
| JP | 61-183644 | * | 8/1986 |
| JP | 63-261352 | * | 10/1988 |
| JP | 2-3082 A | | 1/1990 |
| JP | 3-50588 A | | 3/1991 |
| JP | 5-107999 A | | 4/1993 |
| JP | 6-43634 A | | 2/1994 |
| JP | 8-16078 A | | 1/1996 |
| JP | 11-512847 A | | 11/1999 |
| JP | 2001-523842 A | | 11/2001 |
| WO | 80/01846 | * | 9/1980 |
| WO | 97/44365 A1 | | 11/1997 |
| WO | 01/71431 A1 | | 9/2001 |
| WO | 01/96961 | * | 12/2001 |
| WO | WO 01/96409 A2 | | 12/2001 |

OTHER PUBLICATIONS

Campbell, et al., Fabrication of Photonic Crystals for the Visible Spectrum by Holographic Lithography, Nature, vol. 404. pp. 53-56 (Mar. 2000).*

Latta "The bleaching of holographic diffraction gratings for maximum efficiency", Appl. Opt., vol. 7(12) pp. 2409-2416 (Dec. 1968).*

Gomurashvili et al., 'Phenothiazine photosensitizers for onium salt photoiniaitited cationci polymerization', J. Poly. Sci. A., vol. 39 pp. 1187-1197 (2001).*

Yuji Kaneko et al., "Simultaneous Photoinduced Color Formation and Photoinitiated Polymerization" (1998) J. Phys. Chem., vol. 102, No. 28, pp. 5356-5363.

V. Weiss et al., "Organic Materials for Real-Time Holographic Recording" (1997) Journal of Imaging Science and Technology, vol. 41, No. 4, pp. 371-382.

European Search Report dated Jul. 11, 2006.

Cornelius Diamond et al., "Two-photon holography in 3-D photopolymer host-guest matrix", Optics Express, Jan. 31, 2000, pp. 64-68, vol. 6, No. 3.

B.R. Clay et al., "Holographic Moving Map Display", Optical Engineering, Sep./Oct. 1974, pp. 1-5.

* cited by examiner

HOLOGRAM RECORDING METHOD AND HOLOGRAM RECORDING MATERIAL

BACKGROUND OF THE INVENTION

1. Field of the Invention

The present invention relates to a hologram recording material and a hologram recording method, which can be applied to a high-density optical recording medium, a three-dimensional display, a holographic optical device and the like.

2. Background Art

The general principle regarding the production of a hologram is described in some publications and technical books, for example, in Junpei Tsujiuchi (compiler), *Holographic Display*, Chap. 2, Sangyo Tosho. According to these publications or books, one of two beams of coherent laser light is irradiated on an object to be recorded and at the position capable of receiving the entire light reflected therefrom, a photosensitive hologram recording material is disposed. On the hologram recording material, in addition to the light reflected from the object, another coherent light beam is directly irradiated without colliding to the object. The light reflected from the object is called an object light and the light directly irradiated on the recording material is called a reference light. Interference fringes formed by the reference light and the object light are recorded as the image information. Thereafter, when a light (reproductive illumination light) same as the reference light is irradiated on the processed recording material, the light is diffracted by the hologram to reconstruct the wavefront of the reflected light first reached to the recording material from the object at the recording, as a result, almost the same object image as the actual image of the object can be three-dimensionally observed.

A hologram formed by injecting the reference light and the object light into the hologram recording material from the same direction is called a transmission hologram, where interference fringes perpendicular or nearly perpendicular to the film surface direction of the recording material are formed with a spacing of about 1,000 to 3,000 fringes per 1 mm.

Also, a hologram formed by injecting these light beams from opposite sides to each other of the hologram recording material is generally called a reflection hologram, where interference fringes parallel or nearly parallel to the film surface direction of the recording material are formed with a spacing of about 3,000 to 7,000 fringes per 1 mm.

The transmission hologram can be produced by a known method disclosed, for example, in JP-A-6-43634 (the term "JP-A" as used herein means an "unexamined published Japanese patent application) (Patent Document 1), and the reflection hologram is produced by a known method disclosed, for example, in JP-A-2-3082 (Patent Document 2) and JP-A-3-50588 (Patent Document 3).

A hologram having a sufficiently large film thickness for the interference fringe spacing (this thickness usually indicates a film thickness of about 5 times or more the interference fringe spacing, or about 1 μm or more) is called a volume hologram.

On the other hand, a hologram having a film thickness of about 5 times or less the interference fringe spacing or about 1 μm or less is called a plane hologram or a surface hologram.

Furthermore, a hologram where interference fringes are recorded by the absorption of dye or silver is called an amplitude hologram, and a hologram where interference fringes are recorded by surface relief or refractive index modulation is called a phase hologram. The amplitude hologram is greatly decreased in the light diffraction or reflection efficiency due to absorption of light and is not preferred in view of usability of light. Usually, a phase hologram is preferably used.

The hologram can reproduce a three-dimensional stereoscopic image and because of its excellent design property and decorative effect, this has been heretofore used, for example, for a cover of book, magazine or the like, a display such as POP, and a gift. In particular, for the purpose of anticounterfeit security, the hologram is used for a credit card, a bank bill, a package and the like and a market for the hologram is large at present.

The hologram for these uses is a plane-type surface-relief phase hologram and this is also called an embossed hologram because this hologram is usually mass-replicated after forming an emboss pattern from a master produced by using a photoresist.

However, the surface-relief phase hologram can hardly achieve full color formation, white color reproduction, high resolution and high diffraction efficiency and in recent years, a volume phase hologram capable of realizing these is attracting attention.

In the volume phase hologram, a large number of interference fringes having a difference in the refractive index but not in the optical absorption are formed in a hologram recording material, whereby the light phase can be modulated without absorbing light.

Particularly, a reflection-type volume phase hologram is also called a Lippmann hologram and by virtue of wavelength-selective reflection due to Bragg diffraction, this hologram can realize full color formation, white reproduction and high resolution with high diffraction efficiency and can provide a high-resolution full-color three-dimensional display.

Also, in recent years, by making good use of its wavelength-selective reflection, this hologram is widely used in practice for hologram optical devices as represented by on-vehicle head-up display (HUD), pickup lens for optical disk, head mount display, color filter for liquid crystal, reflection-type liquid crystal reflector and the like.

Other than these, studies are being made on its practical use for or application to a lens, a diffraction grating, an interference filter, a coupler for optical fiber, a polariscope for facsimile, a window glass for building, and the like.

As for known materials for recording a volume phase hologram, the write-once type includes a gelatin bichromate system, a bleached silver halide system and a photopolymer system, and the rewritable type includes a photorefractive system and a photochromic polymer system.

However, these known materials for recording a volume phase hologram are failing in satisfying all requirements required particularly in use for a high-sensitivity high-resolution full-color three-dimensional display, and improvements are demanded.

More specifically, for example, the gelatin bichromate system has high diffraction efficiency and low noise property but despite such advantages, this system has a problem in that the storability is very bad, a wet processing is necessary and the sensitivity is low.

The bleached silver halide system has high sensitivity but despite such an advantage, this system has a problem in that a wet processing is necessary, the bleaching process is cumbersome and the light fastness is poor.

The photorefractive material is rewritable but despite such an advantage, this material has a problem in that a high electric field must be applied at the recording and the recording preservability is bad.

The photochromic polymer system as represented by an azobenzene polymer material and the like is rewritable but despite such an advantage, this system has a problem in that the sensitivity is very low and the recording preservability is bad.

Under these circumstances, the dry-processing photopolymer system disclosed in Patent Documents 1 to 3 supra can be said to be a relatively practicable system capable of achieving both high diffraction efficiency and dry processing, because in this system, a basic composition comprising a binder, a radical-polymerizable monomer and a photoinitiator is used and for enhancing the refractive index modulation, an aromatic or chlorine- or bromine-containing compound is contained in either the binder or the radical-polymerizable monomer to impart a refractive index difference, as a result, the polymerization proceeds while gathering the monomer in the bright part of the interference fringes formed upon holographic exposure and gathering the binder in the dark part, whereby a refractive index difference can be formed.

However, this system has a problem in that the sensitivity is about $\frac{1}{1,000}$ as compared with the bleached silver halide system, a heat-fixing processing as long as nearly 2 hours is necessary for enhancing the diffraction efficiency and because of radical polymerization, the diffraction wavelength and angle at the reproduction are changed due to the effect of polymerization inhibition by oxygen or resulting from shrinkage of the recording material after exposure and fixing. Thus, more improvements are demanded.

With recent progress in advanced information society, network (e.g., Internet) and high-vision TV are rapidly spreading. In addition, the start of HDTV (High Definition Television) broadcasting is near at hand. To cope with such a tendency, demands for a high-density recording medium capable of easily and inexpensively recording image information of 100 GB or more are increasing also in civilian uses.

Furthermore, along with a movement to high-capacity computers and the like, in business uses such as use for backup of computer or broadcast, an ultrahigh-density recording medium capable of recording large-volume information of about 1 TB or more at high speed and low cost is demanded.

To satisfy such demands, instead of a magnetic tape medium incapable of random access or a hard disk incapable of commutation and liable to break down, a compact and inexpensive optical medium capable of commutation and random access is attracting more attention. However, in view of physical principle, existing two-dimensional optical mediums such as DVD-R can have a capacity of about 25 GB at most even if the recording/reproducing wavelength is shifted to a short wavelength, and a recording capacity large enough to cope with the requirement in future cannot be expected.

Therefore, a three-dimensional optical recording medium is being taken notice of as an ultimate ultrahigh-density recording medium. The effective method therefor includes a method of using a two-photon absorbing material and a method of using holography (interference), and in recent years, the material for recording a volume phase hologram is abruptly gathering attention as a three-dimensional optical recording medium.

In the optical recording medium using a material for recording a volume phase hologram, a large amount of two-dimensional digital information (called signal light) is recorded by using a spatial light modulation device (SLM) such as DMD and LCD in place of the object light reflected from a three-dimensional objective. At the recording, multiplex recording such as angle multiplex, phase multiplex, wavelength multiplex and shift multiplex is performed and therefore, high-volume information reaching even 1 TB can be recorded. In the reading out thereof, CCD, CMOS or the like is usually used and by its parallel writing and reading, a high-speed transfer reaching even 1 Gbps can be attained.

The requirements required of the hologram recording material for use in a holographic memory are severer than in use for a three-dimensional display or HOE and these are:

(1) high sensitivity,
(2) high resolution,
(3) high diffraction efficiency of hologram,
(4) dry and rapid processing at the recording,
(5) capability of multiplex recording (wide dynamic range)
(6) small shrinkage percentage after recording, and
(7) good preservability of hologram.

Among these, (1) high sensitivity is a property chemically conflicting with (3) high diffraction efficiency, (4) dry processing, (6) small shrinkage percentage after recording and (7) good preservability, and it is very difficult to attain high sensitivity at the same time with other properties.

For example, the bleached silver halide system has high sensitivity but since a wet processing is necessary, this system is generally not suitable for use in a high-density recording material.

WO97/44365A1 (Patent Document 4) discloses a rewritable hologram recording material using refractive index anisotropy and orientation control of an azobenzene polymer (photochromic polymer), but this material has a problem in that the quantum yield of azobenzene isomerization is low, the sensitivity is very low because of a system accompanied with change of orientation and the recording preservability conflicting with rewritability is bad. Thus, its practical use is hardly expected.

On the other hand, the dry photopolymer system using radical polymerization described in Patent documents 1 to 3 supra has relatively high sensitivity among photopolymer systems, but the shrinkage percentage is very large and use for a holographic memory is impossible. Moreover, since the film is soft, this system is not satisfied also in the preservability.

In contrast with radical polymerization, the cationic polymerization, particularly, cationic polymerization accompanied with ring opening of an epoxy compound or the like causes less shrinkage after polymerization, is free of polymerization inhibition by oxygen and gives a rigid film. Accordingly, the cationic polymerization is sometimes said to be more suitable for holographic memory use.

For example, JP-A-5-107999 (Patent Document 5) and JP-A-8-16078 (Patent Document 6) are disclosing a hologram recording material using a cationic polymerizable compound (monomer or oligomer) in place of a binder and combining it with a sensitizing dye, a radical polymerization initiator, a cationic polymerization initiator and a radical polymerizable compound.

Also, for example, JP-T-2001-523842 (the term (the term "JP-T" as used herein means a "published Japanese translation of a PCT patent application") (Patent document 7) and JP-T-11-512847 (Patent document 8) are disclosing a hologram recording material not using radial polymerization but using only a sensitizing dye, a cationic polymerization initiator, a cationic polymerizable compound and a binder.

These cationic polymerization systems are improved in the shrinkage percentage as compared with the radical polymerization system, but on the other hand, the sensitivity is decreased and in practical use, this is considered to cause a serious problem in view of transfer speed. Also, the diffraction efficiency is decreased and this is considered to cause a problem in view of S/N ratio or multiplex recording.

As described above, the photopolymer system is a system accompanied with mass transfer and when studied on its application to a holographic memory, this encounters a dilemma that the design for good preservability and small shrinkage causes reduction of sensitivity (cationic polymerization system) and on the contrary, the design for high sensitivity causes worsening of preservability and shrinkage property (radical polymerization system). Also, multiplex recording over 50 times, preferably 100 times or more, is essential for enhancing the recording density of a holographic memory, but since the recording of the photopolymer system uses polymerization accompanied with mass transfer, the recording speed of multiplex recording in the later stage after polymerization of many compounds has proceeded decreases as compared with the recording speed of multiplex recording in the initial stage. Thus, it is a large problem in practice to control the exposure amount for preventing the reduction of recording speed and take a wide dynamic range.

On the other hand, the silver halide system forms, similarly to silver salt photograph, a latent image with slight light at the holographic exposure and the latent image is amplified at the development, therefore, its greatest attractiveness is that the sensitivity is high as compared with other systems such as photopolymer system.

However, the silver halide system which is a system of converting silver halide into developed silver (black) at the development has a problem in that, for example, the processing is wet processing and since this is an amplification type but not a phase type, the diffraction efficiency is very low. Because of these problems, this system is not suitable for holographic memory use.

The bleached silver halide system of bleaching (oxidizing) developed silver to return it to silver halide turns into a phase type and the diffraction efficiency is improved, but there arise new problems that the preservability changes for the worse, large scattering occurs and the processing is wet processing and is cumbersome. Thus, this system is also not suitable for holographic memory use.

In view of physical law, the conflict of high sensitivity with good preservability, low shrinkage percentage and dry processing, and those problems in the multiplex recording properties are unavoidable as long as conventional photopolymer systems are used. Also, the silver halide system in principle can hardly satisfy the requirements required of the holographic memory particularly in view of dry processing.

For applying the hologram recording material to a holographic memory, it is strongly demanded to develop an utterly new recording system capable of drastically overcoming these problems, particularly, satisfying high sensitivity and at the same time, satisfying low shrinkage, good preservability, dry processing and multiplex recording properties.

SUMMARY OF THE INVENTION

An object of the present invention is to provide a hologram recording material and a hologram recording method, which are applicable to a high-density optical recording medium, a three-dimensional display, a holographic optical device and the like and can satisfy high sensitivity and at the same time, satisfy high diffraction efficiency, good preservability, low shrinkage percentage, dry processing and multiplex recording properties.

As a result of intensive investigations made by the present inventors, the object of the present invention can be attained by the following techniques.

(1) A hologram recording method, which comprises:
a first step of producing a latent image by holographic exposure; and
a second step of causing a polymerization reaction due to the latent image, so as to form a first interference fringe providing a refractive index modulation,
wherein each of the first step and the second step is dry process.

(2) The hologram recording method as described in (1), wherein the second step comprises at least one of light irradiation and heat application.

(3) The hologram recording method as described in (1) or (2), wherein the second step comprises light irradiation.

(4) The hologram recording method as described in any one of (1) to (3),
wherein the first step is a step of producing a colored material to form the latent image, the colored material having no absorption of a hologram reproducing light; and
the second step is a step of causing the polymerization reaction upon irradiating the colored material with a light which has a wavelength different from that of the holographic exposure, so as to form the first interference fringe providing the refractive index modulation.

(5) The hologram recording method as described in (4), wherein the second step is a step of causing the polymerization reaction while the colored material is self-sensitized or self-amplified upon irradiating the colored material with a light which has a wavelength different from that of the holographic exposure, so as to form the first interference fringe providing the refractive index modulation.

(6) The hologram recording method as described in any one of (1) to (5), wherein a silver halide is not used.

(7) The hologram recording method as described in any one of (1) to (5), wherein the hologram recording is an unrewritable system.

(8) The hologram recording method as described in (4) or (5), wherein the light irradiated in the second step has a wavelength different from that of the holographic exposure; and at the wavelength, a sensitizing dye, capable of being excited upon the holographic exposure in the first step, has a molar absorption coefficient of 5,000 or less.

(9) The hologram recording method as described in (8), wherein the light irradiated in the second step has a wavelength different from that of the holographic exposure; and at the wavelength, a sensitizing dye, capable of being excited upon the holographic exposure in the first step, has a molar absorption coefficient of 1,000 or less.

(10) The hologram recording method as described in (8) or (9) wherein the light irradiated in the second step has a wavelength different from that of the holographic exposure; and at the wavelength, a sensitizing dye, capable of being excited upon the holographic exposure in the first step, has a molar absorption coefficient of 500 or less.

(11) The hologram recording method as described in any one of (8) to (10), wherein the light irradiated in the second step has a wavelength where the colored material has a molar absorption coefficient of 1,000 or more.

(12) The hologram recording method as described in any one of (1) to (11), which comprises fixing a sensitizing dye, capable of being excited upon the holographic exposure in the first step, by decomposing the sensitizing dye in the first step, the second step or a subsequent fixing step of at least one of light irradiation and heat application.

(13) The hologram recording method as described in (1) to (12), which comprises fixing a colored material to form the latent image, the colored material having no absorption of a hologram reproducing light, by decomposing the colored material in the second step or a subsequent fixing step of at least one of light irradiation and heat application.

(14) A hologram recording material on which a hologram is recorded by a hologram recording method described in (1) to (13), the hologram recording material comprising:
1) a sensitizing dye capable of absorbing a light upon holographic exposure in the first step to be transformed into a first excited state;
2) a dye precursor capable of forming a colored material as a result of one of electron transfer and energy transfer from the first excited state of the sensitizing dye; or from a second excited state of the colored material, the second excited state of the colored material being formed in the second step,
wherein the colored material has an absorption at a longer wavelength than a wavelength where the dye precursor has an absorption; and the colored material has no absorption of a hologram reproducing light;
3) a polymerizable compound;
4) a polymerization initiator capable of initiating polymerization of the polymerizable compound as a result of one of electron transfer and energy transfer from the first excited state of the sensitizing dye or from the second excited state of the colored material; and
5) a binder.

(15) The hologram recording material as described in (14), wherein the dye precursor is capable of forming the colored material having an absorption at a longer wavelength than a wavelength where the dye precursor has an absorption; having no absorption of a hologram reproducing light; and having absorption maximum in a region between a wavelength of a hologram reproducing light and a wavelength of 200 nm shorter than the wavelength of the hologram reproducing light.

(16) The hologram recording material as described in (14) or (15),
wherein the polymerizable compound and the binder differ in refractive index; and
the polymerizable compound is capable of being photopolymerized to record a interference fringe in the hologram recording material, wherein when the polymerizable compound is photopolymerized to provide a polymerized compound, a composition ratio of the polymerizable compound or the polymerized compound to the binder is different between a bright portion of the interference fringe and a dark portion of the interference fringe, so as to form a interference fringe providing a refractive index modulation.

(17) The hologram recording material as described in any one of (14) to (16), wherein the binder has a refractive index lower than that of the polymerizable compound.

(18) The hologram recording material as described in any one of (14) to (17), wherein the polymerizable compound contains at least one aryl group, aromatic heterocyclic group, chlorine atom, bromine atom, iodine atom or sulfur atom and the binder has a refractive index lower than that of the polymerizable compound.

(19) The hologram recording material as described in any one of (14) to (18), wherein at least one polymerizable compound is a liquid having a boiling point of 100° C. or more.

(20) The hologram recording material as described in any one of (14) to (19), wherein the polymerization initiator contains at least one radical generator; and the polymerizable compound contains at least one radical polymerizable compound of undergoing polymerization under the action of a radical.

(21) The hologram recording material as described in (20), wherein the at least one radical generator of generating a radical is a ketone, an organic peroxide, a bisimidazole, a trihalomethyl-substituted triazine, a diazonium salt, a diaryliodonium salt, a sulfonium salt, a triphenylalkylborate, a diaryliodonium organic boron complex, a sulfonium organic boron complex, an organic boron complex which is a cationic sensitizing dye, an onium salt complex which is an anionic sensitizing dye or a metal arene complex.

(22) The hologram recording material as described in any one of (14) to (19), wherein the polymerization initiator contains at least one acid generator of generating an acid; and the polymerizable compound contains at least one cationic polymerizable compound of undergoing polymerization under the action of an acid.

(23) The hologram recording material as described in (22), wherein the at least one acid generator of generating an acid is a trihalomethyl-substituted triazine, a diazonium salt, a diaryliodonium salt, a sulfonium salt, a metal arene complex or a sulfonic acid ester.

(24) The hologram recording material as described in any one of (14) to (19), wherein the polymerization initiator contains at least one base generator; and the polymerizable compound contains at least one anionic polymerizable compound of undergoing polymerization under the action of a base.

(25) The hologram recording material as described in (24), wherein the at least one base generator is a compound represented by the following formula (1-1), (1-2), (1-3) or (1-4):

Formula (1-1):

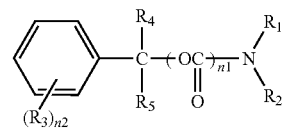

Formula (1-2):

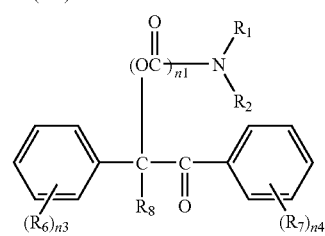

Formula (1-3):

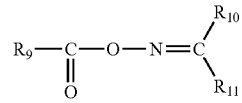

Formula (1-4):

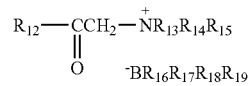

wherein $R_1$, $R_2$, $R_{13}$, $R_{14}$ and $R_{15}$ each independently represents a hydrogen atom, an alkyl group, an alkenyl group, a cycloalkyl group, an aryl group or a heterocyclic group; $R_1$ and $R_2$ may combine with each other to form a ring; $R_{13}$, $R_{14}$ and $R_{15}$ may combine with each other to form a ring; $R_3$, $R_6$, $R_7$ and $R_9$ each independently represents a substituent; $R_4$, $R_5$, $R_8$, $R_{10}$ and $R_{11}$ each independently represents a hydrogen atom or a substituent; $R_{10}$ and $R_{11}$ may combine with each other to form a ring; $R_{16}$, $R_{17}$, $R_{18}$ and $R_{19}$ each independently represents an alkyl group or an aryl group; $R_{12}$ represents an aryl group or a heterocyclic group; n1 represents an integer of 0 or 1; and n2 to n4 each independently represents an integer of 0 to 5.

(26) The hologram recording material as described in (25), wherein in formulae (1-1) and (1-2), n1 is 1.

(27) The hologram recording material as described in (25) or (26), wherein in formula (1-1), $R_3$ is a nitro group substituted to the 2-position or 2,6-position, or an alkoxy group substituted to the 3,5-position.

(28) The hologram recording material as described in (25) or (26), wherein in formula (1-2), $R_6$ is an alkoxy group substituted to the 3,5-position.

(29) The hologram recording material as described in any one of (14) to (28), wherein the dye precursor contains a dye precursor capable of forming the colored material under the action of an acid; and the hologram recording material further comprises an acid generator.

(30) The hologram recording material as described in (29), wherein the acid generator is a diaryliodonium salt, a sulfonium salt, a diazonium salt, a metal arene complex, trihalomethyl-substituted triazine or a sulfonic acid ester.

(31) The hologram recording material as described in (30), wherein the acid generator is a diaryliodonium salt, a sulfonium salt or a sulfonic acid ester.

(32) The hologram recording material as described in (29) to (31), wherein the colored material formed from the dye precursor capable of forming the colored material under the action of the acid is a xanthene (fluoran) dye or a triphenylmethane dye.

(33) The hologram recording material as described in any one of (29) to (32), which further contains an acid-increasing agent.

(34) The hologram recording material as described in (33), wherein the acid-increasing agent is a compound represented by the following formula (4-1), (4-2), (4-3), (4-4), (4-5) or (4-6):

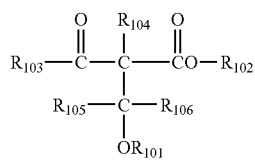

Formula (4-1)

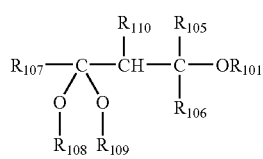

Formula (4-2)

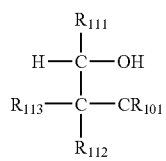

Formula (4-3)

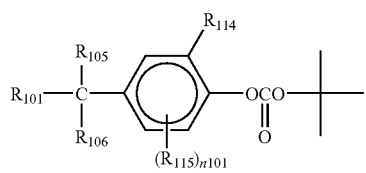

Formula (4-4)

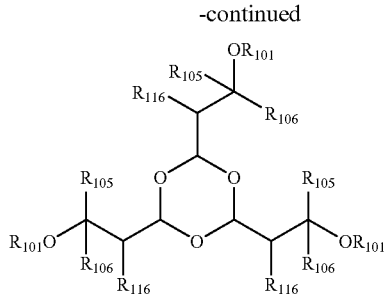

Formula (4-5)

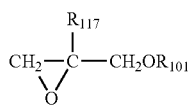

Formula (4-6)

wherein $R_{101}$ represents a group of forming an acid having a pKa of 5 or less in the form of $R_{101}OH$; $R_{102}$ represents a 2-alkyl-2-propyl group, a 2-aryl-2-propyl group, a cyclohexyl group, a tetrahydropyranyl group or a bis(p-alkoxyphenyl)-methyl group; $R_{103}$, $R_{104}$, $R_{115}$ and $R_{117}$ each independently represents a substituent; $R_{105}$, $R_{106}$, $R_{107}$, $R_{110}$, $R_{113}$ and $R_{116}$ each independently represents a hydrogen atom or a substituent; $R_{118}$ and $R_{119}$ each independently represents an alkyl group and may combine with each other to form a ring; $R_{111}$ and $R_{112}$ represent alkyl groups which combine with each other to form a ring; $R_{114}$ represents a hydrogen atom or a nitro group; and n101 represents an integer of 0 to 3.

(35) The hologram recording material as described in (34), wherein in formulae (4-1) to (4-6), $R_{101}$ is a group of being a sulfonic acid or an electron-withdrawing group-substituted carboxylic acid in the form of $R_{101}OH$.

(36) The hologram recording material as described in any one of (14) to (28), wherein the dye precursor contains a dye precursor capable of forming the colored material under the action of a base; and the hologram recording material further comprises a base generator.

(37) The hologram recording material as described in (36), wherein the base generator is a compound represented by formula (1-1), (1-2), (1-3) or (1-4).

(38) The hologram recording material as described in (36) or (37), wherein the dye precursor capable of forming the colored material under the action of the base is a non-dissociated form of a dissociation-type azo dye, a dissociation-type azomethine dye, a dissociation-type oxonol dye, a dissociation-type xanthene (fluoran) dye or a dissociation-type triphenylmethane-base dye.

(39) The hologram recording material as described in any one of (36) to (38), which further contains a base-increasing agent.

(40) The hologram recording material as described in (39), wherein the base-increasing agent is a compound represented by the following formula (5):

Formula 5:

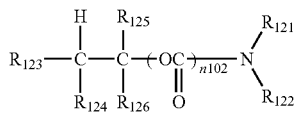

wherein $R_{121}$ and $R_{122}$ each independently represents a hydrogen atom, an alkyl group, an alkenyl group, a cycloalkyl group, an aryl group or a heterocyclic group; $R_{121}$ and $R_{122}$ may combine with each other to form a ring; $R_{123}$ and $R_{124}$ each independently represents a substituent; $R_{123}$ and $R_{124}$ may combine with each other to form a ring; $R_{125}$ and $R_{126}$ each independently represents a hydrogen atom or a substituent; and n102 represents an integer of 0 or 1.

(41) The hologram recording material as described in (40), wherein in formula (5), n102 is 1.

(42) The hologram recording material as described in (40) or (41), wherein the base-increasing agent of formula (5) is a compound represented by formula (6-1) or (6-2):

Formula (6-1):

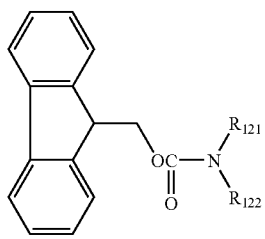

Formula (6-2):

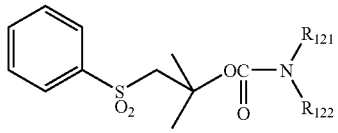

wherein $R_{121}$ and $R_{122}$ have the same meanings as in formula (5).

(43) The hologram recording material as described in any one of (14) to (28), wherein the dye precursor described is a dye precursor represented by the following formula (2):

A1-PD wherein A1 and PD are covalently bonded; A1 represents an organic compound moiety having a function of cutting the covalent bond with PD as a result of electron or energy transfer from the sensitizing dye or colored material in the excited state, and PD represents an organic compound moiety of forming the colored material when covalently bonded with A1 and when released by the cutting of covalent bond with A1.

(44) The hologram recording material as described in (43), wherein the dye precursor of formula (2) is a compound represented by any one of the following formulae (3-1) to (3-6):

Formula (3-1):

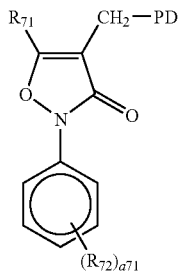

Formula (3-2):

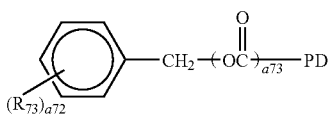

Formula (3-3):

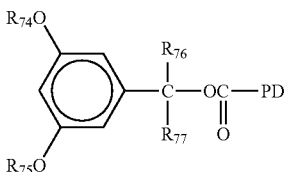

Formula (3-4):

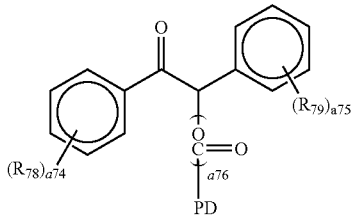

Formula (3-5):

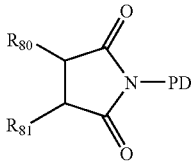

Formula (3-6):

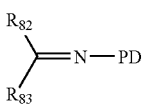

wherein PD has the same meaning as in formula (2); $R_{71}$, $R_{80}$, $R_{81}$ each independently represents a hydrogen atom or a substituent; $R_{72}$, $R_{73}$, $R_{78}$, $R_{79}$, $R_{82}$ and $R_{83}$ each independently represents a substituent; a71, a72, a74 and a75 each independently represents an integer of 0 to 5; a73 and a76 each independently represents 0 or 1; provided that when a71, a72, a74 and a75 each is 2 or more, multiple $R_{72}$s, $R_{73}$s, $R_{78}$s or $R_{79}$s may be the same or different and may combine with each other to form a ring; and each of the pairs $R_{80}$ and $R_{81}$, and $R_{82}$ and $R_{83}$ may combine with each other to form a ring.

(45) The hologram recording material as described in (43) or (44), wherein in formulae (2) or (3-1) to (3-6), PD is a group comprising any one of a dissociation-type azo dye, a dissociation-type azomethine dye, a dissociation-type oxonol dye, a triphenylmethane dye and a xanthene dye, and is connected to A1 through a covalent bond on the chromophore.

(46) The hologram recording material as described in any one of (14) to (28), wherein the dye precursor contains at least a dye precursor capable of undergoing a reaction as a result of electron transfer with the sensitizing dye or the colored material in the excited state; and capable of forming the colored material having an absorption form changed to the longer wavelength side.

(47) The hologram recording material as described in (46), wherein the dye precursor is a dye precursor represented by the following formula (7):

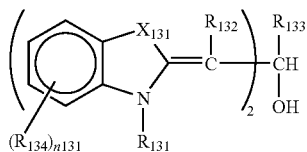

Formula (7):

wherein $R_{131}$ represents a hydrogen atom, an alkyl group, an alkenyl group, a cycloalkyl group, an aryl group or a heterocyclic group; $X_{131}$ represents —O—, —S—, —NR$_{135}$— or —CR$_{136}$R$_{137}$— (wherein $R_{135}$ represents a hydrogen atom, an alkyl group, an alkenyl group, a cycloalkyl group, an aryl group or a heterocyclic group, and $R_{136}$ and $R_{137}$ each independently represents an alkyl group, an alkenyl group or an aryl group); $R_{132}$ and $R_{133}$ each independently represents a hydrogen atom or a substituent; $R_{134}$ represents a substituent; and n131 represents an integer of 0 to 4.

(48) The hologram recording material as described in (47), wherein in formula (7), $X_{131}$ is —CR$_{136}$R$_{137}$—.

(49) The hologram recording material as described in any one of (14) to (48), wherein the hologram recording material contains an electron-donating compound having an ability of reducing a radical cation of the sensitizing dye or the colored material formed from the dye precursor.

(50) The hologram recording material as described in (49), wherein the hologram recording material contains an electron-donating compound and the electron-donating compound is alkylamines, anilines, phenylenediamines, triphenylamines, carbazoles, phenothiazines, phenoxazines, phenazines, hydroquinones, catechols, alkoxybenzenes, aminophenols, imidazoles, pyridines, metallocenes, metal complexes or fine particulate semiconductors.

(51) The hologram recording material as described in (50), wherein the electron-donating compound is phenothiazines.

(52) The hologram recording material as described in any one of (14) to (48), wherein the hologram recording material contains an electron-accepting compound having an ability of oxidizing a radical anion of the sensitizing dye or the colored material formed from the dye precursor.

(53) The hologram recording material as described in (52), wherein the hologram recording material contains an electron-accepting compound and the electron-accepting compound is aromatic compounds having introduced thereinto an electron-withdrawing group, such as dinitrobenzene and dicyanobenzene, heterocyclic compounds; heterocyclic compounds having introduced thereinto heterocyclic compounds or an electron-withdrawing group; N-alkylpyridinium salts; benzoquinones; imides; metal complexes; or fine particulate semiconductors.

(54) The hologram recording material as described in any one of (14) to (53), wherein the polymerization initiator is an acid generator,
the polymerizable compound is a cationic polymerizable compound, and
the dye precursor comprises: a dye precursor capable of forming the colored material under the action of an acid; and an acid generator serving also as the polymerization initiator.

(55) The hologram recording material as described in any one of (14) to (53), wherein the polymerization initiator is a generator of generating an acid and a radical,
the polymerizable compound is a radical polymerizable compound, and
the dye precursor comprises: a dye precursor capable of forming the colored material under the action of an acid; and an acid generator serving also as the polymerization initiator.

(56) The hologram recording material as described in any one of (14) to (53), wherein the polymerization initiator is a base generator,
the polymerizable compound is an anionic polymerizable compound, and
the dye precursor group comprises: a dye precursor capable of forming the colored material under the action of a base; and a base generator serving also as the polymerization initiator.

(57) The hologram recording material as described in any one of (14) to (53), wherein the polymerization initiator is a radical or cation generator, the polymerizable compound is a radical or cationic polymerizable compound, and the dye precursor group contains a compound represented by formula (7).

(58) The hologram recording material as described in any one of (14) to (53), wherein the polymerization initiator is a radical or anion generator, the polymerizable compound is a radical or anionic polymerizable compound and the dye precursor group contains a compound represented by formula (2).

(59) A method for recording a volume phase hologram or a material for recording a volume phase hologram, wherein the recording a volume phase hologram is performed by using a hologram recording method described in any one of (1) to (13) or a hologram recording material described in any one of (14) to (58).

(60) A hologram recording method or a hologram recording material, wherein at the time of performing hologram recording by using a hologram recording method described in any one of (1) to (13) or a hologram recording material described in any one of (14) to (59), after the holographic exposure, a heat treatment is further performed in the second step.

(61) A hologram recording method or a hologram recording material, wherein by using a hologram recording method described in any one of (1) to (13) or a hologram recording material described in any one of (14) to (60), a multiplex hologram recording is performed, wherein in the first step, a multiplex hologram recording is performed by effecting the holographic exposure 10 times or more so as to the latent image; and thereafter the interference fringe are formed due to the latent image in the second step.

(62) The hologram recording method or the hologram recording material as described in (61), wherein in the first step, a multiplex hologram recording is performed by effecting the holographic exposure 100 times or more so as to the latent image; and thereafter the interference fringe are formed due to the latent image in the second step.

(63) The hologram recording method or the hologram recording material as described in (61) or (62), wherein at the time of performing the multiplex hologram recording in the first step, each hologram recording of the multiplex hologram recording is performed by the holographic exposure having a certain exposure amount and the certain exposure amount is constant at any hologram recording throughout the multiplex hologram recording.

(64) A method for recording (reproducing) information on an optical recording medium, which is using a hologram recording (reproducing) method described in any one of (1) to

(13) and (59) to (63); or the optical recording medium using a hologram recording material described in any one of (14) to (63).

(65) An optical recording medium, wherein an optical recording medium described in any one of (14) to (63) is stored in a light-shielding cartridge.

(66) A three-dimensional display using the hologram recording material described in any one of (14) to (63); or a method for producing a three-dimensional display, comprising using a hologram recording method described in any one of (1) to (13) and (59) to (63).

(67) A holographic optical device using a hologram recording material described in any one of (14) to (63); or a method for producing a holographic optical device, comprising using a hologram recording method described in any one of (1) to (13) and (59) to (63).

According to the hologram recording material or the hologram recording method of the present invention in a system comprising a color-formation as a latent image by holographic exposure and a photo polymerization upon irradiation with a light having a different wavelength, the hologram recording can be performed with high sensitivity, high diffraction efficiency and linear increase in the refractive index modulation for the exposure amount. Further, since no shrinkage occurs during recording, the hologram recording material or the hologram recording method of the present invention is advantageous in view of, for example, transfer speed and multiplex recording properties at the application to a holographic memory and the like.

BRIEF DESCRIPTION OF THE DRAWING

The sole FIGURE shows an outline view for explaining the two-beam optical system for holographic exposure. The description of numerical references in the FIGURE is set forth below.

| 10 | YAG laser |
|---|---|
| 12 | laser beam |
| 14 | mirror |
| 20 | beam splitter |
| 22 | beam segment |
| 24 | mirror |
| 26 | spatial filter |
| 40 | beam expander |
| 30 | hologram recording material |
| 28 | sample |
| 32 | He—Ne laser beam |
| 34 | He—Ne laser |
| 36 | detector |
| 38 | rotatable stage |

DETAILED DESCRIPTION OF THE INVENTION

Figure 1:
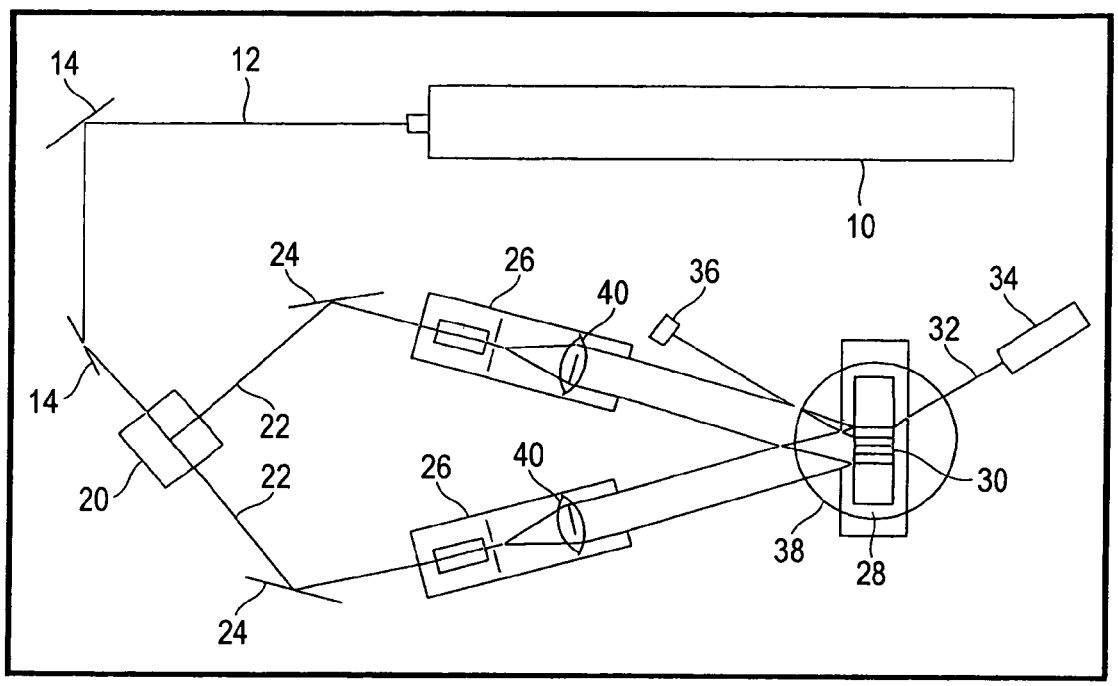

The hologram recording method and hologram recording material of the present invention are described in detail below.

The hologram recording method and the hologram recording material capable of such recording of the present invention are a hologram recording method comprising at least a first step of producing a latent image by holographic exposure; and a second step of causing a polymerization reaction due to the latent image, so as to form an interference fringe providing a refractive index modulation, wherein each of the first step and the second step is dry process, and a hologram recording material capable of such recording.

The "latent image" in the first step of the present invention means "an interference fringe with a refractive index modulation of preferably ½ or less the refractive index modulation formed after the second step" (in other words, amplification of 2 times or more is performed in the second step, that is, increase of 2 times or more is observed in the refractive index modulation after the second step), more preferably an interference fringe with a refractive index modulation of ⅕ or less, still more preferably ¹⁄₁₀ or less, most preferably ¹⁄₃₀ or less, the refractive index modulation formed after the second step (in other words, amplification (increase in refractive index modulation) of more preferably 5 times or more, still more preferably 10 times or more, most preferably 30 times or more, is performed in the second step).

The second step preferably comprises at least one of light irradiation and heat application. Such irradiation or application is preferably performed over the entire surface of the recording material.

The second step is most preferably a step of irradiating light.

In the case of performing the second step by the light irradiation, the light is preferably irradiated to effect entire surface exposure (so-called solid exposure, blanket exposure or non-imagewise exposure).

As for the light source used, preferred examples thereof include visible light laser, ultraviolet light laser, infrared light laser, carbon arc, high-pressure mercury lamp, xenon lamp, metal halide lamp, fluorescent lamp, tungsten lamp, LED and organic LED. In order to irradiate light in a specific wavelength region, a sharp-cut filter, band-pass filter, diffraction grating or the like is preferably used, if desired.

The hologram recording method and the hologram recording material capable of such recording of the present invention are preferably a hologram recording method comprising at least a first step is a step of producing a colored material to form the latent image, the colored material having no absorption of a hologram reproducing light; and a second step is a step of causing the polymerization reaction upon irradiating the colored material with a light which has a wavelength different from that of the holographic exposure, so as to form an interference fringe providing the refractive index modulation; the first and second steps being performed by dry processing, and a hologram recording material capable of such recording.

Also, the hologram recording method and the hologram recording material capable of such recording of the present invention are preferably a hologram recording method comprising at least a first step is a step of producing a colored material to form the latent image, the colored material having no absorption of a hologram reproducing light; and a second step is a step of causing the polymerization reaction while the colored material is self-sensitized or self-amplified upon irradiating the colored material with a light which has a wavelength different from that of the holographic exposure, so as to form an interference fringe providing the refractive index modulation; the first and second steps being performed by dry processing, and a hologram recording material capable of such recording.

The light irradiated in the second step is preferably a light at a wavelength differing from that of the holographic exposure and the light irradiated in the second step has a wavelength where a sensitizing dye, capable of absorbing a light upon the holographic exposure to be transformed into an excited state, has a molar absorption coefficient of 5,000 or less, more preferably 1,000 or less, still more preferably 500 or less.

Also, the light irradiated in the second step is preferably a light at a wavelength differing from that of the holographic exposure and the light irradiated in the second step has a wavelength where a colored material has a molar absorption coefficient of 1,000 or more.

The light irradiated in the second step is preferably at a wavelength shorter than a wavelength of the holographic exposure.

In the first step, polymerization sometimes slightly occurs, but this can be neglected in the present invention.

The hologram recording material of the present invention preferably uses no silver halide.

The hologram recording is preferably an unrewritable system. The unrewritable system as used herein means a system of performing the recording by an irreversible reaction, where once recorded data can be saved without being overwritten (rewritten). Accordingly, this system is suitable for saving important data which must be saved for a long period of time. Incidentally, new information can be added and recorded in the region where no data are recorded. In this meaning, this system is generally called a recordable or write-once system.

The hologram recording material of the present invention is preferably a hologram recording material comprising at least:

1) a sensitizing dye capable of absorbing a light upon holographic exposure in the first step to be transformed into a first excited state;

2) a dye precursor capable of forming a colored material as a result of one of electron transfer and energy transfer from the first excited state of the sensitizing dye; or from a second excited state of the colored material, the second excited state of the colored material being formed in the second step, wherein the colored material has an absorption at a longer wavelength than a wavelength where the dye precursor has an absorption; and the colored material has no absorption of a hologram reproducing light;

3) a polymerizable compound;

4) a polymerization initiator capable of initiating polymerization of the polymerizable compound as a result of one of electron transfer and energy transfer from the first excited state of the sensitizing dye or from the second excited state of the colored material; and 5) a binder.

The dye precursor preferably forms a colored material having an absorption at a longer wavelength than a wavelength where the dye precursor has an absorption, having no absorption of a hologram reproducing light, and having absorption maximum in the region between the wavelength of the hologram reproducing light and a wavelength 200 nm shorter, more preferably 100 nm shorter, than the wavelength of the hologram reproducing light. In the present invention, the "dye precursor" means at least one dye precursor compound (a compound functioning as the dye precursor), that is, a case of containing two or more compounds is also included in the "dye precursor".

In the hologram recording material of the present invention, it is preferred that the polymerizable compound and the binder are differing in refractive index, and that as a result of the polymerizable compound being photopolymerized to form a interference fringe, the composition ratio of the polymerizable compound and a photopolymarized compound thereof to the binder becomes non-uniform between a bright portion of the interference fringe and a dark portion of the interference fringe, so as to enable to record a hologram having a refractive index modulation on the hologram recording material. At this time, the binder preferably has a refractive index lower than that of the polymerizable compound.

The refractive index of the binder is preferably 0.05 or more lower, more preferably 0.1 or more lower, than the refractive index of the polymerizable compound.

For this purpose, the polymerizable compound preferably contains at least one aryl group, aromatic heterocyclic group, chlorine atom, bromine atom, iodine atom or sulfur atom and the binder preferably does not contain such a group or atom.

In addition to these sensitizing dye, dye precursor group, polymerization initiator, polymerizable compound and binder, the hologram recording material of the present invention may contain, if desired, additives such as an electron-donating compound, an electron-accepting compound, a crosslinking agent, a heat stabilizer, a plasticizer and a solvent.

The hologram recording material of the present invention is preferably a recording material for performing volume phase hologram recording. In the volume phase hologram recording, as described above, interference fringes as many as 1,000 to 7,000 fringes per 1 mm, which are parallel or nearly parallel (reflection type) or are perpendicular or nearly perpendicular (transmission type) to the film surface of the recording material, are recorded as the refractive index modulation in the thickness direction.

The light used in the first step of the present invention is preferably an ultraviolet light, a visible light or an infrared light at a wavelength of 200 to 2,000 nm, more preferably an ultraviolet light or a visible light at a wavelength of 300 to 700 nm, still more preferably a visible light at 400 to 700 nm.

The light for use in the present invention is preferably coherent (in phase or uniform in wavelength) laser light. The laser used therefor may be any of a solid laser, a semiconductor laser, a gas laser and a liquid laser, but preferred examples of the laser light include YAG laser double wave at 532 nm, YAG laser triple wave at 355 nm, GaN laser in the vicinity of 405 to 415 nm, Ar ion laser at 488 or 515 nm, He—Ne laser at 632 or 633 nm, Kr ion laser at 647 nm, ruby laser at 694 nm, and He—Cd laser at 636, 634, 538, 534 or 442 nm.

Also, a pulse laser on the nano-second or pico-second order is preferably used.

In the case of using the hologram recording material of the present invention for an optical recording medium, YAG laser double wave at 532 nm or GAN laser in the vicinity of 405 to 415 nm is preferably used.

The wavelength of light used for reproducing the hologram is preferably the same as or longer than, more preferably the same as, the wavelength of light used for the holographic exposure (recording).

In the hologram recording material of the present invention, after the holographic exposure, a fixing step may be performed by light, heat or both thereof.

Particularly, in the case of using an acid- or base-increasing agent in the hologram recording material of the present invention, heating is preferably used for the fixing also from the standpoint of effectively bringing out the function of the acid- or base-increasing agent.

In the case of fixing by light, an ultraviolet or visible light is entirely irradiated (incoherent exposure) throughout the hologram recording material. As for the light source used, preferred examples thereof include visible light laser, ultraviolet light laser, carbon arc, high-pressure mercury lamp, xenon lamp, metal halide lamp, fluorescent lamp, tungsten lamp, LED and organic LED.

In the case of fixing by heat, the fixing step is preferably performed at 40 to 160° C., more preferably from 60 to 130° C.

In the case of performing the fixing by using both light and heat, the light and the heat may be applied simultaneously or separately.

In the present invention, those first and second steps each may serve also as the fixing step, and the second step preferably serves also as the fixing step.

In the hologram recording method and the hologram recording material capable of such recording of the present invention, in view of preservability and nondestructive reproduction, the fixing is preferably performed by decomposing the sensitizing dye in the first step, the second step or the subsequent fixing step of at least one of light irradiation and heat application. More preferably, by decomposing the sensitizing dye in the first step, the second step or the subsequent fixing step of at least one of irradiating light and applying heat, and decomposing the colored material in the second step or the subsequent fixing step of at least one of light irradiation and heat application.

The recorded interference fringe has a refractive index modulation of preferably from 0.00001 to 0.5, more preferably from 0.0001 to 0.3.

The diffraction efficiency η of the hologram recording material can be obtained according to the following formula:

$$\eta = Idiff/Io \qquad \text{(formula 1)}$$

wherein Io is an intensity of an incident light and Idiff is an intensity of a diffracted (transmission type) or reflected (reflection type) light. The diffraction efficiency takes any value of 0 to 100%, but is preferably 30% or more, more preferably 60% or more, and most preferably 80% or more.

The sensitivity of the hologram recording material is generally expressed by the exposure amount (mJ/cm$^2$) per unit area and as this value is smaller, the sensitivity is higher. However, the time of giving an exposure amount used for the sensitivity differs among publications and patents. For example, the sensitivity is expressed by an exposure amount at the start of recording (a refractive index modulation), an exposure amount of giving a maximum diffraction efficiency (a maximum refractive index modulation), an exposure amount of giving a half of the maximum diffraction efficiency, or an exposure amount of giving a maximum gradient of diffraction efficiency with respect to the exposure amount E.

According to Kugel-Nick's theoretical equation, the refractive index modulation Δn required to give a certain diffraction efficiency is inversely proportional to the thickness d. In other words, the sensitivity required to give a certain diffraction efficiency differs with thickness. The larger the thickness d is, the smaller is the required refractive index modulation Δn. Accordingly, the sensitivity cannot be unequivocally compared unless the conditions such as thickness are unified.

In the present invention, the sensitivity is defined by "exposure amount (mJ/cm$^2$) required to give half the maximum diffraction efficiency". The sensitivity of the hologram recording material of the present invention is preferably 2 J/cm$^2$ or less, more preferably 1 J/cm$^2$ or less, even more preferably 500 mJ/cm$^2$ or less, most preferably 200 mJ/cm$^2$ or less when the thickness is from about 10 to 200 μm.

In order to use the hologram recording material of the present invention as an optical recording medium in a holographic memory, a spatial light modulation element (SLM) such as DMD and LCD is preferably used to record a large number of two-dimensional digital data (referred to as "signal light"). The recording is preferably carried out by multi-recording to enhance the recording density. Examples of multi-recording method employable herein include angle-multiple recording, phase-multiple recording, wavelength-multiple recording, and shift-multiple recording. Preferred among these multi-recording methods are angle-multiple recording and shift-multiple recording. In order to read the two-dimensional data reproduced, CCD or DMOS is preferably used.

In the case of using the hologram recording material of the present invention for an optical recording medium, multiplex recording is essential for enhancing the capacity (recording density). At this time, the multiplex recording is preferably performed 50 times or more, more preferably 100 times or more. Furthermore, at the time of performing the multiplex recording, in view of simplification of recording system, improvement of S/N ratio or the like, preferably the multiplex recording has a constant exposure amount and the constant exposure amount is fixed throughout the multiplex hologram recording.

The concept of the hologram recording of the present invention is described below, but the present invention is of course not limited thereto. In the following, values are set forth absolutely for the purpose of qualitative description and not always reflecting a quantitative value.

For example, a light of a YAG.SHG laser at 532 nm is irradiated on the hologram recording material and absorbed by the sensitizing dye to be transformed into an excited state. From the sensitizing dye in the excited state, an energy or electron is transferred to a recorded interference fringe component, whereby the dye precursor contained in the recorded interference fringe component is changed into a colored material and a latent image is formed by color formation (first step). Next, a light in a wavelength region of 400 to 450 nm is irradiated to bring about absorption of the colored material and while the colored material is self-sensitized or self-amplified, the polymerization initiator is activated by the electron or energy transfer, whereby polymerization is initiated. For example, when the refractive index of the polymerizable compound is larger than that of the binder, the polymerizable compound gathers to the portion where the polymerization takes place, as a result, the refractive index increases in that portion (second step). In a dark portion of the interference fringe, a latent image is not formed too much and therefore, polymerization does not substantially occur in the second step to elevate the abundance ratio of the binder, as a result, this can be recorded as an interference fringe wherein a large refractive index modulation can be formed between a bright portion and dark portion in the interference fringe. For example, when a laser light of 532 nm is again used and irradiated on the hologram recording material used for the recording, the information, image or the like recorded can be reproduced, or the material can function as a desired optical material.

On the other hand, when the hologram recording material of the present invention is a type of undergoing only polymerization in the second step without undergoing self-sensitization and self-amplification with color formation, the hologram recording is performed as follows. For example, a light of a YAG.SHG laser at 532 nm is irradiated on the hologram recording material and absorbed by the sensitizing dye to be transformed into an excited state. From the sensitizing dye in the excited state, an energy or electron is transferred to a recorded interference fringe component, whereby the dye precursor contained in the recorded interference fringe component is changed into a colored material and a latent image is formed by color formation (first step). Next, a light in the wavelength region of 400 to 450 nm is irradiated to bring about absorption of the colored material and the polymerization initiator is activated by electron or energy transfer thereto, whereby polymerization is initiated. For example, when the refractive index of the polymerizable compound is larger than that of the binder, the polymerizable compound gathers to the portion where the polymerization takes place, as a result, the refractive index increases in that portion (second step). In a dark portion of the interference fringe, a latent image is not formed too much and therefore, polymerization does not substantially occur in the second step to elevate the abundance ratio of the binder, as a result, this can be recorded as an interference fringe wherein a large refractive index modulation can be formed between a bright portion and dark portion in the interference fringe. If decolorization can be achieved by decomposing the sensitizing dye and colored material in the first or second step or further in the subsequent fixing step, a hologram recording material excellent in non-destructive reproduction and preservability can be provided.

For example, when a laser of 532 nm is again used and irradiated on the hologram recording material used for the recording, the information, image or the like recorded can be reproduced, or the material can function as a desired optical material.

Respective components for use in the hologram recording material of the present invention are described in detail below.

The sensitizing dye for use in the hologram recording material of the present invention, which absorbs light to be transformed into an excited state upon holographic exposure in the first step, is described below.

The sensitizing dye for use in the present invention is preferably a sensitizing dye of absorbing any one of an ultraviolet light, a visible light and an infrared light at a wavelength of 200 to 2,000 nm to be transformed into an excited state, more preferably a sensitizing dye of absorbing an ultraviolet light or a visible light at a wavelength of 300 to 700 nm to be transformed into an excited state, still more preferably a sensitizing dye of absorbing a visible light at 400 to 700 nm to be transformed into an excited state.

Preferred examples of the sensitizing dye for use in the present invention include cyanine dyes, squarylium cyanine dyes, styryl dyes, pyrilium dyes, merocyanine dyes, arylidene dyes, oxonol dyes, azulenium dyes, coumarin dyes, ketocoumarin dyes, styrylcoumarin dyes, pyran dyes, xanthene dyes, thioxanthene dyes, phenothiazine dyes, phenoxazine dyes, phenazine dyes, phthalocyanine dyes, azaporphyrin dyes, porphyrin dyes, condensed aromatic dyes, perylene dyes, azomethine dyes, anthraquinone dyes, metal complex dyes and metallocene dyes. Among these, more preferred is cyanine dyes, squarylium cyanine dyes, pyrilium dyes, merocyanine dyes, oxonol dyes, coumarin dyes, ketocoumarin dyes, styrylcoumarin dyes, pyran dyes, xanthene dyes, thioxanthene dyes, condensed aromatic dyes, metal complex dyes or metallocene dyes; still more preferred is cyanine dyes, melocyanine dyes, oxonol dyes, metal complex dyes, or metallocene dyes. Particularly preferred examples of metal complex dyes include Ru complex dyes. Particularly preferred examples of metallocene dyes include ferrocene dyes.

Since the hologram recording material needs to be used in the form of thick layer and light needs to be transmitted by the layer, the molar absorption coefficient (or molar absorptivity) of the sensitizing dye at the wavelength of holographic exposure is preferably reduced to maximize the added amount of the sensitizing dye for the purpose of enhancing sensitivity. The molar absorption coefficient of the sensitizing dye at the wavelength of holographic exposure is preferably from not smaller than 1 to not greater than 10,000, more preferably from not smaller than 1 to not greater than 5,000, even more preferably from not smaller than 5 to not greater than 2,500, most preferably from not smaller than 10 to not greater than 1000.

The transmittance of the hologram recording material at the recording wavelength is preferably from 10% to 99%, more preferably from 20% to 95%, even more preferably from 30% to 90%, particularly from 40% to 85% from the standpoint of diffraction efficiency, sensitivity and recording density. To this end, the molar absorption coefficient of the sensitizing dye at the recording wavelength and the molarity of the sensitizing dye to be added are preferably adjusted according to the thickness of the hologram recording material.

λmax of the sensitizing dye is preferably shorter than the wavelength of hologram recording, more preferably between the wavelength of hologram recording and the wavelength 100 nm shorter than the wavelength of hologram recording.

Further, the molar absorption coefficient of the sensitizing dye at the recording wavelength is preferably one fifth or less, more preferably one tenth or less of that at λmax. In particular, when the sensitizing dye is an organic dye such as cyanine dye and melocyanine dye, the molar absorption coefficient of the sensitizing dye at the recording wavelength is more preferably one twentieth or less, even more preferably one fiftieth or less, particularly one hundredth or less of that at λmax.

Other than these, coloring matters and dyes described in Shinya Ohkawara (compiler), *Shikiso Handbook* (*Handbook of Coloring Matters*), Kodansha (1986), and Shinya Ohkawara (compiler), *Kinosei Shikiso no Kagaku* (*Chemistry of Functional Coloring Matters*), CMC (1981), Chuzaburo Ikemori et al. (compilers), *Tokusho Kino Zairyo* (*Materials Having Special Functions*), CMC (1986) can also be used as the sensitizing dye for use in the present invention. The sensitizing dye for use in the present invention is not limited to those described above and any coloring material or dye can be used as long as it exhibits absorption for light in the visible region. The sensitizing dye can be selected according to the purpose of use to match the wavelength of radiation as a light source and depending on the use, two or more sensitizing dyes may be used in combination.

Specific examples of the sensitizing dye for use in the present invention are set forth below, but the present invention is not limited thereto.

<cyanine dye>

D-1

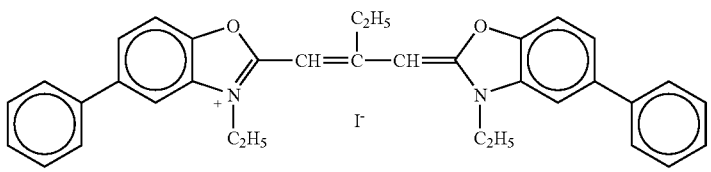

-continued
D-2 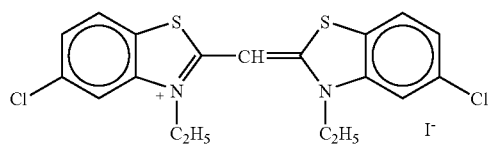
D-3 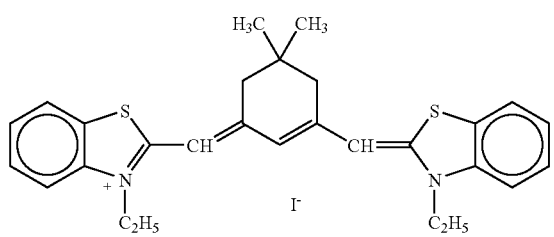
D-4 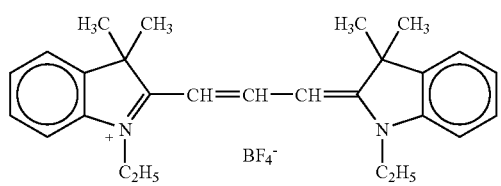
D-5 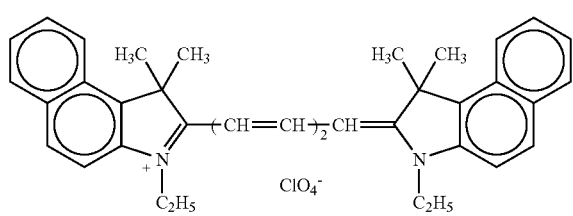
D-6 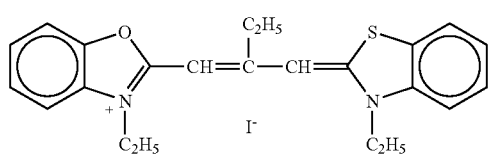
D-7 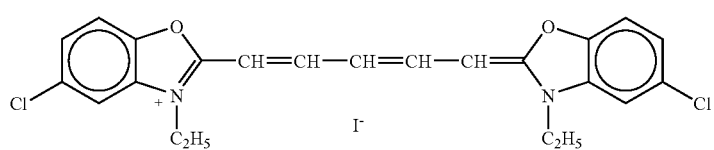
D-8 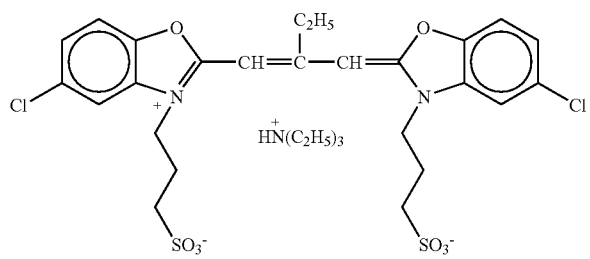
D-9 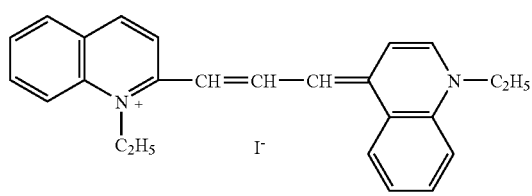

-continued
\<squarylium cyanine dye\>
D-10
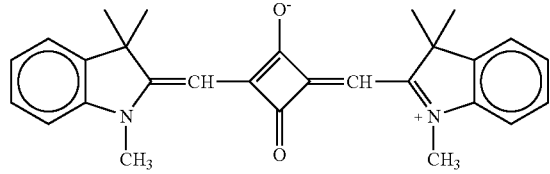
D-11
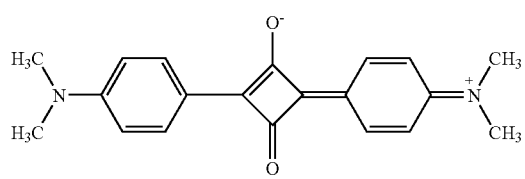
\<styryl dye\>
D-12
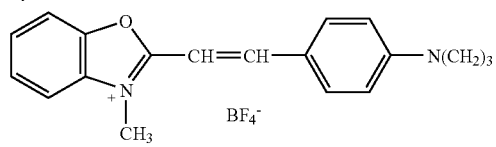
D-13
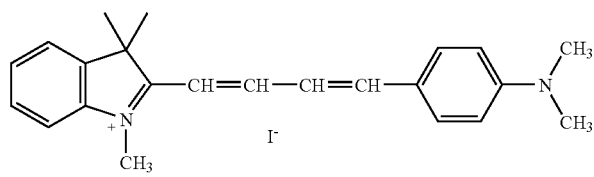
\<pyrilium dye\>
D-14
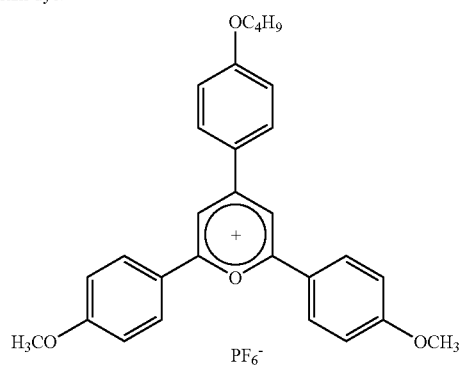
D-15
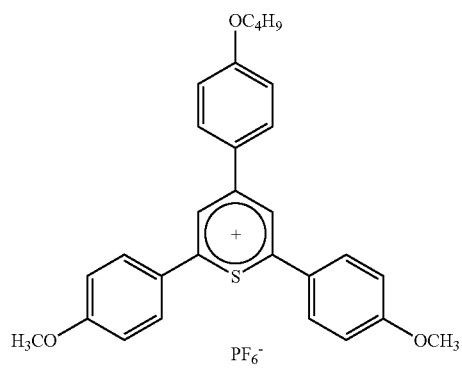

-continued
<merocyanine dye>
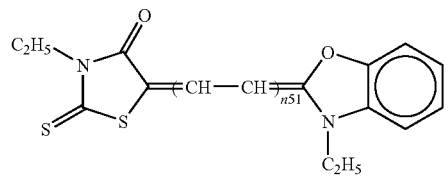
| | n51 |
|---|---|
| D-16 | 0 |
| D-17 | 1 |
| D-18 | 2 |
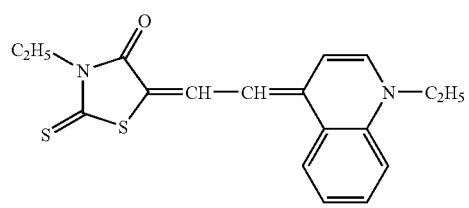
D-19
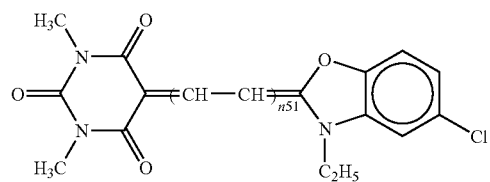
| | n51 |
|---|---|
| D-20 | 1 |
| D-21 | 2 |
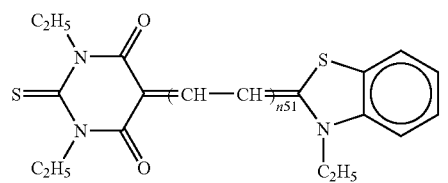
| | n51 |
|---|---|
| D-22 | 1 |
| D-23 | 2 |
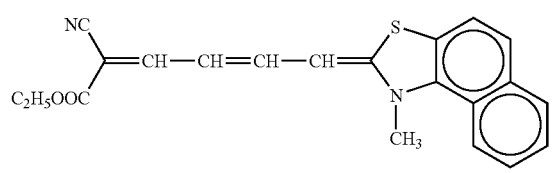
D-24
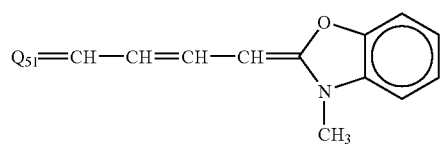

| | $Q_{51}$ | | |
|---|---|---|---|
| D-25 | 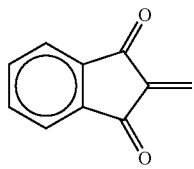 | D-28 | 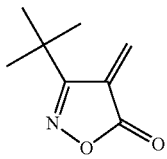 |
| D-26 | 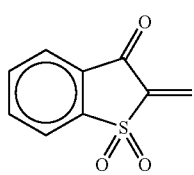 | D-29 | 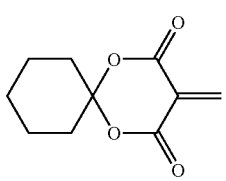 |
| D-27 | 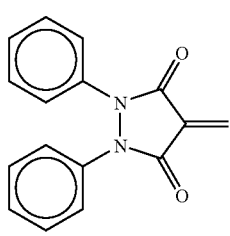 | | |
<merocyanine dye (continued)>
D-30
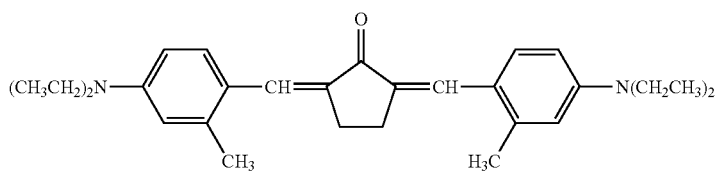
D-31
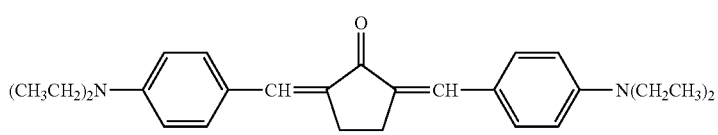
D-32
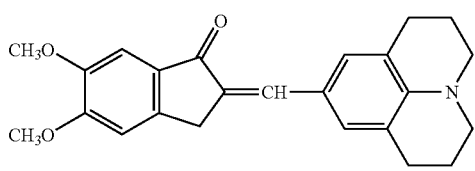
D-33
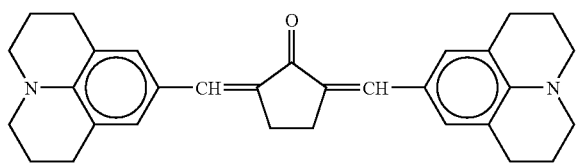
D-34
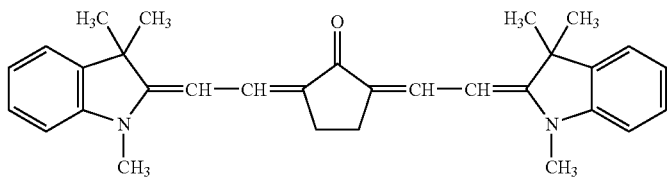

-continued
D-35 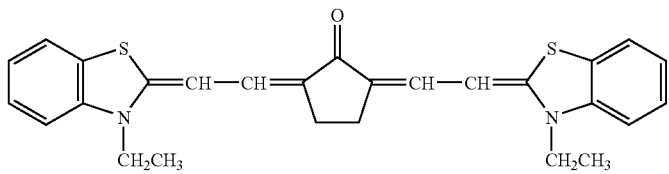
D-36 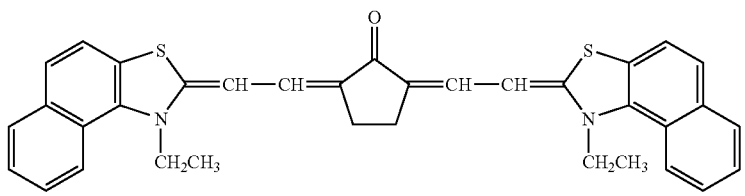
<arylidene dye>
D-37 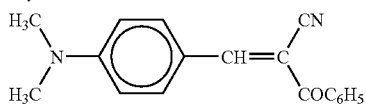
D-38 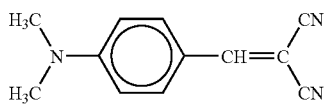
D-39 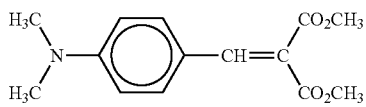
D-40 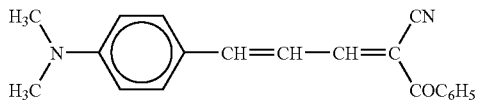
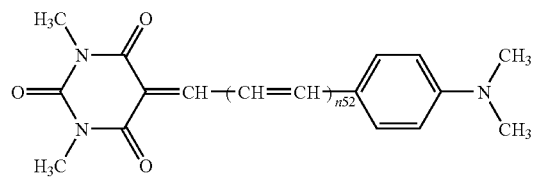
| | n52 |
|---|---|
| D-41 | 0 |
| D-42 | 1 |
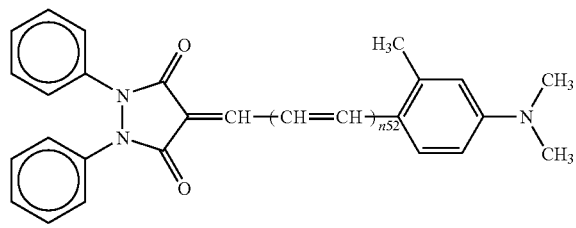
| | n52 |
|---|---|
| D-43 | 0 |
| D-44 | 1 |

-continued

<oxonol dye>

$$Q_{52}=CH-(CH=CH)_{\overline{n53}}Q_{53} \quad CI$$

| | $Q_{52}$ | $Q_{53}$ | $n_{53}$ | CI |
|---|---|---|---|---|
| D-45 | | | 2 | $H^+$ |
| D-46 | | | 1 | |
| D-47 | " | " | 2 | $H^+N(C_2H_5)_3$ |
| D-48 | | | 2 | $H^+$ |
| D-49 | | | 1 | $H^+$ |
| D-50 | | | 1 | $H^+N(C_2H_5)_3$ |
| D-51 | | | 2 | " |

-continued
<azulenium dye>
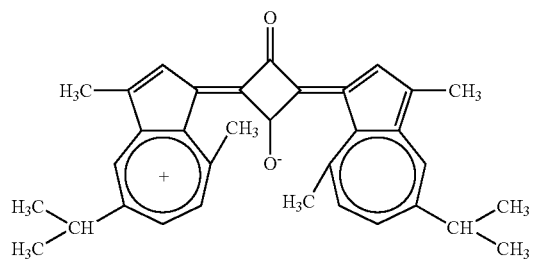
D-52
<coumarin dye>
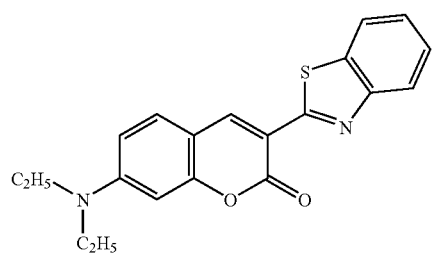
D-53
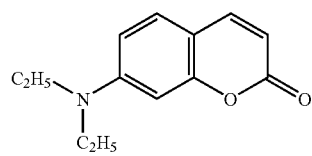
D-54
<ketocoumarin dye>
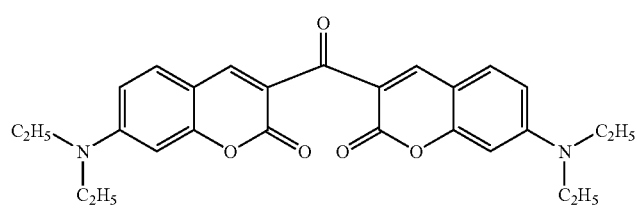
D-55
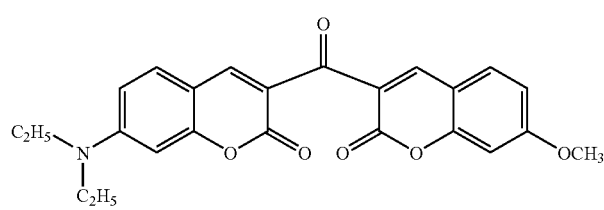
D-56
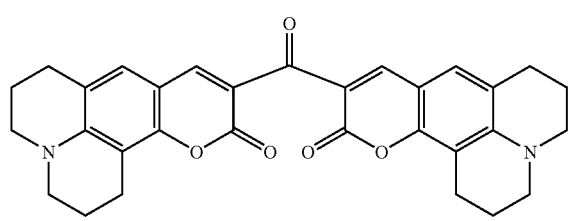
D-57

-continued
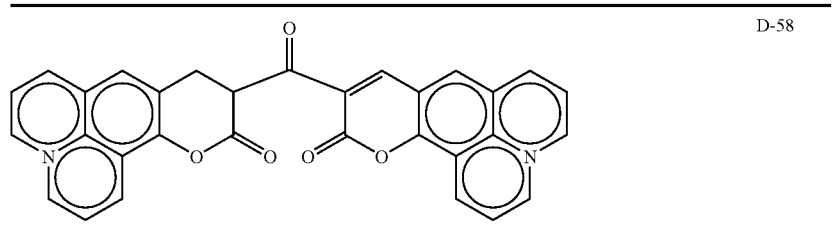
D-58
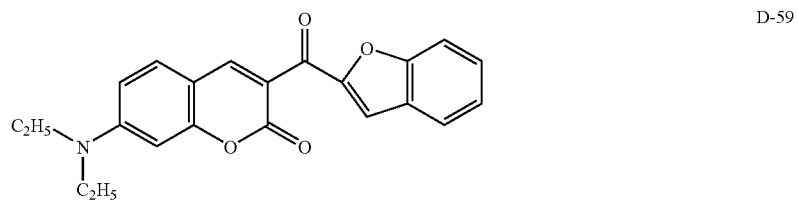
D-59
<stylcoumarin dye>
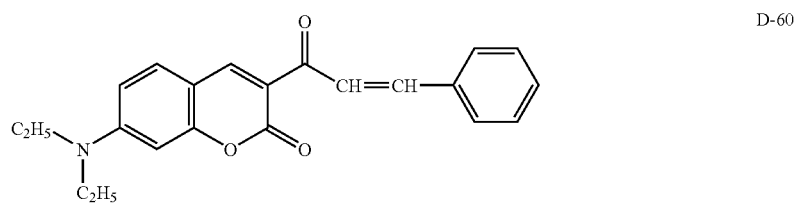
D-60
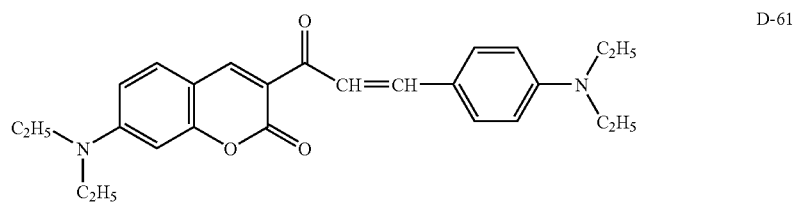
D-61
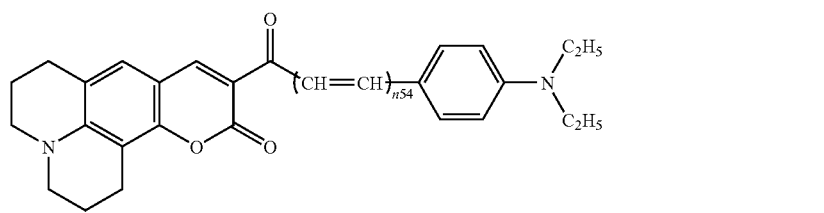
| | n54 |
|---|---|
| D-62 | 2 |
| D-63 | 3 |
| D-64 | 4 |
<pyran dye>
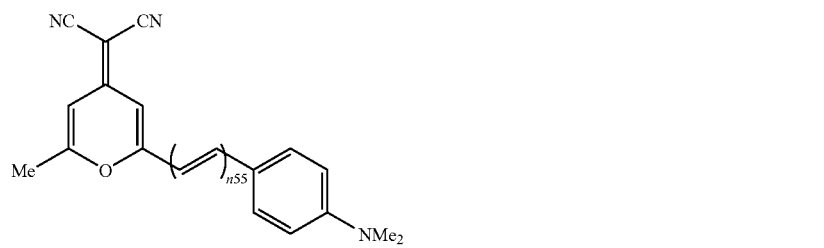
| | n55 |
|---|---|
| D-65 | 1 |
| D-66 | 2 |

-continued
| | |
|---|---|
| D-67 | 3 |
| D-68 | 4 |
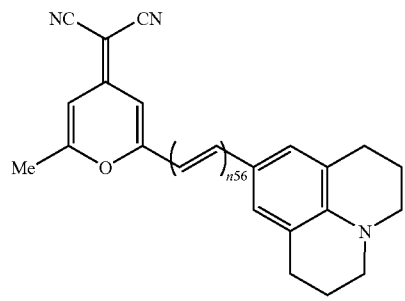
| | n56 |
|---|---|
| D-69 | 1 |
| D-70 | 2 |
| D-71 | 3 |
<xanthene dye>
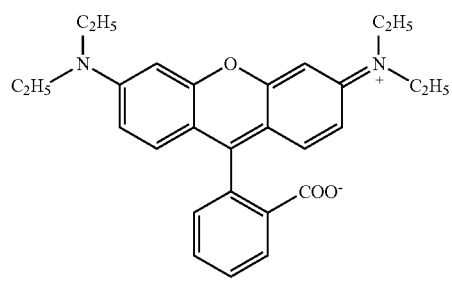
D-72
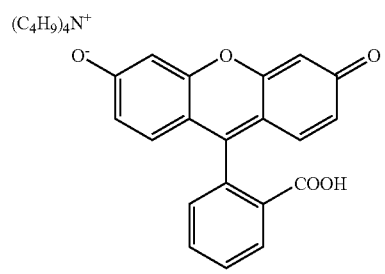
D-73
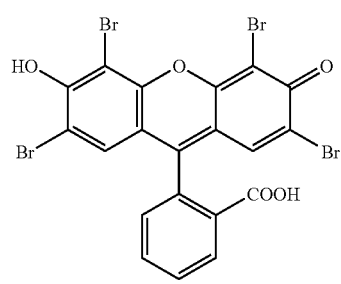
D-74
<thioxanthene dye>
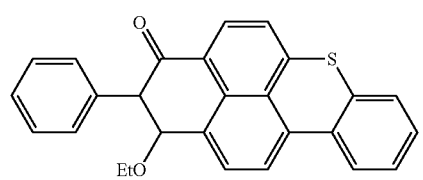
D-75

-continued
<phenothiazine dye>
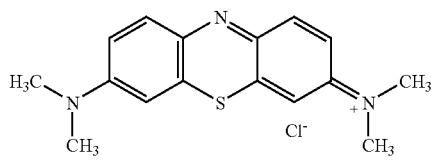
D-76
<phenoxazine dye>
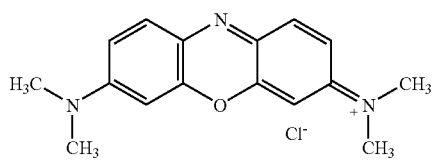
D-77
<phenazine dye>
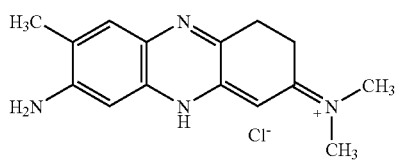
D-78
<phthalocyanine dye>
D-79
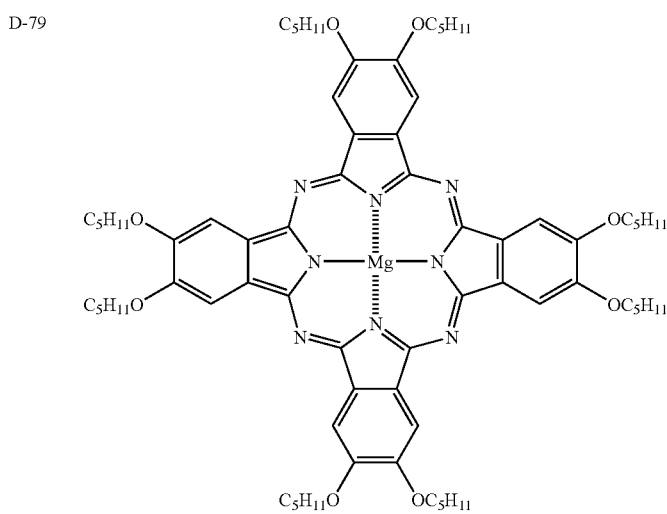
<azaporphyrin dye>
D-80
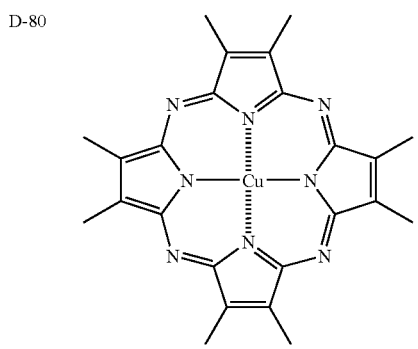

-continued
D-81
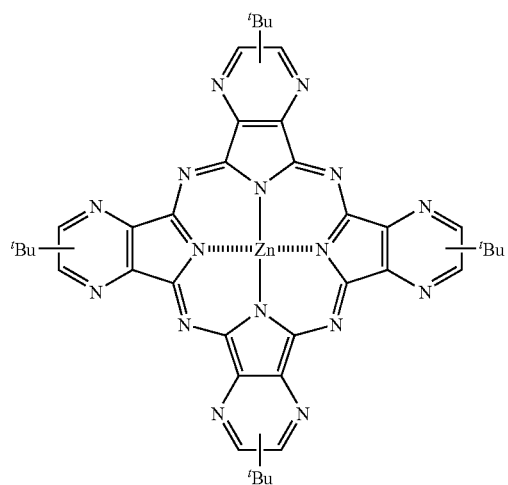
<porphyrin dye>
D-82
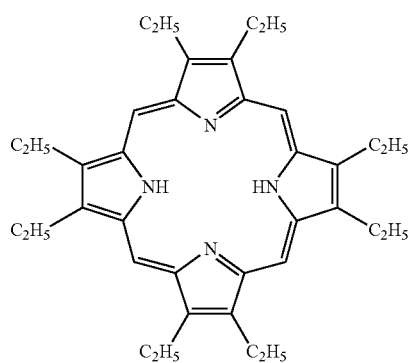
D-83
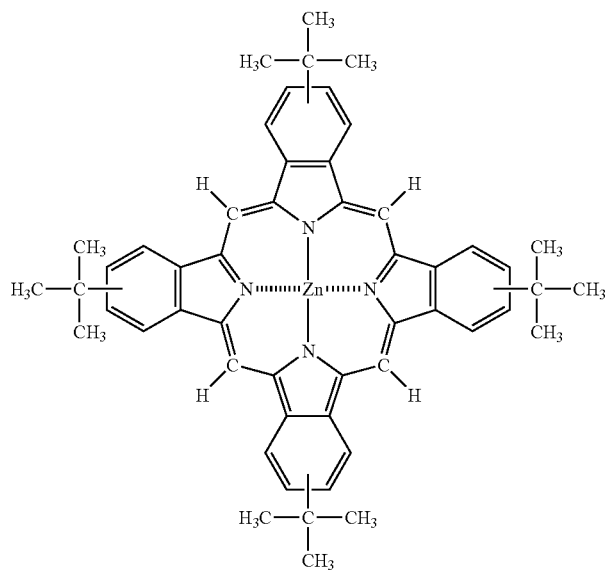

-continued
<condensed aromatic dye>
D-84
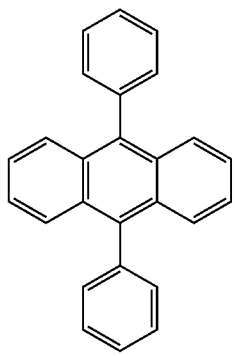
D-85
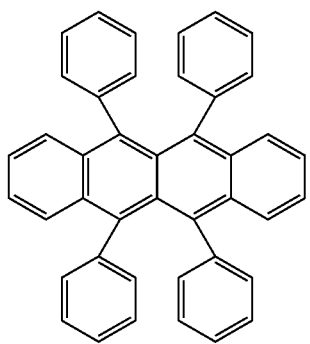
D-86
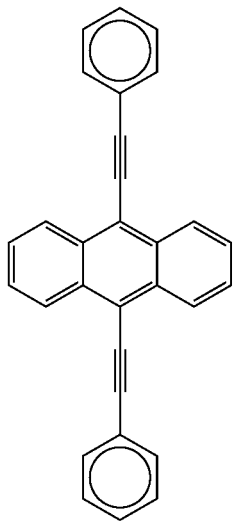

-continued
D-87
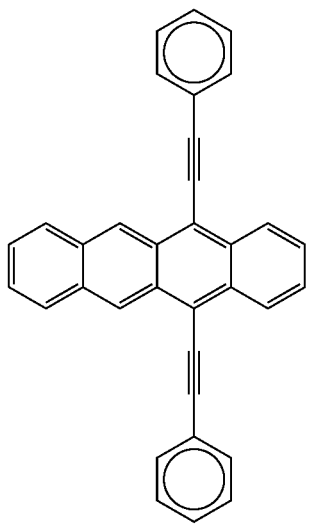
<perylene dye>
D-88
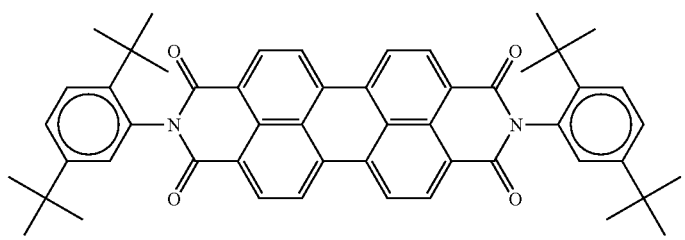
<azomethine dye>
D-89
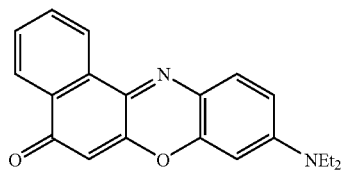
<anthraquinone dye>
D-90
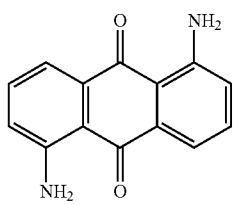
<metal complex dye>
D-91
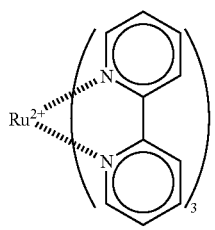

-continued
D-92
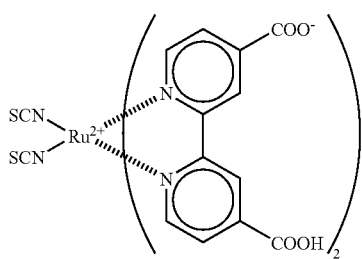
D-93
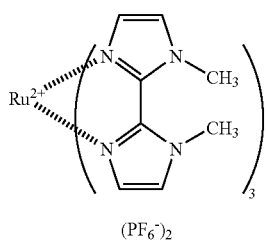
D-94
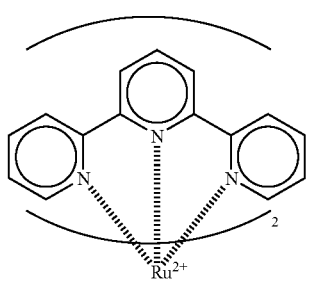
D-95
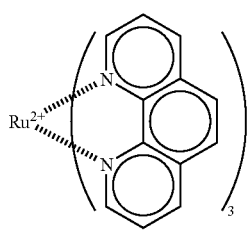
D-96
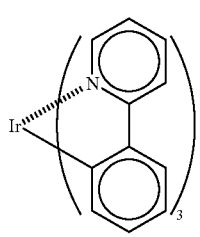

-continued
D-97
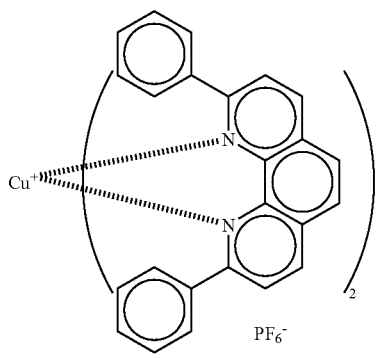
D-98
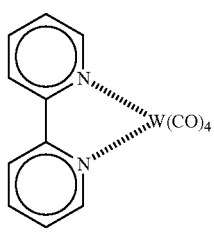
D-99
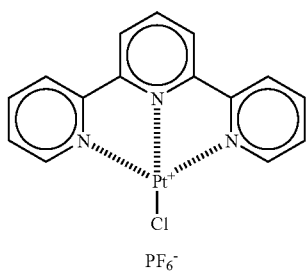
D-100
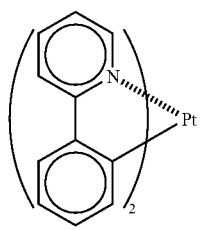
<metallocene dye>
D-101
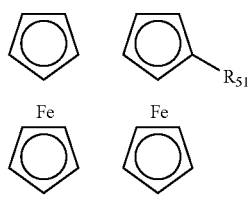
| | $R_{51}$ |
|---|---|
| D-102 | —CHO |
| D-103 | —CH$_2$CH$_2$COOH |
| D-104 | —CH$_2$CH$_2$COOCH$_3$ |
| D-105 | —CH$_2$OH |
| D-106 | —COOCH$_3$ |

-continued
D-107 
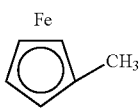
D-108 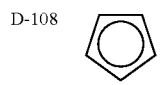
D-109 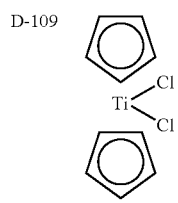
<cyanine dye (continued)>
D-110 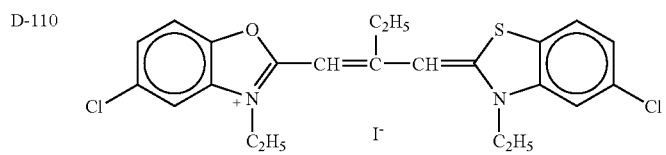
D-111 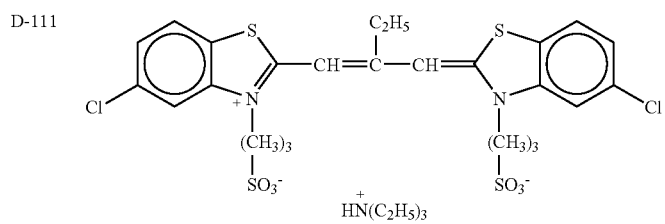
D-112 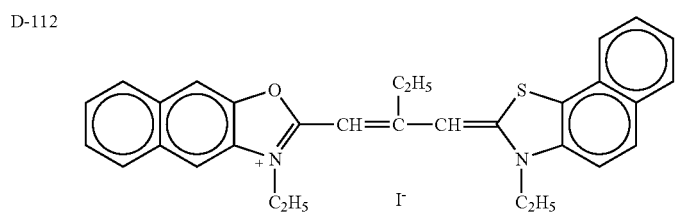
D-113 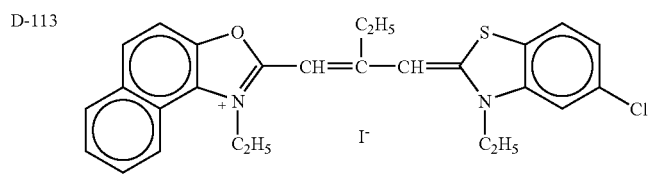
D-114 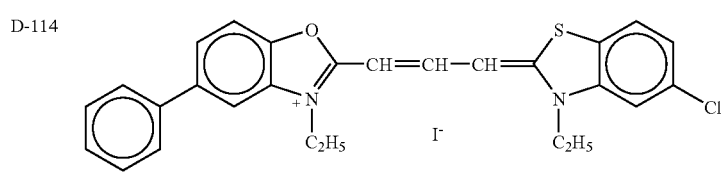

-continued

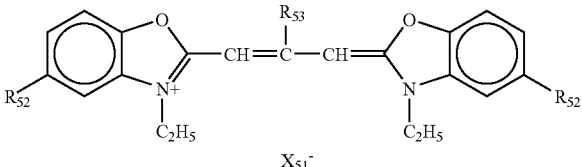

| | $R_{52}$ | $R_{53}$ | $X_{51}$ |
|---|---|---|---|
| D-115 | —Cl | —C$_2$H$_5$ | PF$_6^-$ |
| D-116 | —Cl | —H | I$^-$ |
| D-117 | —H | —C$_2$H$_5$ | " |
| D-118 | " | —H | " |
| D-119 | " | " | PF$_6^-$ |
| D-120 | —Br | " | BF$_4^-$ |
| D-121 | —CH$_3$ | " | I$^-$ |
| D-122 | —OCH$_3$ | —CH$_2$H$_5$ | PF$_6^-$ |

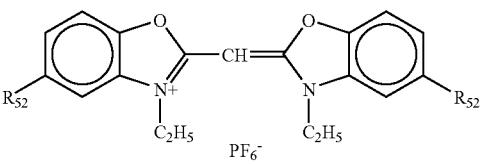

| | $R_{52}$ |
|---|---|
| D-123 | —H |
| D-124 | —Cl |
| D-125 | —Ph |
| D-126 | —CH$_3$ |
| D-127 | —OCH$_3$ |

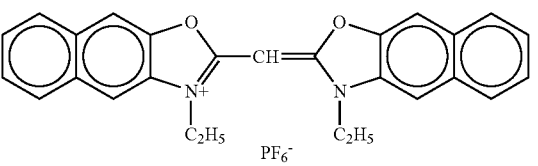

D-128

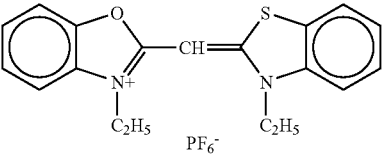

D-129

The sensitizing dye for use in the present invention may be a commercially available product or may be synthesized by a known method.

In the case where hologram recording is effected using frequency-doubled YAG laser beam of 532 nm, the sensitizing dye to be used is particularly preferably a trimethinecyanine dye having a benzoxazole ring, Ru complex dye or ferrocene. In the case hologram recording is effected using GaN laser beam of 405 to 415 nm, the sensitizing dye to be used is particularly preferably a monomethinecyanine dye having a benzoxazole ring, Ru complex dye or ferrocene.

The polymerization initiator for use in the hologram recording material of the present invention is described in detail below.

The polymerization initiator for use in the present invention is a compound capable of generating a radical, an acid (Broensted acid or Lewis acid) or a base (Broensted base or Lewis base) as a result of energy or electron transfer (giving or accepting an electron) from the sensitizing dye in an excited state and thereby initiating polymerization of the polymerizable compound.

The polymerization initiator for use in the present invention is preferably a radical polymerization initiator capable of generating a radical to initiate the radical polymerization of the polymerizable compound, a cationic polymerization initiator capable of generating only an acid without generating a radical to initiate only the cationic polymerization of the polymerizable compound, a polymerization initiator capable of generating both a radical and an acid to initiate both the radical polymerization and the cationic polymerization, or an anionic polymerization initiator capable of generating a base to initiate the anionic polymerization.

The radical polymerization initiator, the cationic polymerization initiator and the initiator capable of initiating both the radical polymerization and the cationic polymerization are described below.

As the polymerization initiator for use in the present invention, the following 14 systems are preferred. If desired, these polymerization initiators may be used as a mixture of two or more thereof at an arbitrary ratio.
1) Ketone-base polymerization initiator
2) Organic peroxide-base polymerization initiator
3) Bisimidazole-base polymerization initiator
4) Trihalomethyl-substituted triazine-base polymerization initiator
5) Diazonium salt-base polymerization initiator
6) Diaryliodonium salt-base polymerization initiator
7) Sulfonium salt-base polymerization initiator
8) Borate-base polymerization initiator
9) Diaryliodonium organic boron complex-base polymerization initiator
10) Sulfonium organic boron complex-base polymerization initiator
11) Cationic sensitizing dye organic boron complex-base polymerization initiator
12) Anionic sensitizing dye onium salt complex-base polymerization initiator
13) Metal arene complex-base polymerization initiator
14) Sulfonic acid ester-base polymerization initiator These preferred systems are specifically described below. Incidentally, in the present invention, when a specific moiety is called "a group", unless otherwise indicated, this means that the group may or may not be substituted by one or more (up to the maximum possible number) substituent. For example, "an alkyl group" means a substituted or unsubstituted alkyl group. The substituent which can be used for the compound in the present invention may be any substituent.

Also, in the present invention, when a specific moiety is called "a ring" or when "a ring" is contained in "a group", unless otherwise indicated, the ring may be a monocyclic ring or a condensed ring or may or may not be substituted.

For example, "an aryl group" may be a phenyl group or a naphthyl group or may be a substituted phenyl group.

1) Ketone-Base Polymerization Initiator

The ketone-base polymerization initiator preferably includes an aromatic ketone, an aromatic diketone and the like.

Preferred examples thereof include benzophenone derivatives (e.g., benzophenone, Michler's ketone), benzoin derivatives (e.g., benzoin methyl ether, benzoin ethyl ether, α-methylbenzoin, α-allylbenzoin, α-phenylbenzoin), acetoin derivatives (e.g., acetoin, pivaloin, 2-hydroxy-2-methylpropiophenone, 1-hydroxycyclohexyl phenyl ketone), acyloin ether derivatives (e.g., diethoxyacetophenone), α-diketone derivatives (e.g., diacetyl, benzyl, 4,4'-dimethoxybenzyl, benzyldimethylketal, 2,3-bornanedione (camphor quinone), 2,2,5,5-tetramethyltetrahydro-3,4-furoic acid (imidazoletrione)), xanthone derivatives (e.g., xanthone), thioxanthone derivatives (e.g., thioxanthone, 2-chlorothioxanthone) and ketocoumarin derivatives.

Examples of the commercial product include Irgacure 184, 651 and 907 represented by the following formulae, which are commercially available from Ciba Geigy.

Irgacure 907:

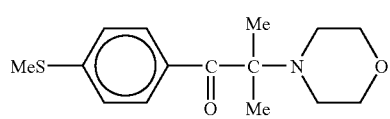

Irgacure 184:

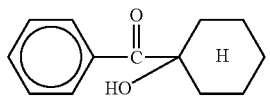

Irgacure 651:

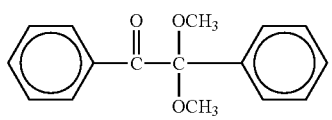

Other preferred examples include quinone-base polymerization initiators (e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-dimethylanthraquinone, sodium anthraquinone-α-sulfonate, 3-chloro-2-methylanthraquinone, retenequinone, 7,8,9,10-tetrahydronaphthacenequinone, 1,2,3,4-tetrahydrobenz(a)-anthracene-7,12-dione).

2) Organic Peroxide-Base Polymerization Initiator

Preferred examples of this polymerization initiator include benzoyl peroxide, di-tert-butyl peroxide, and 3,3',4,4'-tetra (tert-butylperoxycarbonyl)benzophenone described in JP-A-59-189340 and JP-A-60-76503.

3) Bisimidazole-Base Polymerization Initiator

The bisimidazole-base polymerization initiator is preferably a bis(2,4,5-triphenyl)imidazole derivative and examples thereof include bis(2,4,5-tirphenyl)imidazole, 2-(o-chlorophenyl)-4,5-bis(m-methoxyphenyl)imidazole dimer (CDM-HABI), 1,1'-biimidazole-2,2'-bis(o-chlorophenyl)-4, 4',5,5'-tetraphenyl (o-Cl-HABI), and 1H-imidazole-2,5-bis (o-chlorophenyl)-4-[3,4-dimethoxyphenyl] dimer (TCTM-HABI).

The bisimidazole-base polymerization initiator is preferably used together with a hydrogen donor. Preferred examples of the hydrogen donor include 2-mercaptobenzoxazole, 2-mercaptobenzothiazole and 4-methyl-4H-1,2,4-triazole-3-thiol.

4) Trihalomethyl-Substituted Triazine-Base Polymerization Initiator (Acid Generator)

The trihalomethyl-substituted triazine-base polymerization initiator (acid generator) is preferably represented by the following formula (11):

wherein $R_{21}$, $R_{22}$ and $R_{23}$ each independently represents a hydrogen atom, preferably a chlorine atom, $R_{24}$ and $R_{25}$ each independently represents a hydrogen atom, —$CR_{21}R_{22}R_{23}$ or a substituent.

Preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenyl-carbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenylcarbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

$R_{24}$ is preferably —$CR_{21}R_{22}R_{23}$, more preferably a —$CCl_3$ group, and $R_{25}$ is preferably —$CR_{21}R_{22}R_{23}$, an alkyl group, an alkenyl group or an aryl group.

Specific examples of the trihalomethyl-substituted triazine-base polymerization initiator (acid generator) include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4'-methoxyphenyl)-4,6-bis(trichloromethyl)-1,3,5-triazine, 2-(4'-trifluoromethylphenyl)-4,6-bis(trichloromethyl)-1,3,5-triazine, 2,4-bis(trichloromethyl)-6-(p-methoxyphenylvinyl)-1,3,5-triazine and 2-(4'-methoxy-1'-naphthyl)-4,6-bis(trichloromethyl)-1,3,5-triazine. Preferred examples thereof also include the compounds described in British Patent 1,388,492 and JP-A-53-133428.

5) Diazonium Salt-Base Polymerization Initiator (Acid Generator)

The diazonium salt-base polymerization initiator (acid generator) is preferably represented by the following formula (12):

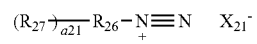

wherein $R_{26}$ represents an aryl group or a heterocyclic group, preferably an aryl group, more preferably a phenyl group;

$R_{27}$ represents a substituent (preferred examples of the substituent are the same as those of the substituent described above for $R_{24}$); a21 represents an integer of 0 to 5, preferably 0 to 2, and when a21 is 2 or more, multiple $R_{27}$s may be the same or different or may combine with each other to form a ring; and $X_{21}^-$ is an anion such that $HX_{21}$ becomes an acid having a pKa of 4 or less (in water, 25° C.), preferably 3 or less, more preferably 2 or less, and preferred examples thereof include chloride, bromide, iodide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate and tetra(pentafluorophenyl)borate.

Specific examples of the diazonium-base polymerization initiator (acid generator) include the above-described $X_{21}^-$ salts of benzenediazonium, 4-methoxydiazonium and 4-methyldiazonium.

6) Diaryliodonium Salt-Base Polymerization Initiator (Acid Generator)

The diaryliodonium salt-base polymerization initiator (acid generator) is preferably represented by the following formula (13):

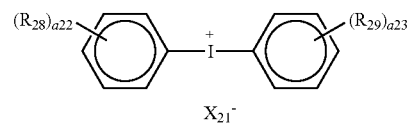

wherein $X_{21}^-$ has the same meaning as in formula (12), $R_{28}$ and $R_{29}$ each independently represents a substituent (preferred examples of the substituent are the same as those of the substituent described above for $R_{24}$), preferably an alkyl group, an alkoxy group, a halogen atom, a cyano group or a nitro group, a22 and a23 each independently represents an integer of 0 to 5, preferably 0 to 1, and when a22 or a23 is 2 or more, multiple $R_{28}$s or $R_{29}$s may be the same or different and may combine with each other to form a ring.

Specific examples of the diaryliodonium salt-base polymerization initiator (acid generator) include chloride, bromide, iodide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perfluorobutanesulfonate and pentafluorobenzenesulfonate of diphenyliodonium, 4,4'-dichlorodiphenyliodonium, 4,4'-dimethoxydiphenyliodonium, 4,4'-dimethyldiphenyliodonium, 4,4'-di-tert-butyldiphenyliodonium, 4,4'-di-tert-amyldiphenyliodonium, 3,3'-dinitrodiphenyliodonium, phenyl(p-methoxyphenyl)iodonium, phenyl(p-octyloxyphenyl)iodonium and bis(p-cyanophenyl)iodonium.

Other examples include compounds described in *Macromolecules*, Vol. 10, page 1307 (1977), and diaryliodonium salts described in JP-A-58-29803, JP-A-1-287105 and Japanese Patent Application No. 3-5569.

7) Sulfonium Salt-Base Polymerization Initiator (Acid Generator)

The sulfonium salt-base polymerization initiator (acid generator) is preferably a compound represented by the following formula (14):

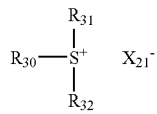

wherein $X_{21}^-$ has the same meaning as in formula (12), and $R_{30}$, $R_{31}$ and $R_{32}$ each independently represents an alkyl group, an aryl group or a heterocyclic group (preferred examples of these groups are the same as those for $R_{24}$), preferably an alkyl group, a phenacyl group or an aryl group.

Specific examples of the sulfonium salt-base polymerization initiator (acid generator) include chloride, bromide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perchlorobutanesulfonate and pentafluorobenzenesulfonate of sulfonium salts such as triphenylsulfonium, diphenylphenacylsulfonium, dimethylphenacylsulfonium, benzyl-4-hydroxyphenylmethylsulfonium, 4-tertiary-butyltriphenylsulfonium, tris(4-methylphenyl)-sulfonium, tris(4-methoxyphenyl)sulfonium, 4-phenylthiotriphenylsulfonium and bis-1-(4-(diphenylsulfonium)-phenyl)sulfide.

8) Borate-Base Polymerization Initiator

The borate-base polymerization initiator is preferably represented by the following formula (15):

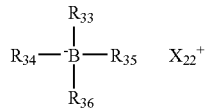

wherein $R_{33}$, $R_{34}$, $R_{35}$ and $R_{36}$ each independently represents an alkyl group, an alkenyl group, an alkynyl group, a cycloalkyl group or an aryl group (preferred examples of these groups are the same as those for $R_{24}$), preferably an alkyl group or an aryl group, provided that $R_{33}$, $R_{34}$, $R_{35}$ and $R_{36}$ are not an aryl group at the same time, and $X_{22}^+$ represents a cation.

The compound where $R_{33}$, $R_{34}$ and $R_{35}$ are each independently an aryl group and $R_{36}$ is an alkyl group is more preferred, and the compound where $R_{33}$, $R_{34}$ and $R_{35}$ all are a phenyl group and $R_{36}$ is an n-butyl group is most preferred.

Specific examples of the borate-base polymerization initiator include tetrabutylammonium n-butyltriphenylborate and tetramethylammonium sec-butyltriphenylborate.

9) Diaryliodonium Organic Boron Complex-Base Polymerization Initiator

The diaryliodonium organic boron complex-base polymerization initiator is preferably represented by the following formula (16):

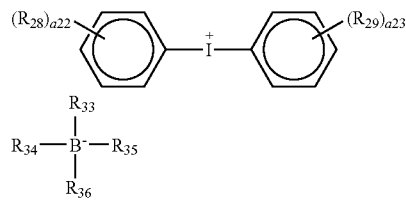

wherein $R_{28}$, $R_{29}$, a22 and a23 have the same meanings as in formula (13) and $R_{33}$, $R_{34}$, $R_{35}$ and $R_{36}$ have the same meanings as in formula (15).

Specific examples of the diaryliodonium organic boron complex-base polymerization initiator include I-1 to I-3 shown below.

I-1:

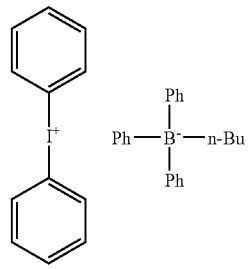

I-2:

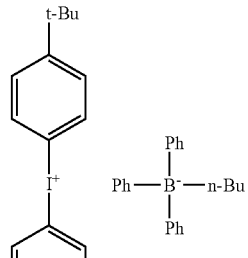

I-3:

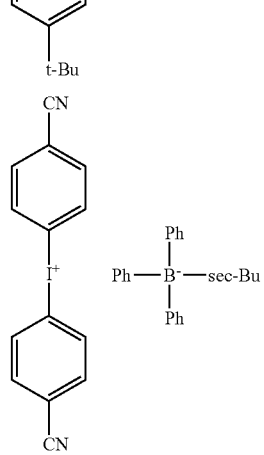

In addition, iodonium organic boron complexes such as diphenyliodonium (n-butyl)triphenylborate described in JP-A-3-704 are also preferred.

10) Sulfonium Organic Boron Complex-Base Polymerization Initiator

The sulfonium organic boron complex-base polymerization initiator is preferably represented by the following formula (17):

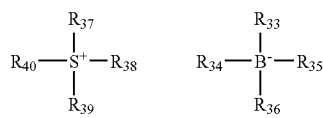

wherein $R_{33}$, $R_{34}$, $R_{35}$ and $R_{36}$ have the same meanings as in formula (15), $R_{37}$, $R_{38}$ and $R_{39}$ each independently represents an alkyl group, an aryl group, an alkenyl group, an alkynyl group, a cycloalkyl group, an alkoxy group, an aryloxy group, an alkylthio group, an arylthio group or an amino group (preferred examples of these groups are the same as those for $R_{24}$), preferably an alkyl group, a phenacyl group, an aryl group or an alkenyl group, $R_{37}$, $R_{38}$ and $R_{39}$ may combine with each other to form a ring, and $R_{40}$ represents an oxygen atom or a lone electron pair.

Specific examples of the sulfonium organic boron complex-base polymerization initiator include I-4 to I-10 shown below.

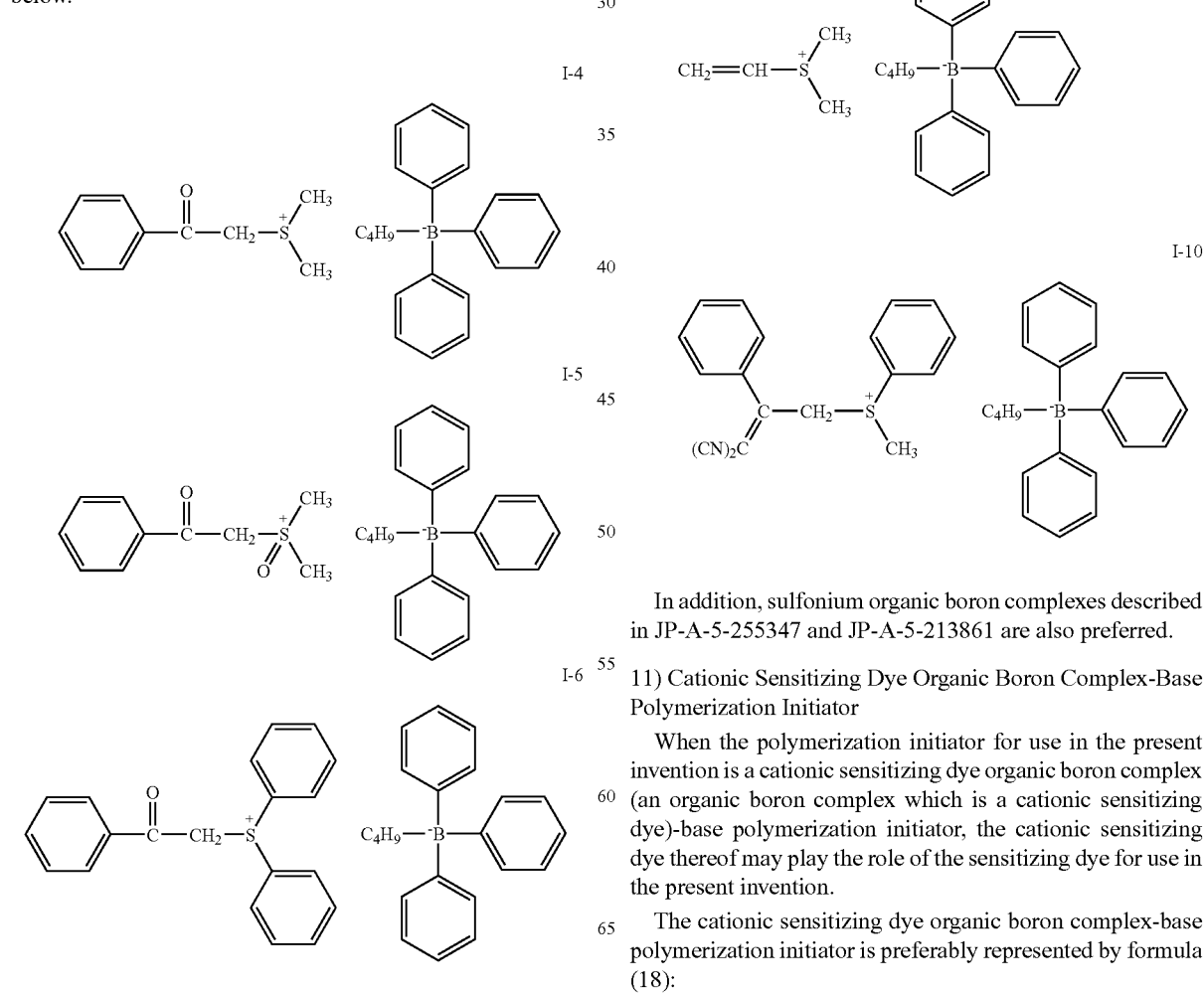

In addition, sulfonium organic boron complexes described in JP-A-5-255347 and JP-A-5-213861 are also preferred.

11) Cationic Sensitizing Dye Organic Boron Complex-Base Polymerization Initiator When the polymerization initiator for use in the present invention is a cationic sensitizing dye organic boron complex (an organic boron complex which is a cationic sensitizing dye)-base polymerization initiator, the cationic sensitizing dye thereof may play the role of the sensitizing dye for use in the present invention.

The cationic sensitizing dye organic boron complex-base polymerization initiator is preferably represented by formula (18):

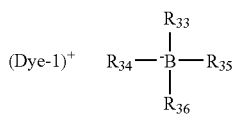

wherein (Dye-1)$^+$ is a cationic sensitizing dye and preferred examples thereof include cationic sensitizing dyes out of the above-described sensitizing dyes, for example, cyanine dyes and merocyanine dyes are preferred with cyanine dyes being more preferred; and $R_{33}$, $R_{34}$, $R_{35}$ and $R_{36}$ have the same meanings as in formula (15).

Specific examples of the cationic sensitizing dye organic boron complex-base polymerization initiator include I-11, I-12, I-13 and I-14 shown below.

Other specific examples include cationic dye-borate anion complexes described in JP-A-62-143044 and JP-A-62-150242.

12) Anionic Sensitizing Dye Onium Salt Complex-Base Polymerization Initiator

When the polymerization initiator for use in the present invention is an anionic sensitizing dye onium salt complex (an onium salt complex which is an anionic sensitizing dye)-base polymerization initiator, the anionic sensitizing dye thereof may play the role of the sensitizing dye for use in the present invention.

The anionic sensitizing dye onium salt-base polymerization initiator is preferably represented by formula (19):

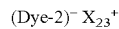

I-11

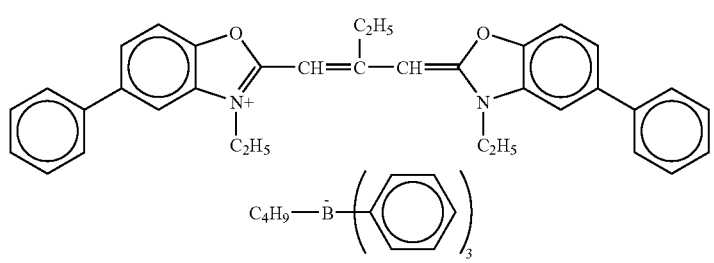

I-12

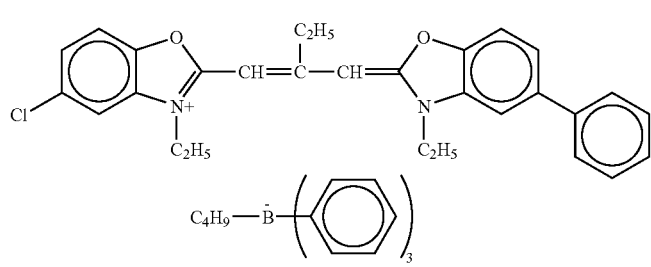

I-13

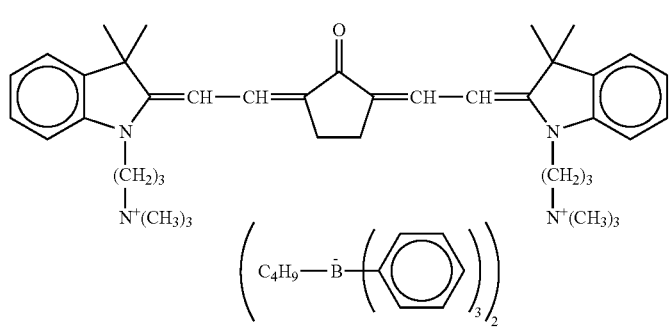

I-14

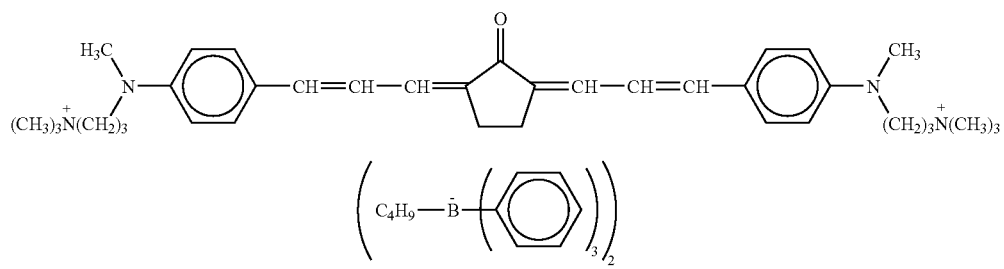

wherein (Dye-2)⁻ represents an anionic sensitizing dye and preferred examples thereof include anionic sensitizing dyes out of the above-described sensitizing dyes, for example, cyanine dyes, merocyanine dyes and oxonol dyes are preferred with cyanine dyes and oxonol dyes being more preferred; and $X_{23}^+$ represents a cation moiety of the diazonium salt of formula (12), a cation moiety of the diaryliodonium salt of formula (13) or a cation moiety of the sulfonium salt of formula (14) (preferred examples thereof are as described above), preferably a cation moiety of the diaryliodonium salt of formula (13) or a cation moiety of the sulfonium salt of formula (14).

Specific examples of the anionic sensitizing dye onium salt-base polymerization initiator include I-15 to I-32 shown below.

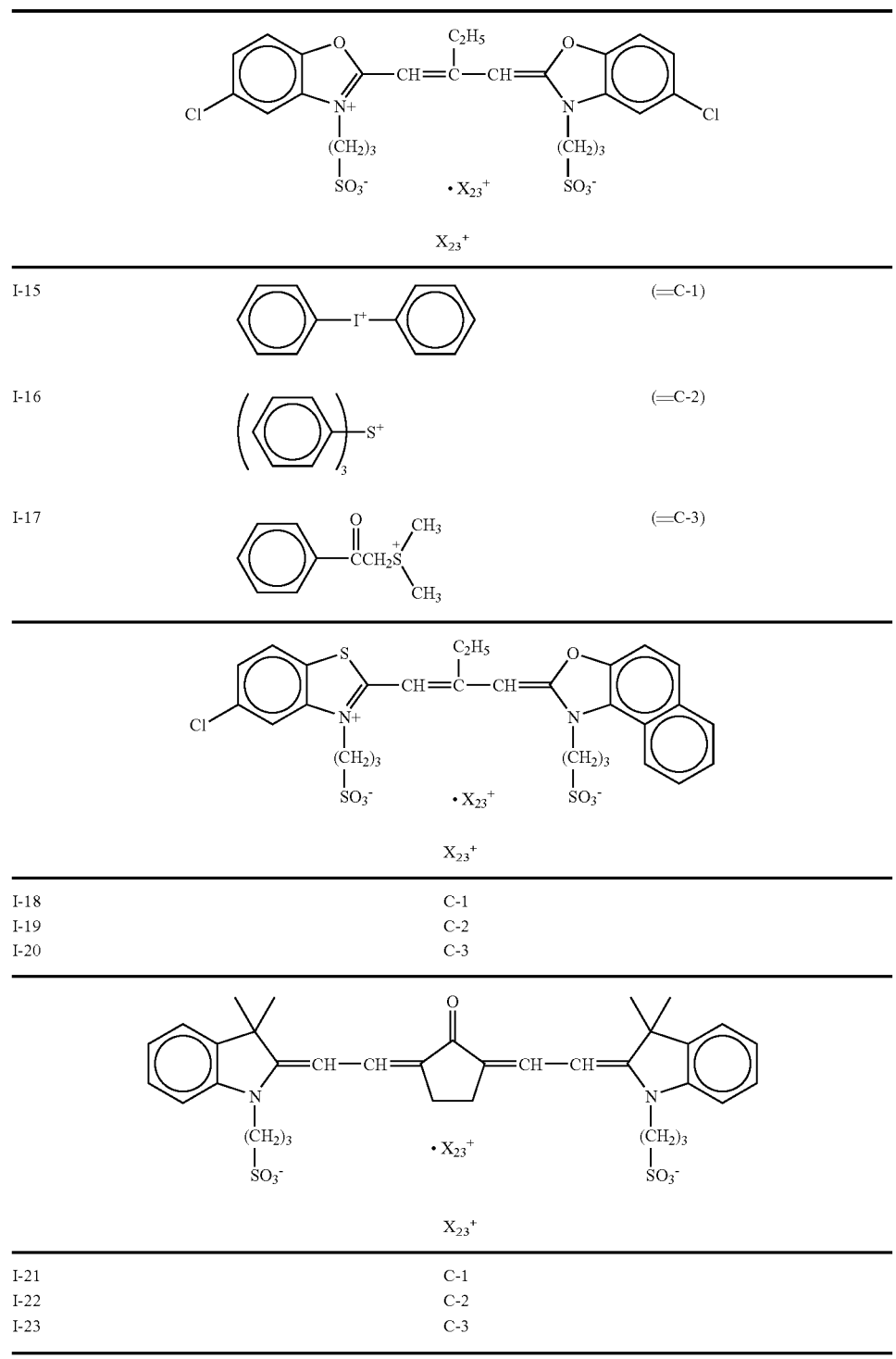

-continued

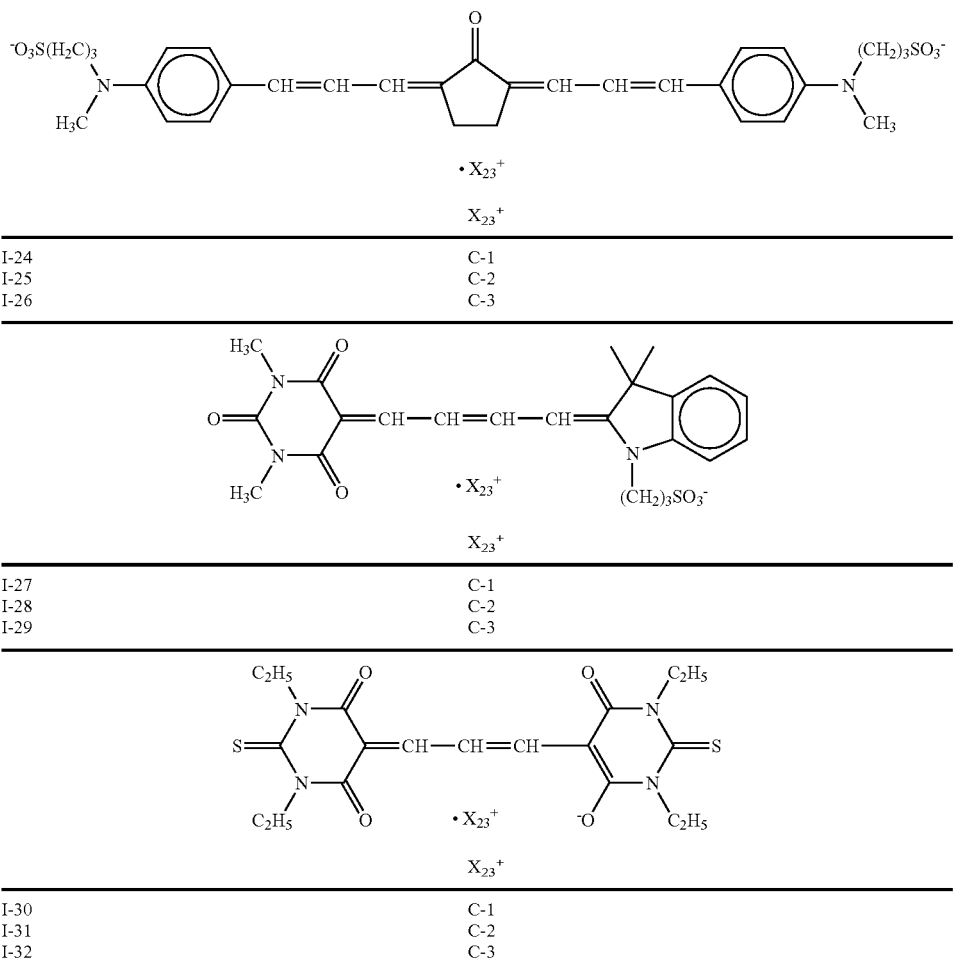

| | |
|---|---|
| I-24 | C-1 |
| I-25 | C-2 |
| I-26 | C-3 |
| I-27 | C-1 |
| I-28 | C-2 |
| I-29 | C-3 |
| I-30 | C-1 |
| I-31 | C-2 |
| I-32 | C-3 |

13) Metal Arene Complex-Base Polymerization Initiator

In the metal arene complex-base polymerization initiator, the metal is preferably iron or titanium.

Specific preferred examples of the metal arene complex-base polymerization initiator include iron arene complexes described in JP-A-1-54440, European Patent Nos. 109851 and 126712, and *J. Imag. Sci.*, Vol. 30, page 174 (1986), iron arene organic boron complexes described in *Organometallics*, Vol. 8, page 2737 (1989), iron arene complex salts described in *Prog. Polym. Sci.*, Vol. 21, pp. 7-8 (1996), and titanocenes described in JP-A-61-151197.

14) Sulfonic Acid Ester-Base Polymerization Initiator

Preferred examples of the sulfonic acid ester-base polymerization initiator include sulfonic acid esters, nitrobenzyl sulfonates and imidosulfonates.

Specific preferred examples of the sulfonic acid esters include benzoin tosylate and pyrogallol trimesylate. Specific preferred examples of the nitrobenzyl sulfonates include o-nitrobenzyl tosylate, 2,6-dinitrobenzyl tosylate, 2',6'-dinitrobenzyl-4-nitrobenzene sulfonate, p-nitrobenzyl-9,10-diethoxyanthracene-2-sulfonate and 2-nitrobenzyl trifluoromethylsulfonate. Specific preferred examples of the imidosulfonates include N-tosylphthalimide, 9-fluorenylidene aminotosylate and α-cyanobenzylidene tosylamine.

15) Other Polymerization Initiators

Examples of the polymerization initiator other than 1) to 14) above include organic azide compounds such as 4,4'-diazide chalcone, aromatic carboxylic acids such as N-phenylglycine, polyhalogen compounds (e.g., $CI_4$, $CHI_3$, $CBrCl_3$), pyridinium salts such as 1-benzyl-2-cyanopyridinium hexafluoroantimonate, phenylisoxazolones, silanol aluminum complexes, and aluminate complexes described in JP-A-3-209477.

The radical or cationic polymerization initiators for use in the present invention can be classified into:

a) polymerization initiator capable of activating radical polymerization, b) polymerization initiator capable of activating only cationic polymerization, and c) polymerization initiator capable of activating radical polymerization and cationic polymerization at the same time.

The polymerization initiator a) capable of activating radical polymerization is a polymerization initiator capable of generating a radical as a result of energy or electron transfer from the sensitizing dye in excited state (giving an electron to the sensitizing dye or accepting an electron from the sensitizing dye) and thereby initiating the radical polymerization of the polymerizable compound.

Out of the above-described systems, the following systems come under the polymerization initiator capable of activating radical polymerization:
1) ketone-base polymerization initiator,
2) organic peroxide-base polymerization initiator,
3) bisimidazole-base polymerization initiator,
4) trihalomethyl-substituted triazine-base polymerization initiator,
5) diazonium salt-base polymerization initiator,
6) diaryliodonium salt-base polymerization initiator,
7) sulfonium salt-base polymerization initiator,
8) borate-base polymerization initiator,
9) diaryliodonium organic boron complex-base polymerization initiator,
10) sulfonium organic boron complex-base polymerization initiator,
11) cationic sensitizing dye organic boron complex-base polymerization initiator,
12) anionic sensitizing dye onium salt complex-base polymerization initiator, and
13) metal arene complex-base polymerization initiator.

Among these polymerization initiators capable of activating radical polymerization, preferred are
1) ketone-base polymerization initiator,
3) bisimidazole-base polymerization initiator,
4) trihalomethyl-substituted triazine-base polymerization initiator,
6) diaryliodonium salt-base polymerization initiator,
7) sulfonium salt-base polymerization initiator,
11) cationic sensitizing dye organic boron complex-base polymerization initiator, and
12) anionic sensitizing dye onium salt complex-base polymerization initiator, and more preferred are
3) bisimidazole-base polymerization initiator,
6) diaryliodonium salt-base polymerization initiator,
7) sulfonium salt-base polymerization initiator,
11) cationic sensitizing dye organic boron complex-base polymerization initiator, and
12) anionic sensitizing dye onium salt complex-base polymerization initiator.

The polymerization initiator capable of activating only cationic polymerization is a polymerization initiator capable of generating an acid (Broensted acid or Lewis acid) without generating a radical as a result of energy or electron transfer from the sensitizing dye on excited state and initiating the cationic polymerization of the polymerizable compound under the action of the acid.

Out of the above-described systems, the following system comes under the polymerization initiator capable of activating only cationic polymerization:
14) sulfonic acid ester-base polymerization initiator.

Here, as the cationic polymerization initiator, those described, for example, in S. Peter Pappas (compiler), *UV Curing; Science and Technology*, pp. 23-76, *A Technology Marketing Publication*, and B. Klingert, M. Riediker and A. Roloff, *Comments Inorg. Chem.*, Vol. 7, No. 3, pp. 109-138 (1988) can also be used.

The polymerization initiator capable of activating radical polymerization and cationic polymerization at the same time is a polymerization initiator capable of generating a radical and an acid (Broensted acid or Lewis acid) at the same time as a result of energy or electron transfer from the sensitizing dye in excited state and initiating the radical polymerization of the polymerizable compound under the action of the radical generated and also the cationic polymerization of the polymerizable compound under the action of the acid generated.

Out of the above-described systems, the following systems come under the polymerization initiator capable of activating radical polymerization and cationic polymerization at the same time:
4) trihalomethyl-substituted triazine-base polymerization initiator,
5) diazonium salt-base polymerization initiator,
6) diaryliodonium salt-base polymerization initiator,
7) sulfonium salt-base polymerization initiator, and
13) metal arene complex-base polymerization initiator.

Among these polymerization initiators capable of activating radical polymerization and cationic polymerization at the same time, preferred are
6) diaryliodonium salt-base polymerization initiator, and
7) sulfonium salt-base polymerization initiator.

The anionic polymerization initiator for use in the present invention is described below. The anionic polymerization initiator for use in the present invention is preferably a base generator capable of generating a base (Broensted base or Lewis base) and thereby initiating the anionic polymerization.

The base generator is a compound capable of generating a base as a result of energy or electron transfer from the excited state of sensitizing dye or colored material. The base generator is preferably stable in a dark place. The base generator for use in the present invention is preferably a compound capable of generating a base as a result of electron transfer from the excited state of sensitizing dye or colored material.

The base generator for use in the present invention preferably generates a Broensted base by light, more preferably generates an organic base, and still more preferably generates an amine as the organic base.

The anionic polymerization initiator for use in the present invention, namely, the base generator is preferably represented by formula (1-1), (1-2), (1-3) or (1-4). These base generates may be used, if desired, as a mixture of two or more thereof at an arbitrary ratio.

In formulae (1-1) and (1-2), $R_1$ and $R_2$ each independently represents a hydrogen atom, an alkyl group (preferably having a carbon number (in this application, referred to as "a C number") of 1 to 20, e.g., methyl, ethyl, n-propyl, isopropyl, n-butyl, n-pentyl, n-octadecyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl, 2-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino), preferably a hydrogen atom, an alkyl group or a cycloalkyl group, more preferably a hydrogen atom, a methyl group, an ethyl group, a cyclohexyl group or a cyclopentyl group.

$R_1$ and $R_2$ may combine with each other to form a ring and the heterocyclic ring formed is preferably a piperidine ring, a pyrrolidine ring, a piperazine ring, a moropholine ring, a pyridine ring, a quinoline ring or an imidazole ring, more preferably a piperidine ring, a pyrrolidine ring or an imidazole ring, and most preferably a piperidine ring.

Examples of the preferred combination of $R_1$ and $R_2$ include a combination where $R_1$ is a cyclohexyl group which may be substituted, and $R_2$ is a hydrogen atom, a combination where $R_1$ is an alkyl group which may be substituted, and $R_2$ is a hydrogen atom, and a combination where $R_1$ and $R_2$ are combined to form a piperidine ring or an imidazole ring.

In formulae (1-1) and (1-2), n1 is 0 or 1, preferably 1.

In formula (1-1), $R_3$ represents a substituent and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenylcarbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenylcarbamoylamino). Among these, more preferred are an alkyl group, an aryl group, a heterocyclic group, a halogen atom, an amino group, a cyano group, a nitro group, a carboxyl group, a sulfo group, an alkoxy group, an alkylthio group, an arylsulfonyl group, a sulfamoyl group, a carbamoyl group and an alkoxycarbonyl group.

In formula (1-1), $R_3$ is preferably a nitro group or an alkoxy group, more preferably a nitro group or a methoxy group, and most preferably a nitro group.

In formula (1-1), n2 is an integer of 0 to 5, preferably 0 to 3, more preferably 1 or 2. When n2 is 2 or more, multiple $R_3$s may be the same or different and may combine to form a ring. Preferred examples of the ring formed include a benzene ring and a naphthalene ring.

In formula (1-1), when $R_3$ is a nitro group, this is preferably substituted to the 2-position or 2,6-position, and when $R_3$ is an alkoxy group, this is preferably substituted to the 3,5-position.

In formula (1-1), $R_4$ and $R_5$ each independently represents a hydrogen atom or a substituent (preferred examples of the substituent are the same as those of the substituent described for $R_3$), preferably a hydrogen atom, an alkyl group or an aryl group, more preferably a hydrogen atom, a methyl group or a 2-nitrophenyl group.

Examples of the preferred combination of $R_4$ and $R_5$ include a combination where $R_4$ and $R_5$ both a hydrogen atom, a combination where $R_4$ is a methyl group and $R_5$ is a hydrogen atom, a combination where $R_4$ and $R_5$ both a methyl group, and a combination where $R_4$ is a 2-nitrophenyl group and $R_5$ is a hydrogen atom. Among these, more preferred is a combination where $R_4$ and $R_5$ both are a hydrogen atom.

In formula (1-2), $R_6$ and $R_7$ each independently represents a substituent (preferred examples of the substituent are the same as those of the substituent described for $R_3$), preferably an alkoxy group, an alkylthio group, a nitro group or an alkyl group, more preferably a methoxy group.

In formula (1-2), n3 and n4 each independently represents an integer of 0 to 5, preferably from 0 to 2. When n3 and n4 each is 2 or more, multiple $R_6$s or $R_7$s may be the same or different and may combine to form a ring. Preferred examples of the ring formed include a benzene ring and a naphthalene ring.

In formula (1-2), $R_6$ is preferably an alkoxy group substituted to the 3,5-position, more preferably a methoxy group substituted to the 3,5-position.

In formula (1-2), $R_8$ represents a hydrogen atom or a substituent (preferred examples of the substituent are the same as those of the substituent described for $R_3$), preferably a hydrogen atom or an aryl group, more preferably a hydrogen atom.

In formula (1-3), $R_9$ represents a substituent (preferred examples of the substituent are the same as those of the substituent described for $R_3$), preferably an alkyl group, an aryl group, a benzyl group or an amino group, more preferably an alkyl group which may be substituted, a tert-butyl group, a phenyl group, a benzyl group, an anilino group which may be substituted, or a cyclohexylamino group.

The compound represented by formula (1-3) may be a compound connected to a polymer chain from $R_9$.

In formula (1-3), $R_{10}$ and $R_{11}$ each independently represents a hydrogen atom or a substituent (preferred examples of the substituent are the same as those of the substituent described for $R_3$), preferably an alkyl group or an aryl group, more preferably a methyl group, a phenyl group or a 2-naphthyl group.

$R_{10}$ and $R_{11}$ may combine with each other to form a ring and preferred examples of the ring formed include a fluorenone ring.

In formula (1-1), $R_{12}$ represents an aryl group or a heterocyclic group, preferably an aryl group or a heterocyclic group shown below:

$R_{12}$:

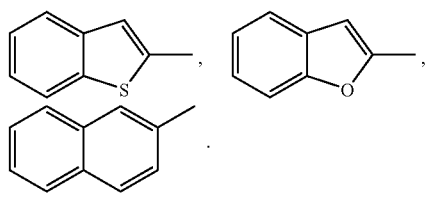

In formula (1-4), $R_{13}$, $R_{14}$ and $R_{15}$ each independently represents a hydrogen atom, an alkyl group, an alkenyl group, a cycloalkyl group, an aryl group or a heterocyclic group (preferred examples of these groups are the same as those described for $R_1$ and $R_2$), preferably an alkyl group, more preferably a butyl group. $R_{13}$, $R_{14}$ and $R_{15}$ may combine with each other to form a ring and the heterocyclic ring formed is preferably a piperidine ring, a pyrrolidine ring, a piperazine ring, a moropholine ring, a pyridine ring, a quinoline ring or an imidazole ring, more preferably a piperidine ring, a pyrrolidine ring or an imidazole ring.

In formula (1-4), $R_{16}$, $R_{17}$, $R_{18}$ and $R_{19}$ each independently represents an alkyl group or an aryl group and it is preferred that $R_{16}$, $R_{17}$ and $R_{18}$ all are a phenyl group and $R_{19}$ is an n-butyl group or a phenyl group.

The base generator for use in the present invention is preferably represented by formula (1-1) or (1-3), more preferably by formula (1-1).

Specific preferred examples of the base generator for use in the present invention are set forth below, but the present invention is not limited thereto.

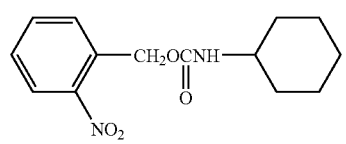

PB-1

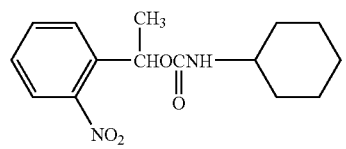

PB-2

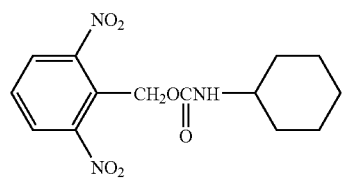

PB-3

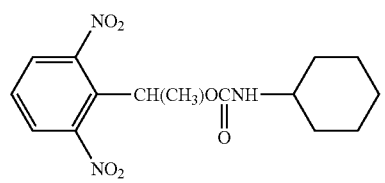

PB-4

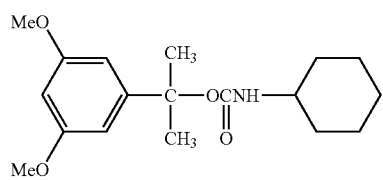

PB-5

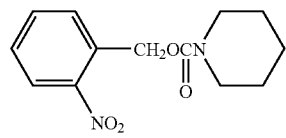

PB-6

PB-7

-continued
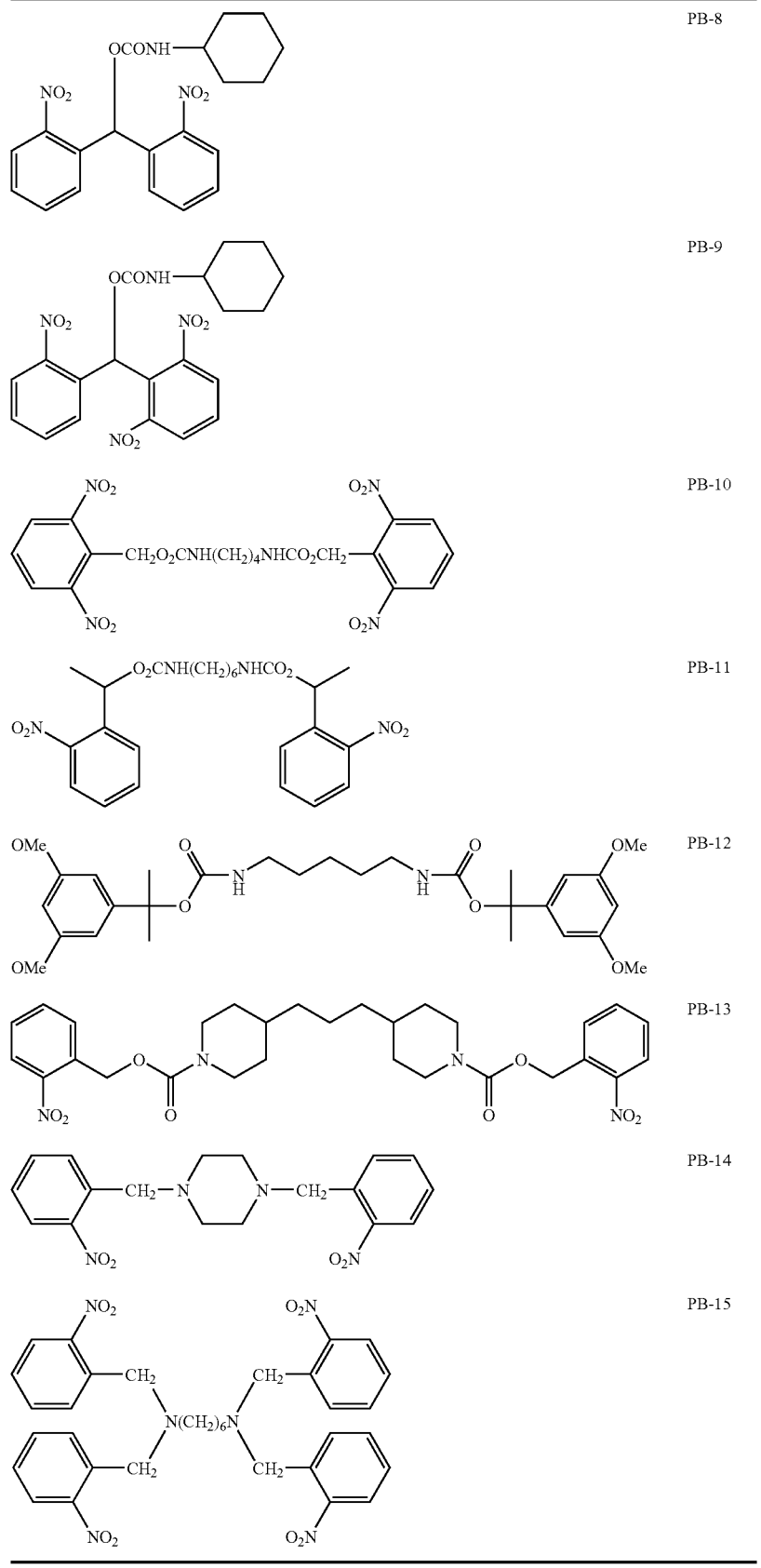

-continued
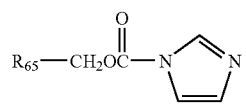
| | $R_{65}$ |
|---|---|
| PB-16 | 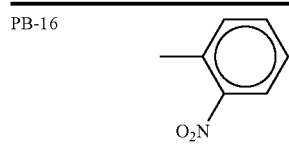 |
| PB-17 | 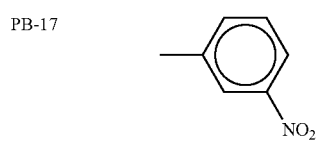 |
| PB-18 |  |
| PB-19 | 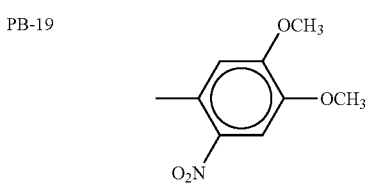 |
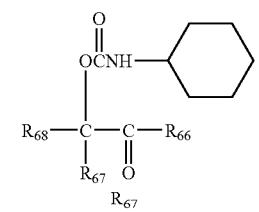
| | $R_{66}$ | $R_{67}$ | $R_{68}$ |
|---|---|---|---|
| PB-20 | 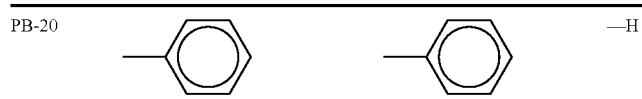 | | —H |
| PB-21 | 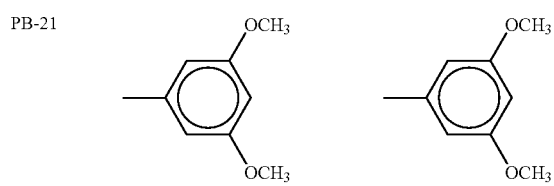 | | " |
| PB-22 |  | " | " |
| PB-23 | 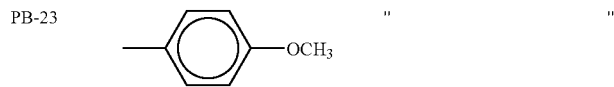 | " | " |
| PB-24 | 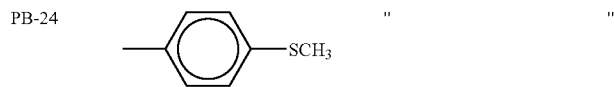 | " | " |
| PB-25 | 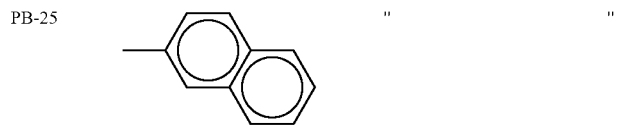 | " | " |
| PB-26 |  | " | |

-continued
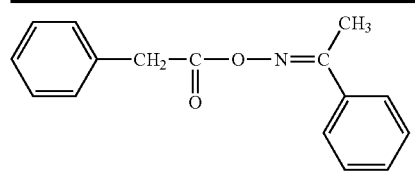
PB-27
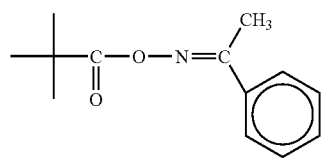
PB-28
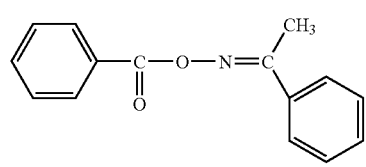
PB-29
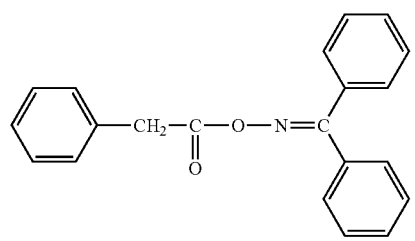
PB-30
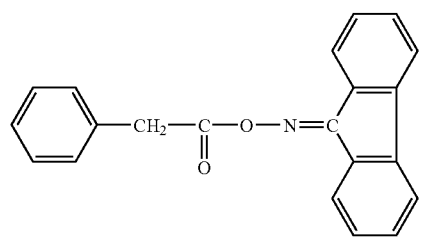
PB-31
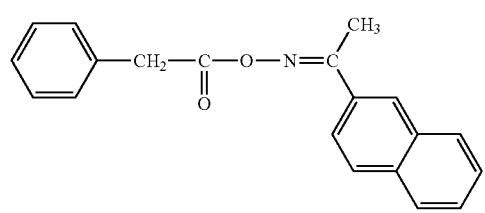
PB-32
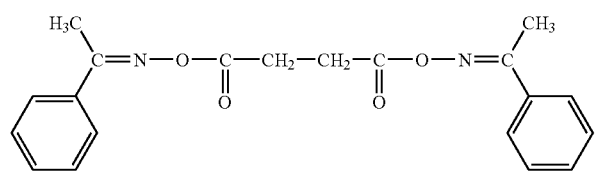
PB-33
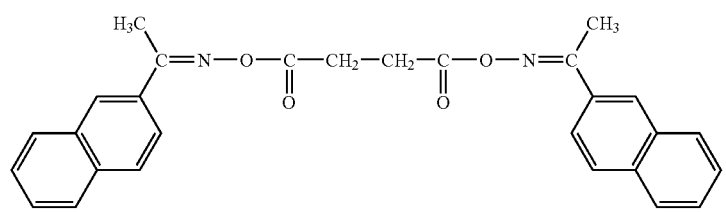
PB-34

-continued
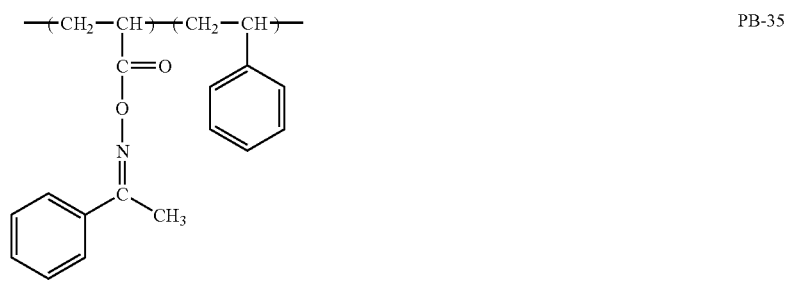
PB-35
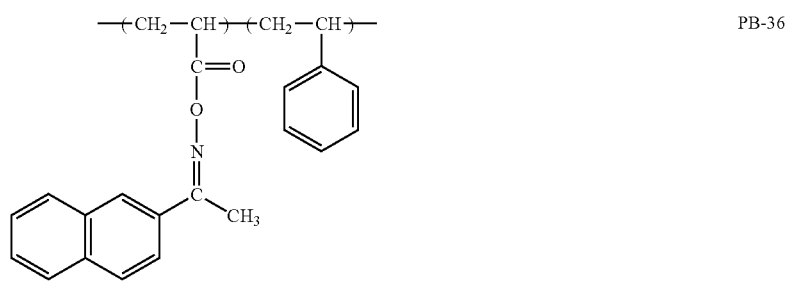
PB-36
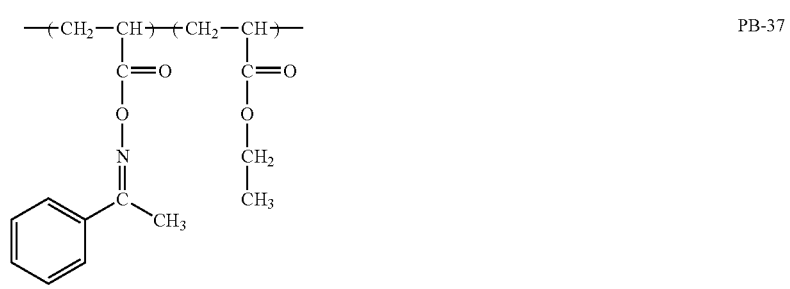
PB-37
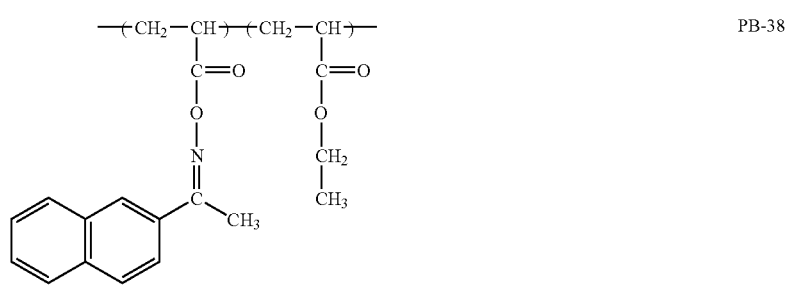
PB-38
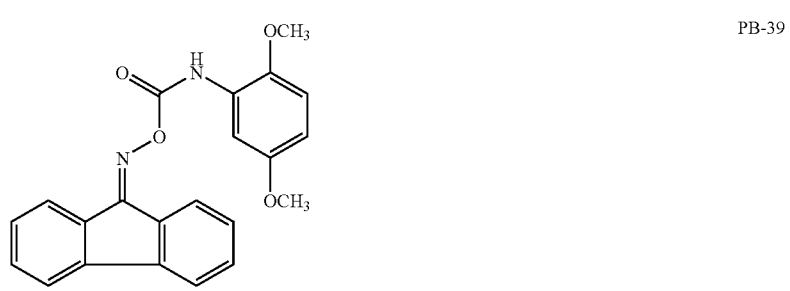
PB-39
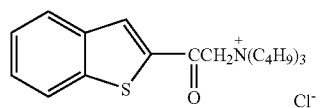

-continued
| | |
|---|---|
| PB-40 | 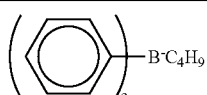 |
| PB-41 | 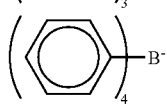 |
| PB-42 |  $^-BF_4$ <br> 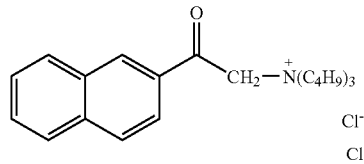 |
| PB-43 | 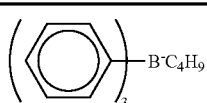 |
| PB-44 |  |
| | 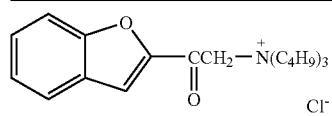 |
| PB-45 | 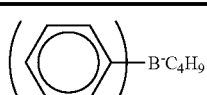 |
| PB-46 | 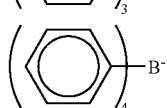 |
| | 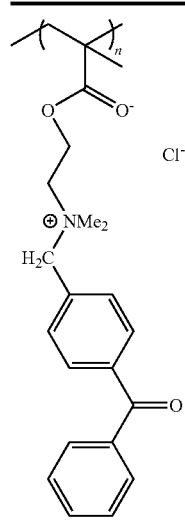 |
| PB-47 | 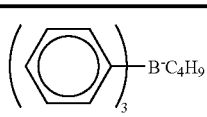 |

-continued

| | |
|---|---|
| PB-48 | 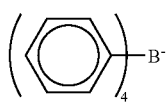 |
| | 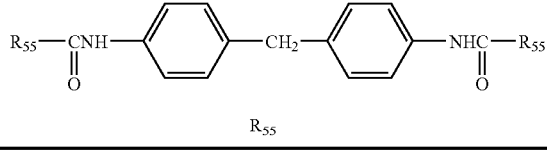 |
| | $R_{55}$ |
| PB-49 | —H |
| PB-50 | —CH$_3$ |
| PB-51 | 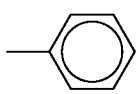 |
| [Co(III)(NH$_3$)$_5$Br](ClO$_4$)$_2$ | PB-52 |
| 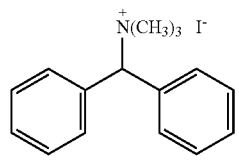 | PB-53 |
| 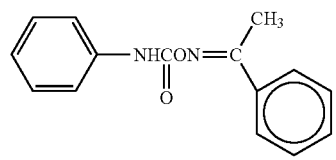 | PB-54 |
| 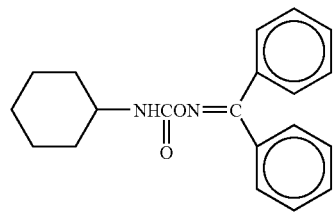 | PB-55 |

The dye precursor for use in the hologram recording material of the present invention, which can become a colored material as a result of electron or energy transfer from the excited state of the sensitizing dye or the colored material, the colored material having absorption shifted to longer wavelength than a wavelength where the dye precursor has absorption; and the colored material having no absorption at a wavelength of a hologram reproducing light, is described in detail below.

At this time, it is important that the refractive index differs between the portion where a color formation reaction takes place (interference bright part) and the portion where a color formation reaction does not take place (interference dark part). In general, a dye (a colored material) has a refractive index of a high value in a region from the vicinity of the absorption maximum wavelength (λmax) to a wavelength longer than that, and has a refractive index of a very high value particularly in a region from λmax to a wavelength about 200 nm longer than λmax. Depending on the dye, the refractive index takes a high value exceeding 2, even exceeding 2.5.

On the other hand, organic compounds which are not a dye, such as binder polymer, usually have a refractive index of approximately from 1.4 to 1.6.

Accordingly, the dye precursor for use in the present invention is preferably a dye precursor capable of forming a colored material having absorption shifted to longer wavelength than a wavelength where the dye precursor has absorption, directly as a result of electron or energy transfer from the excited state of the sensitizing dye or the colored material, or under the action of an acid or base generated as a result of electron or energy transfer from the excited state of the sensitizing dye or the colored material to the acid or base generator.

Also, the hologram recording material is, in view of high diffraction efficiency, preferably a phase hologram recording material of recording an interference fringe providing a refractive index modulation. That is, the hologram recording material preferably has no or almost no absorption at a wavelength of a reproducing light when reproducing the hologram.

Accordingly, the dye precursor for use in hologram recording material of the present invention preferably becomes a colored material having absorption shifted to longer wavelength than a wavelength where the dye precursor has absorption, directly as a result of electron or energy transfer from the excited state of the sensitizing dye or the colored material, or under the action of an acid or base generated as a result of electron or energy transfer from the excited state of the sensitizing dye or the colored material to the acid or base generator, more preferably becomes a colored material having no absorption at a wavelength of a hologram reproducing light and having absorption in shorter wavelength than that when forming a colored material by undergoing a reaction after holographic exposure. Also, the sensitizing dye preferably undergoes decomposition at the hologram recording or subsequent fixing to lose its absorption and sensitization function.

When the hologram recording material of the present invention has such a constitution, a phase hologram recording material capable of recording an interference fringe providing a refractive index modulation can be provided.

Furthermore, in order to give a large refractive index modulation, the dye precursor preferably becomes, after holographic exposure, a colored material having no absorption at a wavelength of a hologram reproducing light and having an absorption maximum in a region between a wavelength of a hologram reproducing light and a wavelength 200 nm shorter than the wavelength of the hologram reproducing light, more preferably a colored material having an absorption maximum in a region between a wavelength of a hologram reproducing light and a wavelength 100 nm shorter than the wavelength of the hologram reproducing light.

Incidentally, as described above, a wavelength of a light used for holographic exposure (recording) and a wavelength of a light used for hologram reproduction are preferably the same and therefore, the colored material preferably has no absorption at a wavelength of a hologram recording light and a hologram reproducing light.

As the dye precursor for use in the hologram recording material of the present invention, the following combinations are preferred:

A) a combination comprising at least an acid-induced color forming dye precursor (a dye precursor capable of forming a colored material under the action of an acid) as the dye precursor and an acid generator and if desired, further containing an acid-increasing agent, B) a combination comprising at least a base-induced color forming dye precursor (a dye precursor capable of forming a colored material under the action of a base) as the dye precursor and a base generator and if desired, further containing a base-increasing agent, C) a combination comprising a compound where an organic compound moiety having a function of cutting the covalent bond due to electron or energy transfer with the excited state of the sensitizing dye or the colored material is covalently bonded with an organic compound moiety of forming a colored material when covalently bonded and when released, or further containing a base, and D) a combination comprising a compound capable of undergoing a reaction due to electron transfer with the excited state of the sensitizing dye or the colored material and changing the absorption form.

In any of these cases, when an energy transfer mechanism from the excited state of the sensitizing dye or the colored material is used, the mechanism may be either a Forster mechanism where energy transfer occurs from the singlet excited state of the sensitizing dye or the colored material, or a Dexter mechanism where energy transfer occurs from the triplet excited state.

At this time, in order to cause energy transfer with good efficiency, the excitation energy of the sensitizing dye or the colored material is preferably larger than the excitation energy of the dye precursor.

In the case of electron transfer mechanism from the excited state of the sensitizing dye or the colored material, this may be either a mechanism where electron transfer occurs from the singlet excited state of the sensitizing dye or the colored material, or a mechanism where electron transfer occurs from the triplet excited state.

The excited state of the sensitizing dye or the colored material may give an electron to the dye precursor, the acid generator or the base generator, or may receive an electron. In the case of giving an electron from the excited state of the sensitizing dye or the colored material, in order to cause efficient occurrence of electron transfer, the energy of orbital (LUMO) where an excited electron in the excited state of the sensitizing dye or the colored material is present is preferably higher than the energy of LUMO orbital of the dye precursor or the acid or base generator.

In the case where the excited state of the sensitizing dye or the colored material receives an electron, in order to cause efficient occurrence of electron transfer, the energy of orbital (HOMO) where a hole in the excited state of the sensitizing dye or the colored material is present is preferably lower than the energy of HOMO orbital of the dye precursor or the acid or base generator.

The preferred combinations of the dye precursor group for use in the hologram recording material of the present invention are described in detail below.

The case where the dye precursor used in the hologram recording material of the present invention is an acid-induced color forming dye precursor and further contains an acid generator is described below.

The acid generator is a compound capable of generating an acid as a result of energy or electron transfer from the excited state of the sensitizing dye or the colored material. The acid generator is preferably stable in a dark place. The acid generator for use in the present invention is preferably a compound capable of generating an acid as a result of electron transfer from the excited state of the sensitizing dye or the colored material.

As the acid generator in the dye precursor for use in the present invention, the following 6 systems are preferred. Preferred examples thereof are the same as those described above for the cationic polymerization initiator.

1) Trihalomethyl-substituted triazine-base acid generator
2) Diazonium salt-base acid generator
3) Diaryliodonium salt-base acid generator
4) Sulfonium salt-base acid generator
5) Metal arene complex-base acid generator
6) Sulfonic acid ester-base acid generator Among these acid generators for use in the present invention, more preferred are 3) diaryliodonium salt-base acid generator,
4) sulfonium salt-base acid generator, and
6) sulfonic acid ester-base acid generator.

In the case of using cationic polymerization and an acid-induced color forming dye precursor at the same time, it is preferred that the same compound functions as the cationic polymerization initiator and as the acid generator.

If desired, these acid generators may be used as a mixture of two or more thereof at an arbitrary ratio.

The acid-induced color forming dye precursor in the case where the dye precursor group used in the hologram recording material of the present invention contains at least an acid-induced color forming dye precursor as the dye precursor and further contains an acid generator, is described below.

The acid-induced color forming dye precursor for use in the present invention is a dye precursor which can become a colored material having an absorption form changed from an absorption form of the original state (the dye precursor), under the action of an acid generated from the acid generator. The acid-induced color forming dye precursor for use in the present invention is preferably a compound of which absorption is shifted to the longer wavelength side under the action of an acid, more preferably a compound which is colorless but is color-formed under the action of an acid.

Preferred examples of the acid-induced color forming dye precursor include triphenylmethane-base compounds, phthalide-base compounds (including indolylphthalide-base, azaphthalide-base and triphenylmethane phthalide-base compounds), phenothiazine-base compounds, phenoxazine-base compounds, fluoran-base compounds, thiofluoran-base compounds, xanthene-base compounds, diphenylmethane-base compounds, chromenopyrazole-base compounds, leucoauramine, methine-base compounds, azomethine-base compounds, Rhodamine lactam-base compounds, quinazoline-base compounds, diazaxanthene-base compounds, fluorene-base compounds and spiropyran-base compounds. Specific examples of these compounds are disclosed, for example, in JP-A-2002-156454 and patents cited therein, JP-A-2000-281920, JP-A-11-279328 and JP-A-8-240908.

The acid-induced color forming dye precursor is more preferably a leuco dye having a partial structure such as lactone, lactam, oxazine and spiropyran, and examples thereof include fluoran-base compounds, thiofluoran-base compounds, phthalide-base compounds, Rhodamine lactam-base compounds and spiropyran-base compounds.

The dye produced from the acid-induced color forming dye precursor for use in the present invention is preferably a xanthene dye, a fluoran dye or a triphenylmethane dye.

If desired, these acid-induced color forming dye precursors may be used as a mixture of two or more thereof at an arbitrary ratio.

Specific examples of the acid-induced color forming dye precursor preferred as the dye precursor for use in the present invention are described below, but the present invention is not limited to these specific examples.

The phthalide-base dye precursor is preferably represented by the following formula (21):

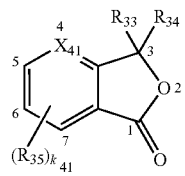

wherein $X_{41}$ represents CH or N, $R_{33}$ and $R_{34}$ each independently represents an alkyl group having a C number of 1 to 20, an aryl group having a C number of 6 to 24, a heterocyclic group having a C number of 1 to 24 or a group represented by the following formula (22), $R_{35}$ represents a substituent (preferred examples of the substituent are the same as those of the substituent described for $R_{24}$), $R_{35}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{41}$ represents an integer of 0 to 4, and when $k_{41}$ is an integer of 2 or more, multiple $R_{35}$s each independently represents a group described above. These groups each may further have a substituent and preferred examples of the substituent include the groups described for $R_{24}$.

In formula (21), a group represented by $R_{33}$ or $R_{34}$ is preferably represented by the following formula (22). Formula (22):

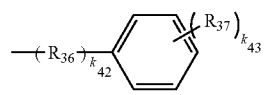

wherein $R_{36}$ represents an alkylene group having a C number of 1 to 3, $k_{42}$ represents an integer of 0 to 1, $R_{37}$ represents a substituent (preferred examples of the substituent are the same as those of the substituent described for $R_{24}$), $R_{37}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{43}$ represents an integer of 0 to 5, and when $k_{43}$ is an integer of 2 or more, multiple $R_{37}$s each independently represents a group described above. These groups each may further have a substituent and preferred examples of the substituent include the groups described for $R_{24}$.

The heterocyclic group represented by $R_{33}$ and $R_{34}$ in formula (21) is preferably an indolyl group represented by the following formula (23):

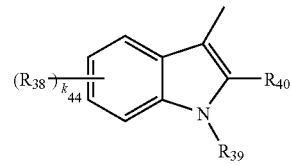

wherein $R_{38}$ represents a substituent (preferred examples of the substituent are the same as those of the substituent described for $R_{24}$), $R_{38}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{44}$ represents an integer of 0 to 4, and when $k_{44}$ is an integer of 2 or more, multiple $R_{38}$s each independently represents a group described above, $R_{39}$ represents a hydrogen atom or an alkyl group having a C number of 1 to 20, $R_{40}$ represents an alkyl group having a C number of 1 to 20 or an alkoxy group having a C number of 1 to 20. These groups each may further have a substituent and preferred examples of the substituent include the groups described for $R_{24}$.

Specific examples of the phthalide-base dye precursor (including indolylphthalide-base dye precursor and azaphthalide-base dye precursor) include 3,3-bis(4-diethylaminophenyl)-6-diethylaminophthalide, 3-(4-diethylaminophenyl)-3-(1-ethyl-2-methylindol-3-yl)phthalide, 3-(4-dimethylaminophenyl)-3-(1,3-dimethylindol-3-yl)phthalide, 3,3-bis(1-n-butyl-2-methylindol-3-yl)phthalide, 3,3-bis(1-ethyl-2-methylindol-3-yl)phthalide, 3-(4-diethylamino-2-ethoxyphenyl)-3-(1-ethyl-2-methylindol-3-yl)-4-azaphthalide, 3,3-bis(4-hydroxyphenyl)-6-hydroxyphthalide, 3,3-bis(4-hexyloxyphenyl)phthalide and 3,3-bis(4-hexyloxyphenyl)-6-methoxyphthalide.

The phthalide-base dye precursor represented by formula (21) is more preferably a triphenylmethane phthalide-base dye precursor represented by the following formula (24):

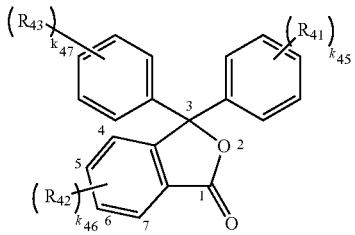

wherein $R_{41}$, $R_{42}$ and $R_{43}$ each independently represents a substituent (preferred examples of the substituent are the same as those of the substituent described for $R_{24}$), the substituent represented by $R_{41}$, $R_{42}$ and $R_{43}$ is more preferably a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{45}$, $k_{46}$ and $k_{47}$ each independently represents an integer of 0 to 4, and when $k_{45}$, $k_{46}$ and $k_{47}$ each is an integer of 2 or more, multiple $R_{41}$s, $R_{42}$s or $R_{43}$s each independently represents a group described above. These groups each may further have a substituent and preferred examples of the substituent include the groups described for $R_{24}$.

Specific examples of the triphenylmethane phthalide-base dye precursor include 3,3-bis(p-dimethylaminophenyl)-6-dimethylaminophthalide (that is, crystal violet lactone), 3,3-bis(p-dimethylaminophenyl)phthalide, 3,3-bis(p-dihexylaminophenyl)-6-dimethylaminophthalide, 3,3-bis(p-dioctylaminophenyl)phthalide, 3,3-bis(p-dimethylaminophenyl)-6-diethylaminophthalide, 4-hydroxy-4'-dimethylaminotriphenylmethane lactone, 4,4'-bisdihydroxy-3,3'-bisdiaminotriphenylmethane lactone, 3,3-bis(4-hydroxyphenyl)-4-hydroxyphthalide, 3,3-bis(4-hexyloxyphenyl)phthalide and 3,3-bis(4-hexyloxyphenyl)-6-methoxyphthalide.

The fluoran-base dye precursor is preferably represented by the following formula (25):

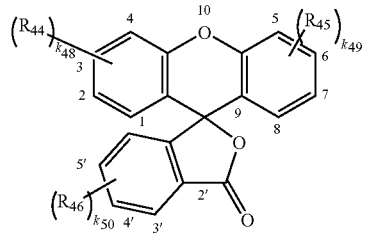

wherein $R_{44}$, $R_{45}$ and $R_{46}$ each independently represents a substituent (preferred examples of the substituent are the same as those of the substituent described for $R_{24}$), the substituent represented by $R_{44}$, $R_{45}$ and $R_{46}$ is more preferably a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 14, a hydroxyl group or a heterocyclic group, $k_{48}$, $k_{49}$ and $k_{50}$ each independently represents an integer of 0 to 4, and when $k_{48}$, $k_{49}$ and $k_{50}$ each is an integer of 2 or more, multiple $R_{44}$s, $R_{45}$s or $R_{46}$s each independently represents a group described above. These groups each may further have a substituent and preferred examples of the substituent include the groups described for $R_{24}$.

Specific examples of the fluoran-base dye precursor include 3-diethylamino-6-(2-chloroanilino)fluoran, 3-dibutylamino-6-(2-chloroanilino)fluoran, 3-diethylamino-7-methyl-6-anilinofluoran, 3-dibutylamino-7-methyl-6-anilinofluoran, 3-dipentylamino-7-methyl-6-anilinofluoran, 3-(N-ethyl-N-isopentylamino)-7-methyl-6-anilinofluoran, 3-diethylamino-7-methyl-6-xylidinofluoran, 3-diethylamino-6,7-benzofluoran, 3-diethylamino-7-methoxy-6,7-benzofluoran, 1,3-dimethyl-6-diethylaminofluoran, 2-bromo-3-methyl-6-dibutylaminofluoran, 2-N,N-dibenzylamino-6-diethylaminofluoran, 3-dimethylamino-6-methoxyfluoran, 3-diethylamino-7-methyl-6-chlorofluoran, 3-diethylamino-6-methoxyfluoran, 3,6-bisdiethylaminofluoran, 3,6-dihexyloxyfluoran, 3,6-dichlorofluoran and 3,6-diacetyloxyfluoran.

Specific examples of the Rhodamine lactam-base dye precursor include Rhodamine-B-anilinolactam, Rhodamine(p-nitroanilino)lactam, Rhodamine-B-(p-chloroanilino)lactam and Rhodamine-B-(o-chloroanilino)lactam.

Specific examples of the spiropyran-base dye precursor include 3-methyl-spirodinaphthopyran, 3-ethylspirodinaphthopyran, 3,3'-dichloro-spirodinaphthopyran, 3-benzyl-spirodinaphthopyran, 3-propyl-spirodibenzopyran, 3-phenyl-8'-methoxybenzoindolinospiropyran, 8'-methoxybenzoindolinospiropyan and 4,7,8'-trimethoxy-benzoindolino-spiropyran.

Other specific examples include spiropyran-base dye precursors disclosed in JP-A-2000-281920.

In addition, BLD compounds represented by formula (6) of JP-A-2000-284475, leuco dyes disclosed in JP-A-2000-144004, and leuco dyes having structures shown below can also be suitably used as the acid-induced color forming dye precursor for use in the present invention.

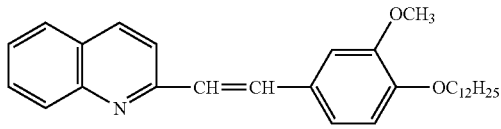 R-1
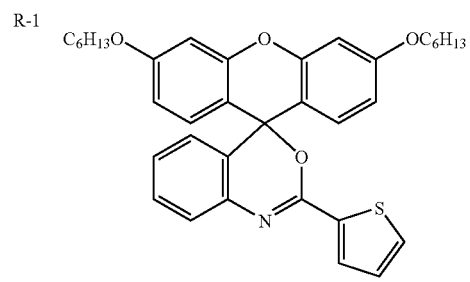 R-2

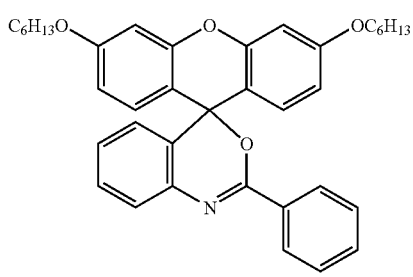 R-3
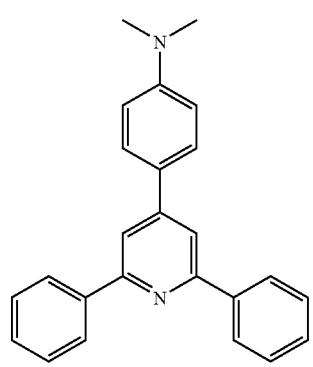 R-4

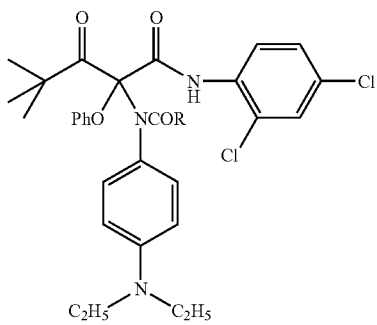

R = —CH₃
—CO₂C₂H₅
—CO₂CH₂Ph
—CO₂C₄H₉$^t$

R-5

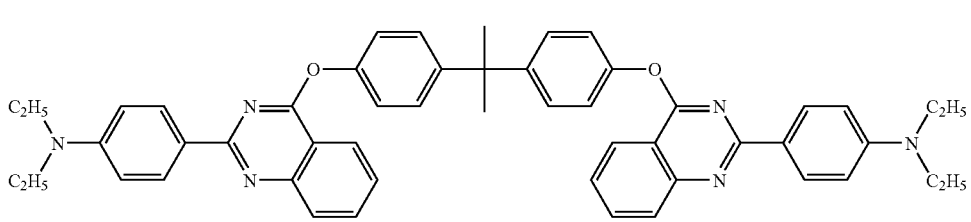 R-6

In particular, R-2 and R-3 are preferable as the acid-induced color forming dye precursor of the present invention.

Also the dye precursor of the present invention may be a leuco cyanine dye which forms a color by an acid (proton) addition. An example of color formation of a leuco cyanine dye by forming a cyanine dye with an acid is shown in the following.

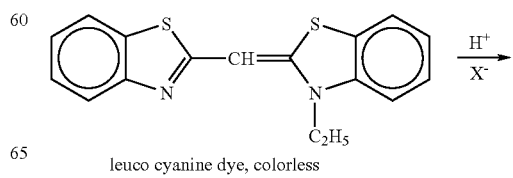

leuco cyanine dye, colorless

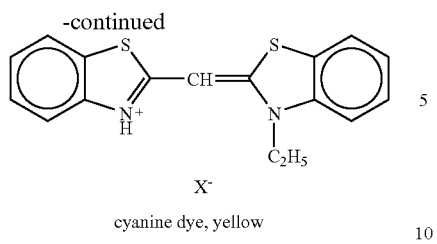
cyanine dye, yellow
Preferred examples of the leuco cyanine dye in the present invention are shown in the following, but the present invention is not limited to those examples.
|  | $n_{51}$ |
|---|---|
| LC-1 | 0 |
| LC-2 | 1 |
| LC-3 | 2 |
|  | $n_{51}$ |
|---|---|
| LC-4 | 0 |
| LC-5 | 1 |
| LC-6 | 2 |
|  | $n_{51}$ |
|---|---|
| LC-7 | 0 |
| LC-8 | 1 |
| LC-9 | 2 |
|  | $n_{51}$ |
|---|---|
| LC-10 | 0 |
| LC-11 | 1 |
| LC-12 | 2 |

-continued
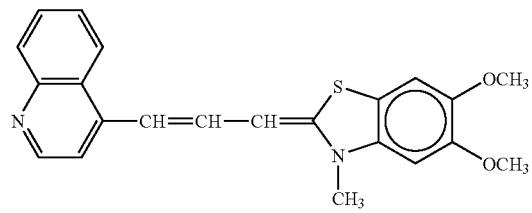
LC-13
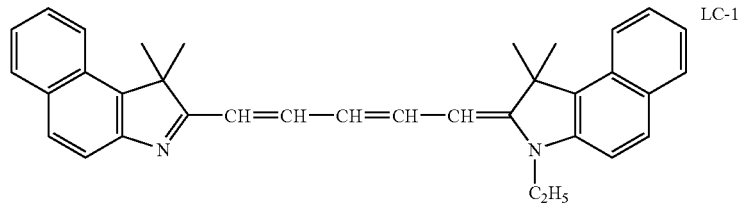
LC-14
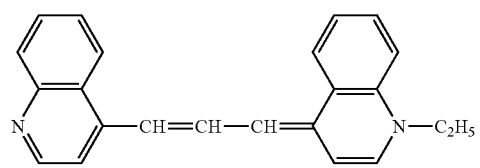
LC-15
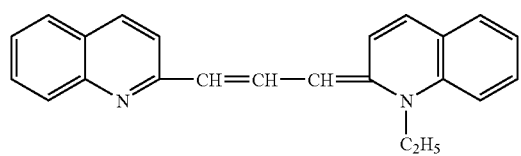
LC-16
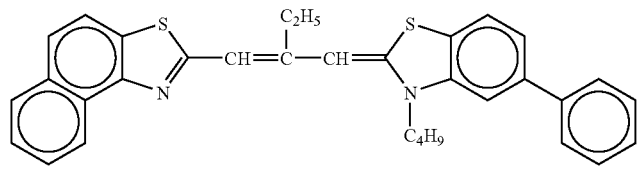
LC-17
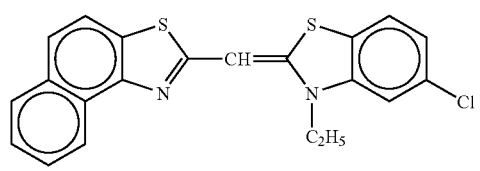
LC-18
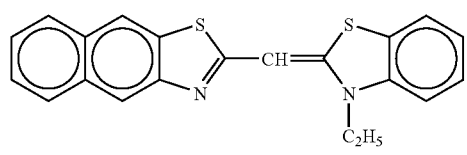
LC-19
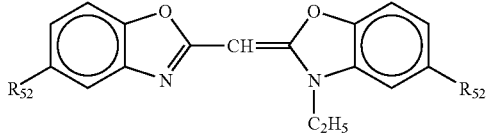
| | $R_{52}$ |
|---|---|
| LC-20 | —Cl |
| LC-21 | —Br |
| LC-22 | 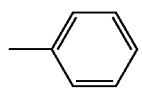 |

-continued

| | |
|---|---|
| LC-23 | —CH$_3$ |
| LC-24 | —OCH$_3$ |

When the dye precursor for use in the present invention contains at least an acid-induced color forming dye precursor as the dye precursor and an acid generator, the dye precursor may further contain an acid-increasing agent.

The acid-increasing agent for use in the present invention is a compound of increasing an acid by using, as a trigger, a small amount of acid generated from the acid generator and this compound is stable in the absence of an acid but when an acid is present, decomposes to release an acid which triggers decomposition of another acid-increasing agent to also release an acid.

The acid-increasing agent is preferably a compound represented by formula (4-1), (4-2), (4-3), (4-4), (4-5) or (4-6).

In formulae (4-1) to (4-6), $R_{101}$ represents a group of forming, in the form of $R_{101}OH$, an acid having a pKa of 5 or less, preferably an acid having a pKa of 3 or less.

$R_{101}$ is preferably a group of forming, in the form of $R_{101}OH$, a sulfonic acid, a carboxylic acid, a phosphoric acid, a phosphonic acid or a phosphinic acid, more preferably a sulfonic acid or an electron-withdrawing group-substituted carboxylic acid. The electron-withdrawing group is preferably a halogen atom, a cyano group, a nitro group, an alkoxycarbonyl group, a carbamoyl group, an alkylsulfonyl group, an arylsulfonyl group or a heterocyclic group. $R_{101}$ is most preferably a group of forming a sulfonic acid in the form of $R_{101}OH$.

Specific preferred examples of Rio, are set forth below, but the present invention is not limited thereto.

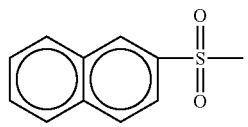
A-1

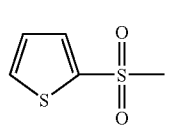
A-2

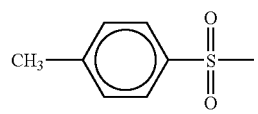
A-3

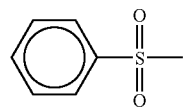
A-4

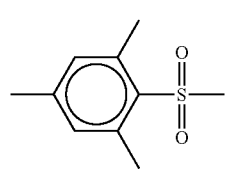

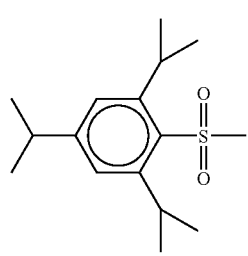

-continued

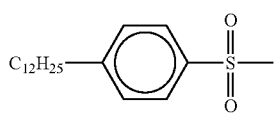
A-5

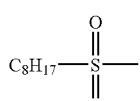
A-6

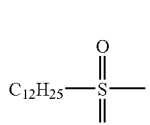
A-7

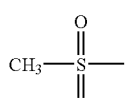
A-8

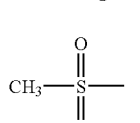
A-9

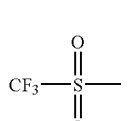
A-10

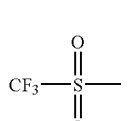
A-11

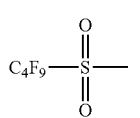
A-12

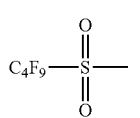
A-13

A-14

A-15

-continued

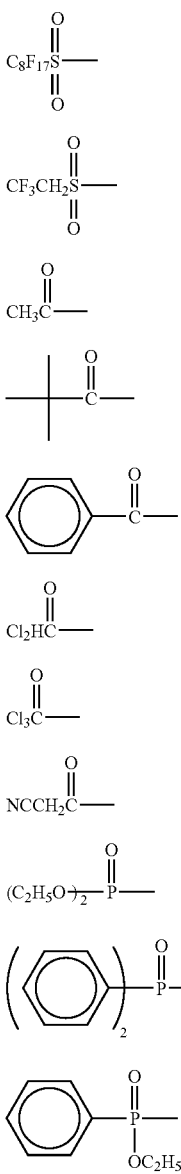

A-16
A-17
A-18
A-19
A-20
A-21
A-22
A-23
A-24
A-25
A-26

In formula (4-1), $R_{102}$ represents a 2-alkyl-2-propyl group, a 2-aryl-2-propyl group, a cyclohexyl group, a tetrahydropyranyl group or a bis(p-alkoxyphenyl)methyl group, preferably a 2-alkyl-2-propyl group or a 2-aryl-2-propyl group, more preferably a 2-alkyl-2-propyl group, and most preferably a tert-butyl group.

In formula (4-1), $R_{103}$ and $R_{104}$ each independently represents a substituent (preferred examples of the substituent are the same as those of the substituent described for $R_{24}$), more preferably an alkyl group, an alkenyl group, a cycloalkyl group, an aryl group or a heterocyclic group, still more preferably an alkyl group or an aryl group, and most preferably an alkyl group.

In formulae (4-1) to (4-6), $R_{105}$, $R_{106}$, $R_{107}$, $R_{110}$, $R_{113}$ and $R_{116}$ each independently represents a hydrogen atom or a substituent (preferred examples of the substituent are the same as those of the substituent described for $R_{24}$), more preferably a hydrogen atom, an alkyl group, an alkenyl group, a cycloalkyl group, an aryl group or a heterocyclic group, still more preferably a hydrogen atom, an alkyl group or an aryl group.

It is more preferred that $R_{105}$, $R_{106}$ and $R_{116}$ all are a hydrogen atom. $R_{107}$, $R_{110}$ and $R_{113}$ are more preferably an alkyl group.

In formula (4-2), $R_{108}$ and $R_{109}$ each independently represents an alkyl group, preferably a methyl group or an ethyl group. Also, $R_{108}$ and $R_{109}$ may combine with each other to form a ring and the ring formed is preferably a dioxal ring or a dioxane ring.

In formula (4-3), $R_{111}$ and $R_{112}$ represent alkyl groups which combine with each other to form a ring. The ring formed is preferably a saturated cycloalkane ring.

In formula (4-4), $R_{114}$ represents a hydrogen atom or a nitro group, preferably a nitro group, $R_{115}$ represents a substituent, and n101 represents an integer of 0 to 3, preferably 0 or 1, more preferably 0.

In formula (4-6), $R_{117}$ represents a substituent (preferred examples of the substituent are the same as those of the substituent described for $R_{24}$), more preferably an alkyl group, an alkenyl group, a cycloalkyl group, an aryl group or a heterocyclic group, still more preferably an alkyl group or an aryl group, and most preferably an alkyl group.

The acid-increasing agent for use in the present invention is preferably represented by formula (4-1), (4-3) or (4-4), and most preferably represented by formula (4-1).

Specific examples of the acid-increasing agent for use in the present invention are set forth below, but the present invention is not limited thereto.

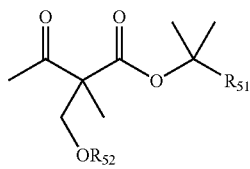

| | $R_{51}$ | $R_{52}$ |
|---|---|---|
| AA-1 | —CH$_3$ | 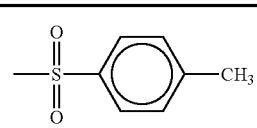 |

-continued
| | | |
|---|---|---|
| AA-2 | 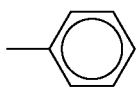 | " |
| AA-3 | —CH₃ | 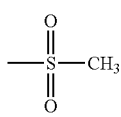 |
| AA-4 | 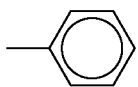 | " |
| AA-5 | —CH₃ | 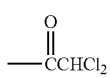 |
| AA-6 | 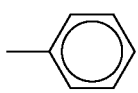 | 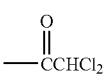 |
| AA-7 | —CH₃ | 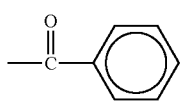 |
| AA-8 | —CH₃ |  |
| AA-9 | —CH₃ | —SO₂CF₃ |
| AA-10 | —CH₃ | —SO₂C₄F₉ |
AA-11
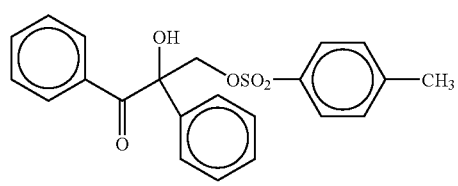
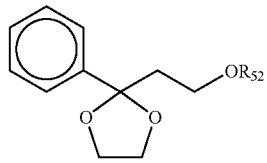
| R₅₂ | | R₅₂ | |
|---|---|---|---|
| AA-12 | 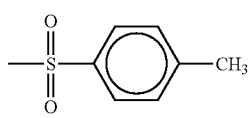 | AA-15 | 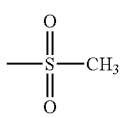 |
| AA-13 | 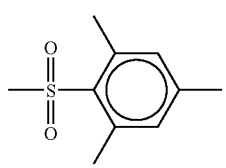 | AA-16 | 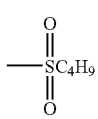 |

-continued
| | | | |
|---|---|---|---|
| AA-14 | 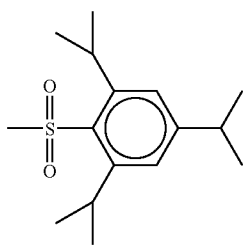 | AA-17 |  |
| AA-18 | 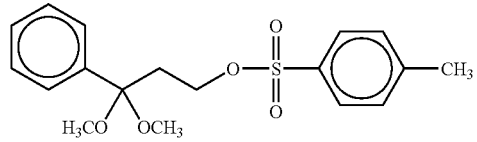 | | |
| AA-19 | 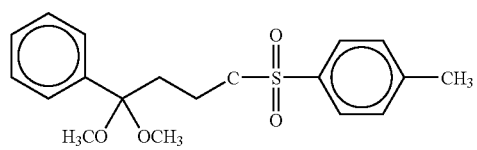 | | |
| AA-20 | 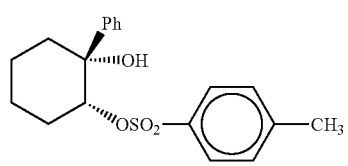 | | |
| AA-21 | 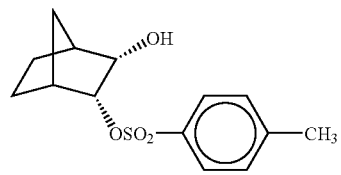 | | |
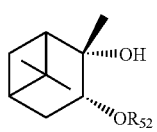
| | $R_{52}$ |
|---|---|
| AA-22 | 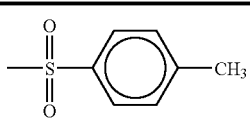 |
| AA-23 | 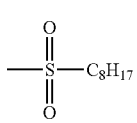 |
| AA-24 | 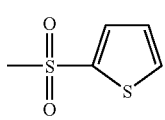 |
| AA-25 | 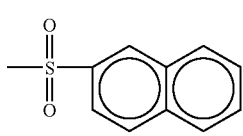 |

-continued
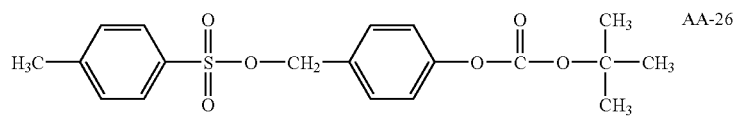 AA-26
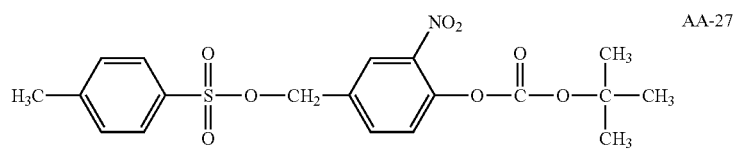 AA-27
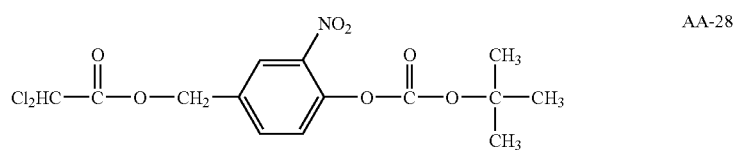 AA-28
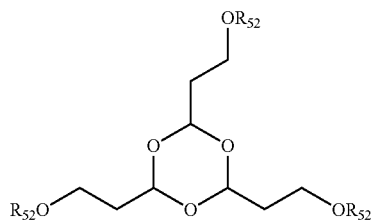
R$_{52}$
| AA-29 | 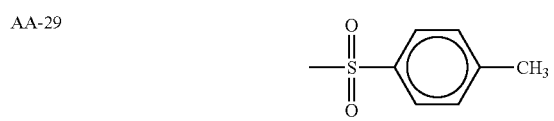 |
| --- | --- |
| AA-30 |  |
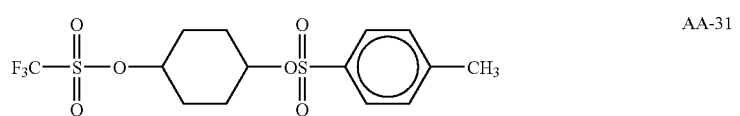 AA-31
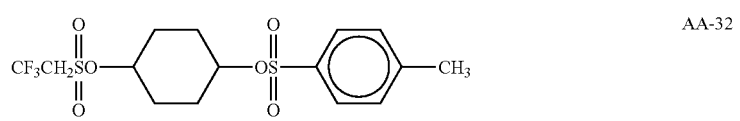 AA-32

-continued

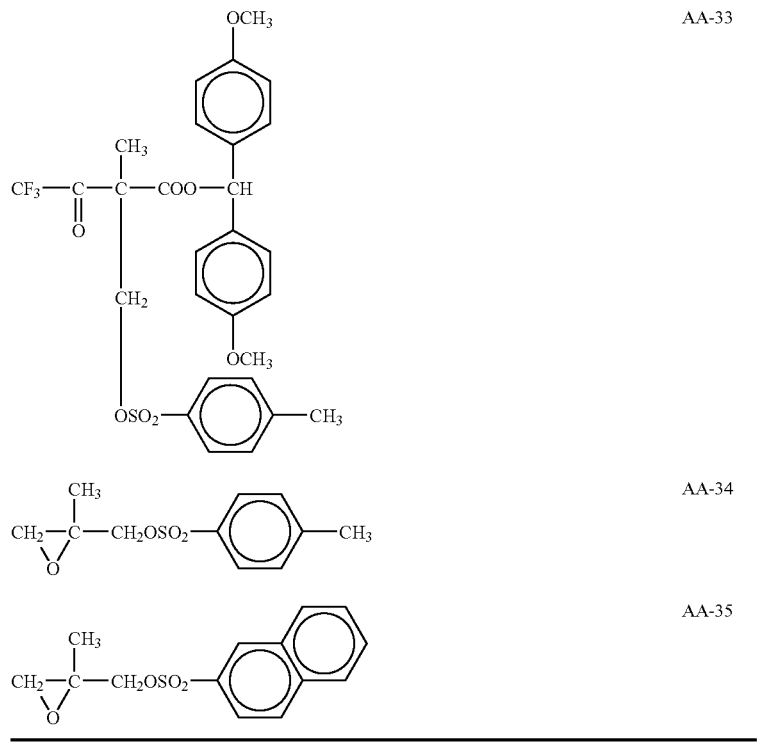

The acid-increasing agent is preferably heated and therefore, a heat treatment is preferably performed after holographic exposure.

The case where the dye precursor used in the hologram recording material of the present invention contains at least a base-induced color forming dye precursor as the dye precursor and further contains a base generator is described below.

The base generator is a compound capable of generating a base as a result of energy or electron transfer from the excited state of the sensitizing dye or the colored material. The base generator is preferably stable in a dark place. The base generator for use in the present invention is preferably a compound capable of generating a base as a result of electron transfer from the excited state of the sensitizing dye or the colored material.

The base generator for use in the present invention preferably generates a Broensted base by light, more preferably generates an organic base, still more preferably generates an amine as the organic base.

Preferred examples of the base generator in the dye precursor for use in the present invention are the same as those of the above-described base generator for the anionic polymerization initiator.

In the case of using anionic polymerization and a base-induced color forming dye precursor at the same time, it is preferred that the same compound functions as the anionic polymerization initiator and as the base generator.

If desired, these base generators may be used as a mixture of two or more thereof at an arbitrary ratio.

The base-induced color forming dye precursor in the case where the dye precursor used in the hologram recording material of the present invention contains at least a base-induced color forming dye precursor as the dye precursor and further contains a base generator, is described below.

The base-induced color forming dye precursor for use in the present invention is a dye precursor which can become a colored material having an absorption form changed from the original state (the dye precusor), under the action of a base generated from the base generator.

The base-induced color forming dye precursor for use in the present invention is preferably a compound of which absorption is shifted to the longer wavelength side under the action of a base, more preferably a compound which is colorless but is color-formed under the action of a base.

The base-induced color forming dye precursor for use in the present invention is preferably a non-dissociated form of a dissociation-type dye. The dissociation-type dye is a compound in which a dissociative group having a pKa of 12 or less, preferably 10 or less, and capable of readily dissociating to release a proton is present on the dye chromophore and when changed from the non-dissociated form to the dissociated form, absorption is shifted to the longer wavelength side or the colorless state turns to the color-formed state. Preferred examples of the dissociative group include an OH group, an SH group, a COOH group, a $PO_3H_2$ group, an $SO_3H$ group, an $NR_{91}R_{92}H^+$ group, an $NHSO_2R_{93}$ group, a $CHR_{94}R_{95}$ group and an $NHR_{96}$ group.

$R_{91}$, $R_{92}$ and $R_{96}$ each independently represents a hydrogen atom, an alkyl group, an alkenyl group, a cycloalkyl group, an aryl group or a heterocyclic group (preferred examples of these groups are the same as those for $R_3$), preferably a hydrogen atom or an alkyl group. $R_{93}$ represents an alkyl group, an alkenyl group, a cycloalkyl group, an aryl group or a heterocyclic group (preferred examples of these groups are the same as those for $R_3$), preferably an alkyl group which may be substituted, or an aryl group which may be substituted, more preferably an alkyl group which may be substituted, and the substituent here preferably has electron-withdrawing property and is preferably fluorine.

$R_{94}$ and $R_{95}$ each independently represents a substituent (preferred examples of the substituent are the same as those of the substituent described for $R_3$), but an electron-withdrawing substituent is preferred and this is preferably a cyano group, an alkoxycarbonyl group, a carbamoyl group, an acyl group, an alkylsulfonyl group or an arylsulfonyl group.

The dissociative group in the dissociation-type dye for use in the present invention is preferably an OH group, a COOH group, an $NHSO_2R_{93}$ group, an $NHR_{96}$ group or a $CHR_{94}R_{95}$ group, more preferably an OH group or a $CHR_{94}R_{95}$ group, and most preferably an OH group.

The non-dissociated form of a dissociation-type dye, which is preferred as the base-induced color forming dye precursor for use in the present invention, is a non-dissociated form of a dissociation-type azo dye, a dissociation-type azomethine dye, a dissociation-type oxonol dye, a dissociation-type arylidene dye, a dissociation-type xanthene dye, a dissociation-type fluoran dye or a dissociation-type triphenylamine dye, more preferably a non-dissociated form of a dissociation-type azo dye, a dissociation-type azomethine dye, a dissociation-type oxonol dye or a dissociation-type arylidene dye.

As examples of the base-induced color forming dye precursor for use in the present invention, examples of the non-dissociated form of a dissociation-type dye are set forth below, but the present invention is not limited thereto.

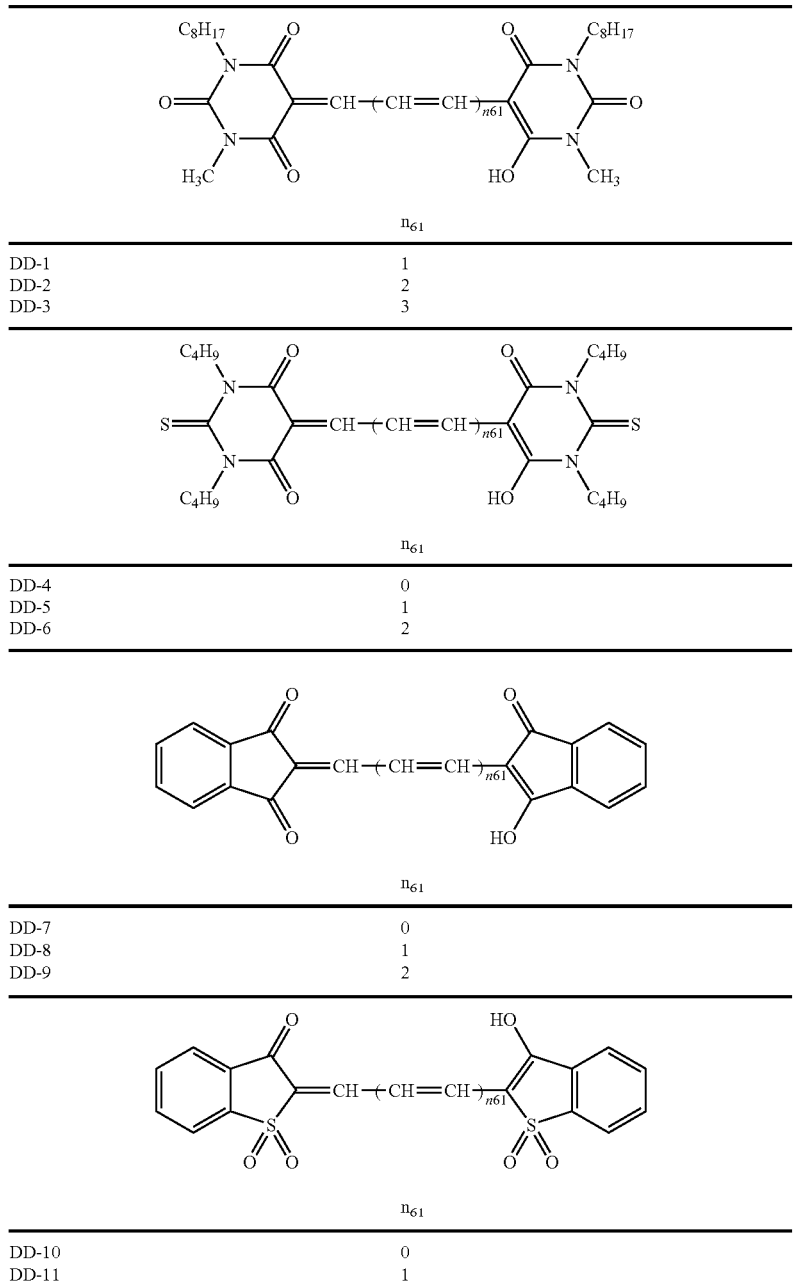

-continued
| | |
|---|---|
| DD-12 | 2 |
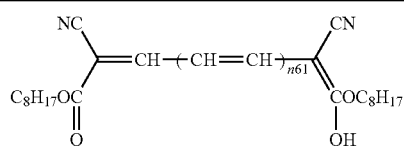
| | $n_{61}$ |
|---|---|
| DD-13 | 0 |
| DD-14 | 1 |
| DD-15 | 2 |
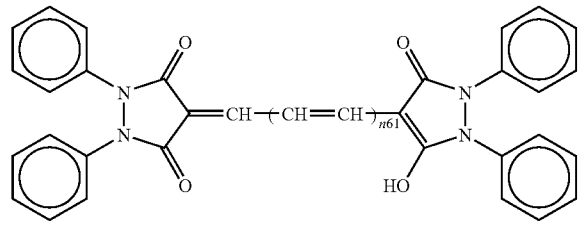
| | $n_{61}$ |
|---|---|
| DD-16 | 0 |
| DD-17 | 2 |
| DD-18 | 3 |
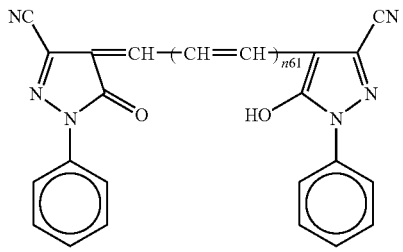
| | $n_{61}$ |
|---|---|
| DD-19 | 1 |
| DD-20 | 2 |
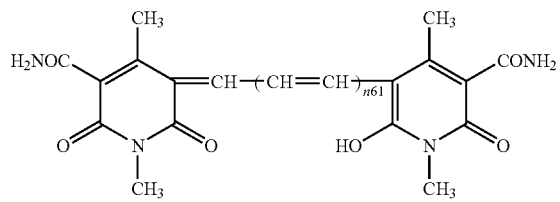
| | $n_{61}$ |
|---|---|
| DD-21 | 1 |
| DD-22 | 2 |
DD-23
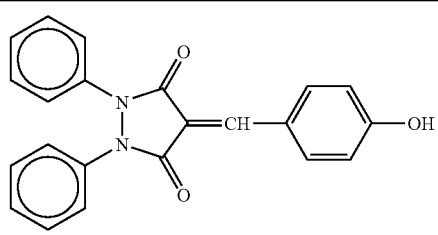

-continued
DD-24
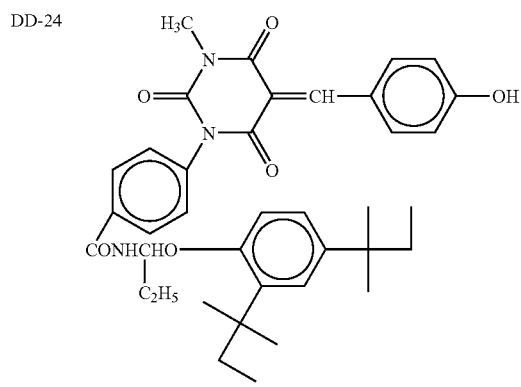
DD-25
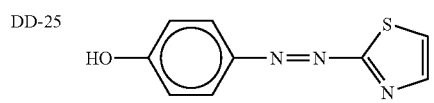
DD-26
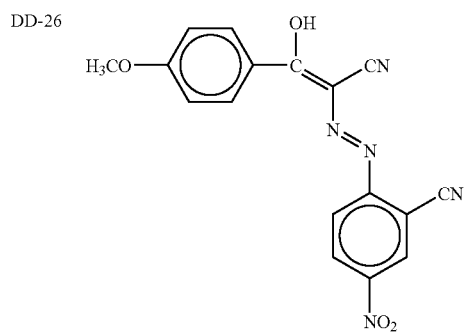
DD-27
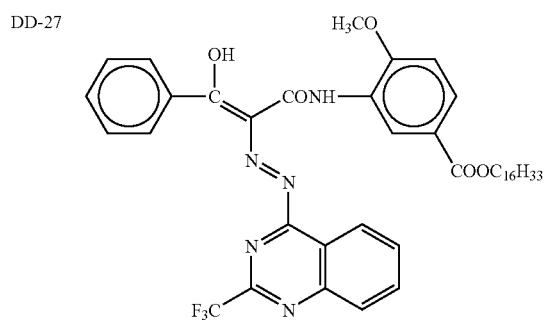
DD-28
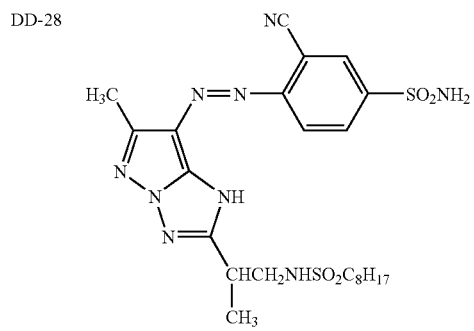

-continued
DD-29
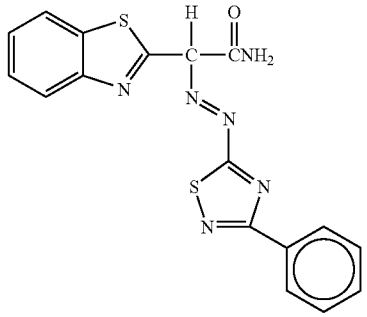
DD-30
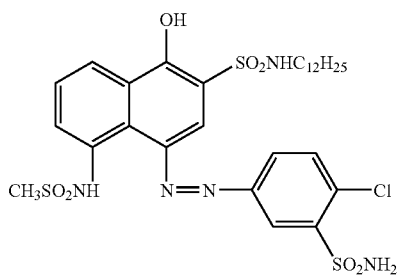
DD-31
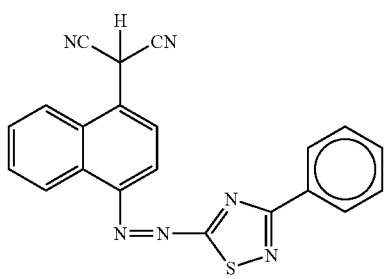
DD-32
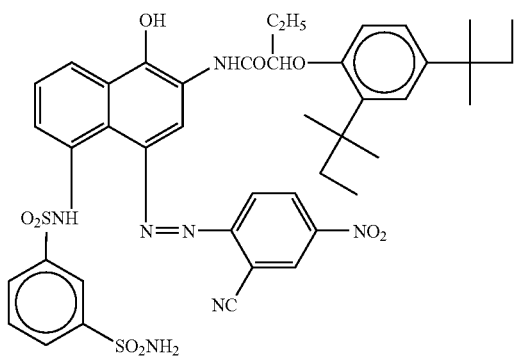
DD-33
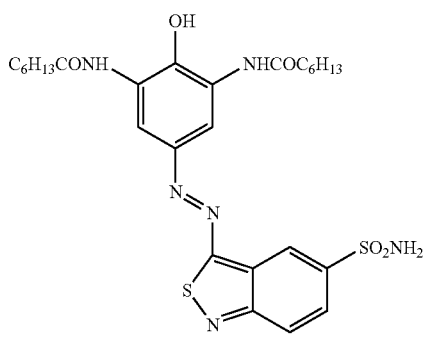

-continued
DD-34
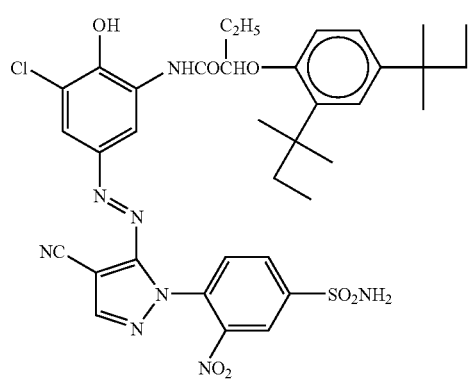
DD-35
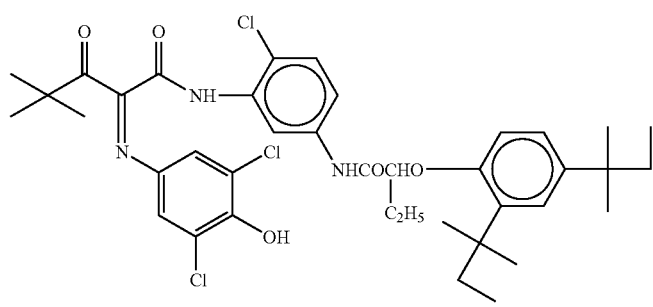
DD-36
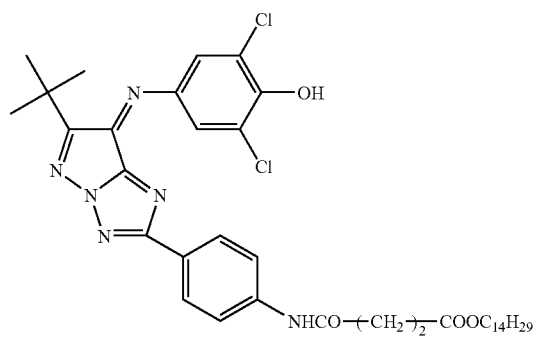
DD-37
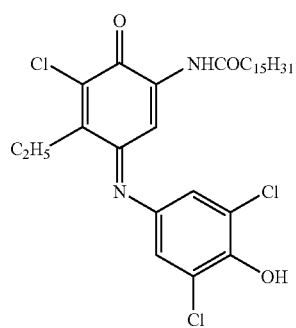

-continued
DD-38
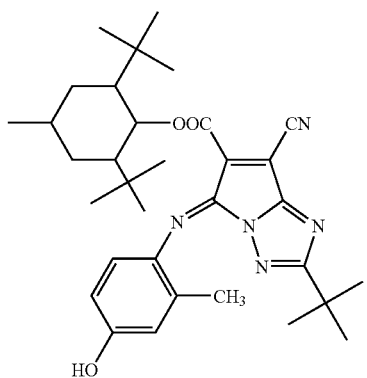
DD-39
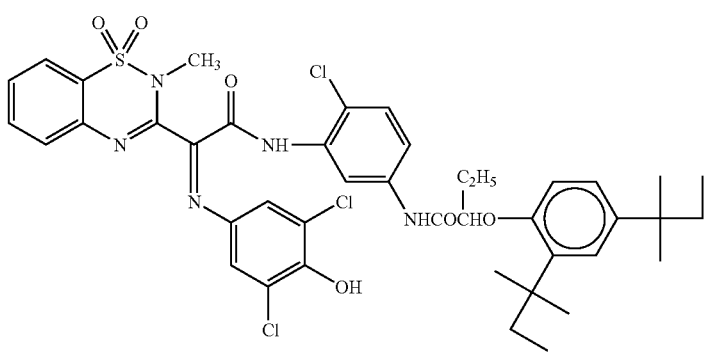
DD-40
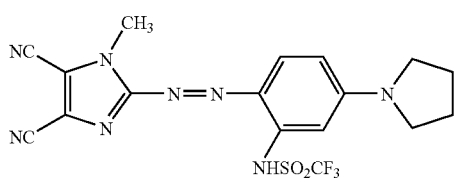
DD-41
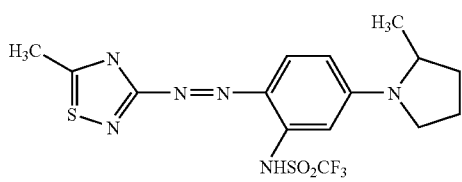
DD-42
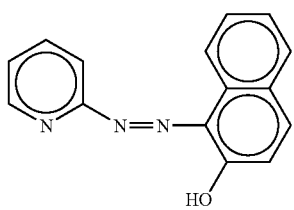
DD-43
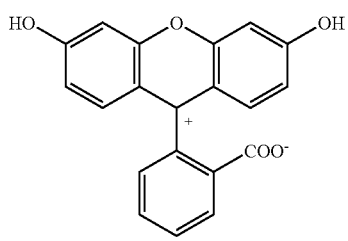

-continued

DD-44
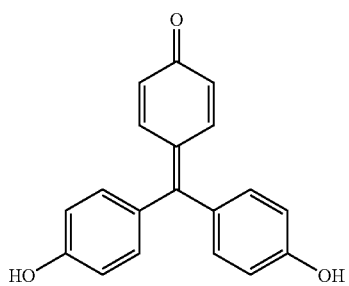

DD-45
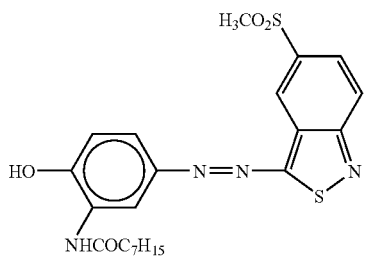

DD-46
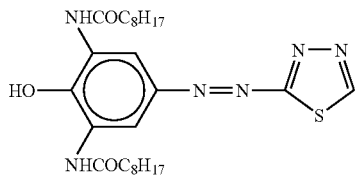

DD-47
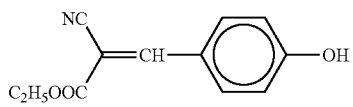

DD-48
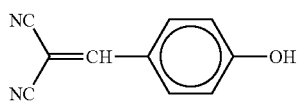

DD-49
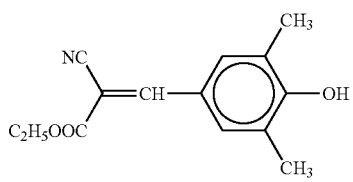

When the dye precursor for use in the present invention contains at least a base-induced color forming dye precursor as the dye precursor and a base generator, the dye precursor may further contain a base-increasing agent.

The base-increasing agent for use in the present invention is a compound of increasing a base by using, as a trigger, a small amount of base generated from the base generator and this compound is stable in the absence of a base but when a base is present, decomposes to release a base which triggers decomposition of another base-increasing agent to also release a base.

The base-increasing agent is preferably represented by formula (5).

In formula (5), $R_{121}$ and $R_{122}$ each independently represents a hydrogen atom, an alkyl group, an alkenyl group, a cycloalkyl group, an aryl group or a heterocyclic group (preferred examples of these substituents are the same as those of the substituent described for $R_1$), preferably a hydrogen atom, an alkyl group or a cycloalkyl group, more preferably a hydrogen atom, a methyl group, an ethyl group, a cyclohexyl group or a cyclopentyl group.

$R_{121}$ and $R_{122}$ may combine with each other to form a ring and the heterocyclic ring formed is preferably a piperidine ring, a pyrrolidine ring, a piperazine ring, a morpholine ring, a pyridine ring, a quinoline ring or an imidazole ring, more preferably a piperidine ring, a pyrrolidine ring or an imidazole ring, and most preferably a piperidine ring.

Examples of the preferred combination of $R_{121}$ and $R_{122}$ include a combination where $R_{121}$ is a cyclohexyl group which may be substituted, and $R_{122}$ is a hydrogen atom, a combination where $R_{121}$ is an alkyl group which may be, substituted, and $R_{122}$ is a hydrogen atom, and a combination where $R_{121}$ and $R_{122}$ are combined to form a piperidine ring or an imidazole ring.

$R_{123}$ and $R_{124}$ each independently represents a hydrogen atom or a substituent (preferred examples of the substituent are the same as those of the substituent described for $R_3$), preferably a hydrogen atom, an aryl group or an arylsulfonyl group, more preferably an aryl group.

$R_{123}$ and $R_{124}$ may combine with each other to form a ring and the ring formed is preferably a fluorene ring.

$R_{125}$ and $R_{126}$ each independently represents a hydrogen atom or a substituent (preferred examples of the substituent are the same as those of the substituent described for $R_3$), preferably a hydrogen atom or an alkyl group, more preferably a hydrogen atom or a methyl group.

n102 represents an integer of 0 or 1, preferably 1.

The base-increasing agent for use in the present invention is more preferably represented by formula (6-1) or (6-2).

In formulae (6-1) and (6-2), $R_{121}$ and $R_{122}$ have the same meanings as in formula (5).

The base-increasing agent for use in the present invention is still more preferably a compound represented by formula (6-1).

Specific examples of the base-increasing agent for use in the present invention are set forth below, but the present invention is not limited thereto.

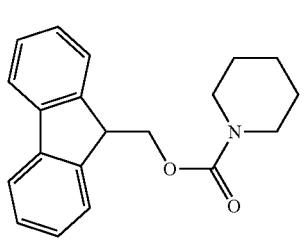

BA-1

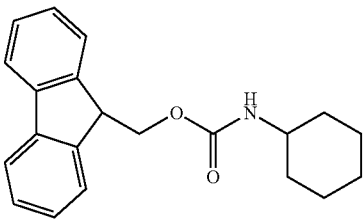

BA-2

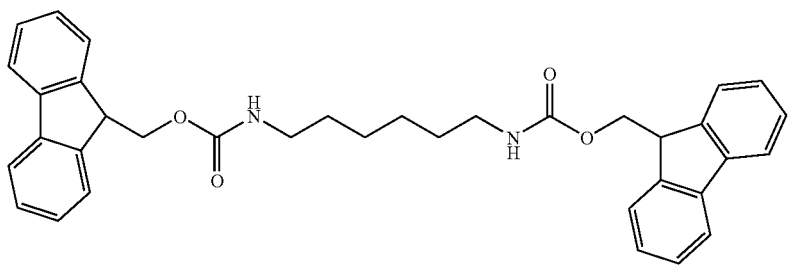

BA-3

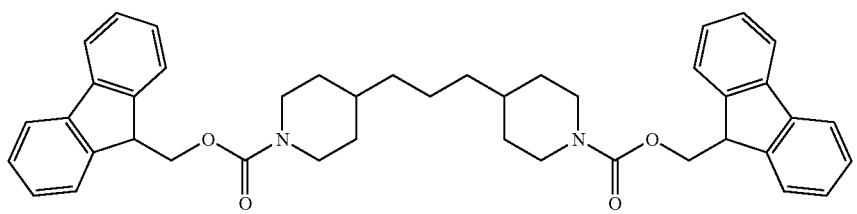

BA-4

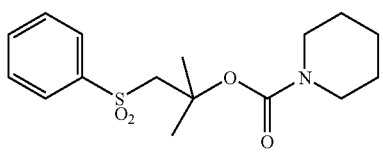

BA-5

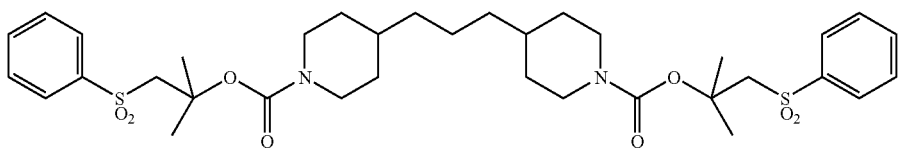

BA-6

The base-increasing agent is preferably heated and therefore, when a base-increasing agent is used in the hologram recording material of the present invention, a heat treatment is preferably performed after holographic exposure.

The case where the dye precursor for use in the present invention is a compound in which an organic compound moiety having a function of cutting the covalent bond due to electron or energy transfer with the excited state of the sensitizing dye or the colored material is covalently bonded with an organic compound moiety of forming a colored material when covalently bonded and when released, is described below.

In this case, the dye precursor group for use in the present invention preferably contains at least a dye precursor represented by formula (2).

In formula (2), A1 and PD are covalently bonded, A1 represents an organic compound moiety having a function of cutting the covalent bond with PD due to electron or energy transfer with the excited state of the sensitizing dye or the colored material, and PD represents an organic compound moiety of forming a colored material when covalently bonded with A1 and when released as a result of cutting of the covalent bond with A1.

A1 is preferably an organic compound moiety having a function of cutting the covalent bond with PD due to electron transfer with the excited state of the sensitizing dye or the colored material.

PD is preferably a group comprising either a dissociation-type dye such as dissociation-type azo dye, dissociation-type azomethine dye, dissociation-type oxonol dye and dissociation-type arylidene dye, or a dye capable of forming a so-called "leuco dye", such as triphenylmethane dye and xanthene (fluorane) dye, and this is connected to A1 through a covalent bond on the chromophore.

PD is more preferably a dissociation-type azo dye, a dissociation-type azomethine dye, a dissociation-type oxonol dye or a dissociation-type arylidene dye.

PD is preferably colorless or pale-colored or showing absorption in the short wavelength region when covalently bonded with A1, but when released as a result of cutting of the covalent bond, strongly colored or showing absorption shifted to the longer wavelength side.

Specific preferred examples of PD are set forth below, but the present invention is not limited thereto.

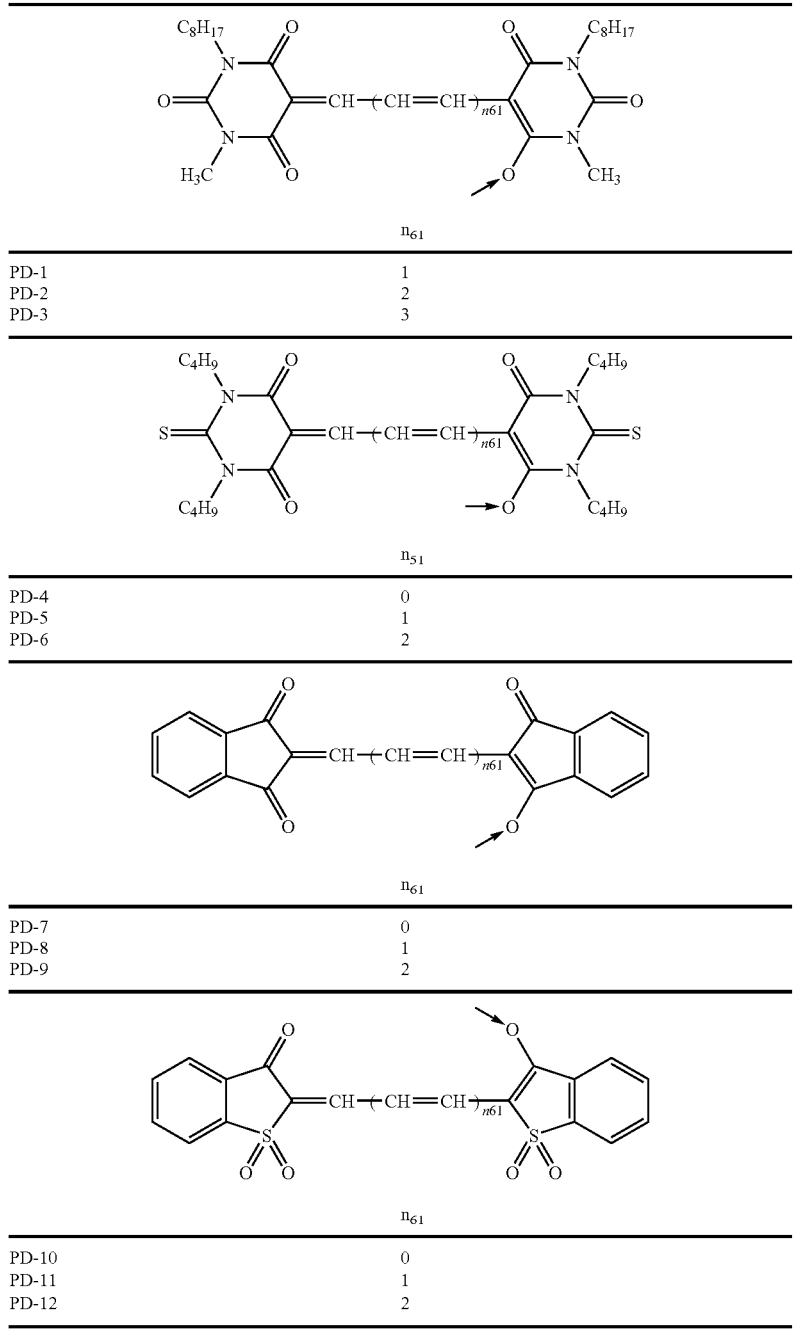

-continued
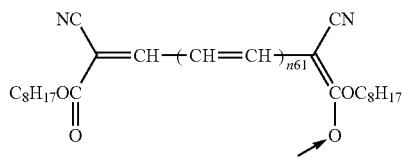
| | $n_{61}$ |
|---|---|
| PD-13 | 0 |
| PD-14 | 1 |
| PD-15 | 2 |
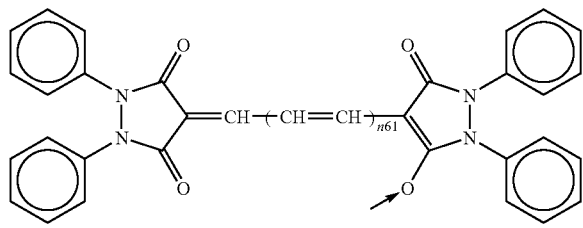
| | $n_{61}$ |
|---|---|
| PD-16 | 0 |
| PD-17 | 2 |
| PD-18 | 3 |
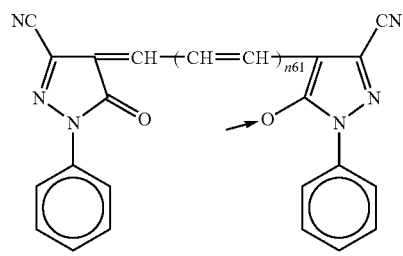
| | $n_{61}$ |
|---|---|
| PD-19 | 1 |
| PD-20 | 2 |
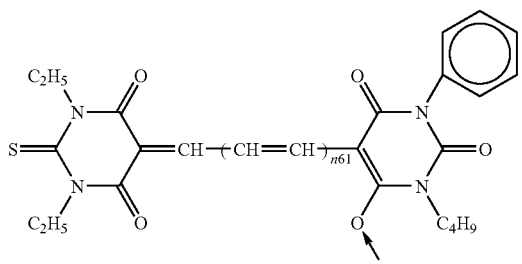
| | $n_{61}$ |
|---|---|
| PD-21 | 0 |
| PD-22 | 1 |
PD-23
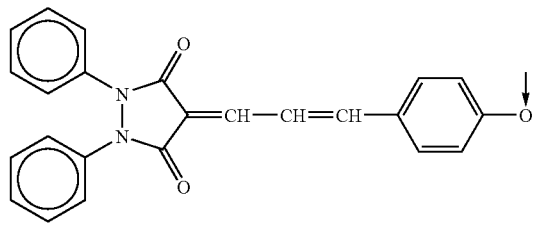

-continued
PD-24
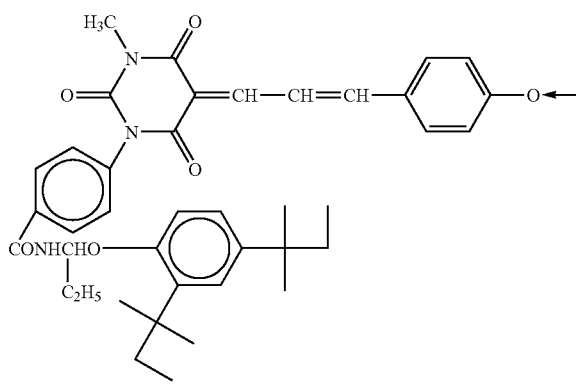
PD-25
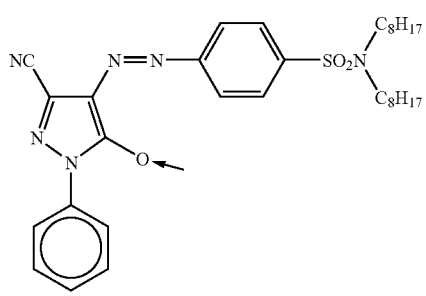
PD-26
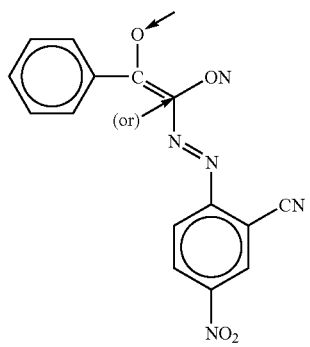
PD-27
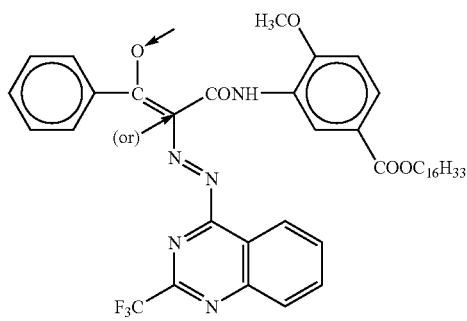

-continued
PD-28 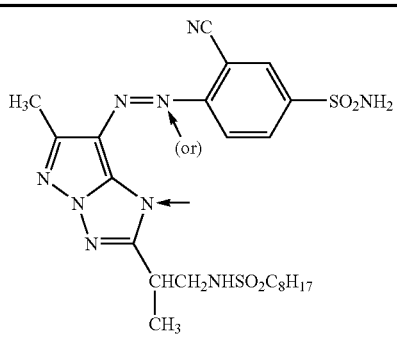
PD-29 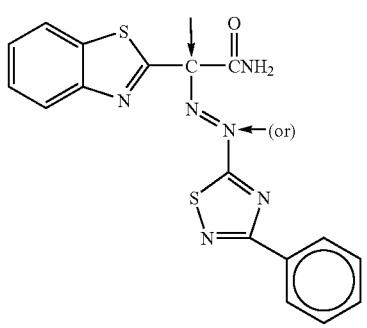
PD-30 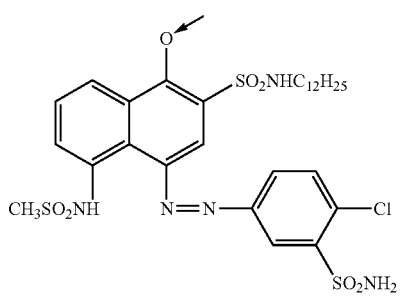
PD-31 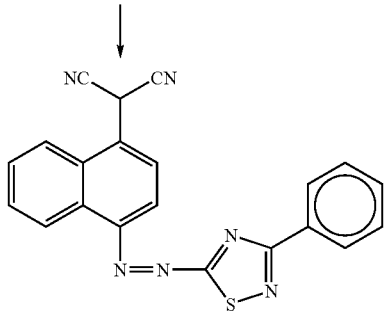
PD-32 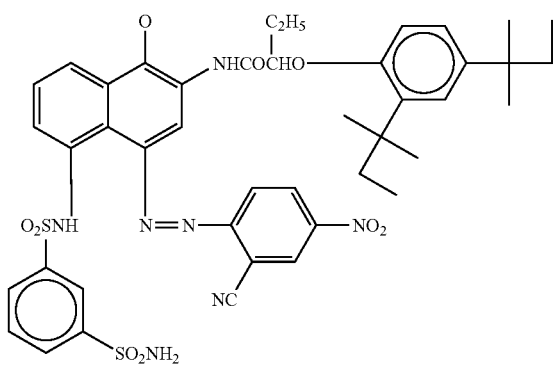

-continued
PD-33
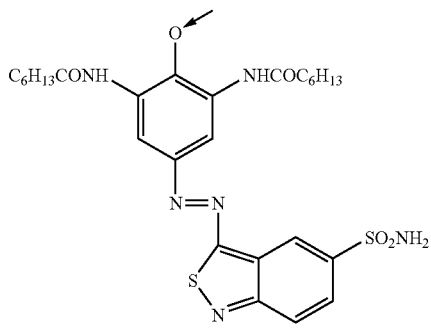
PD-34
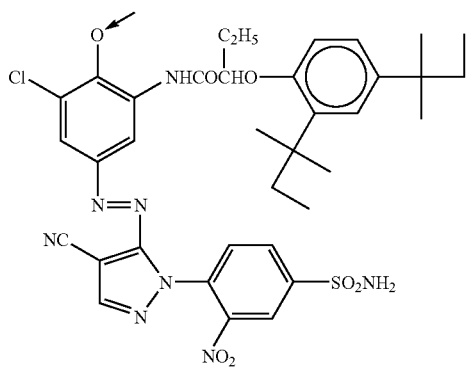
PD-35
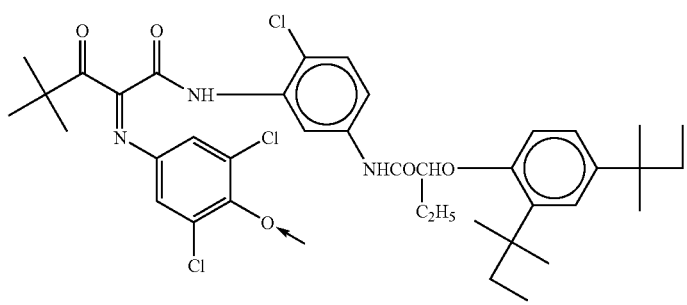
PD-36
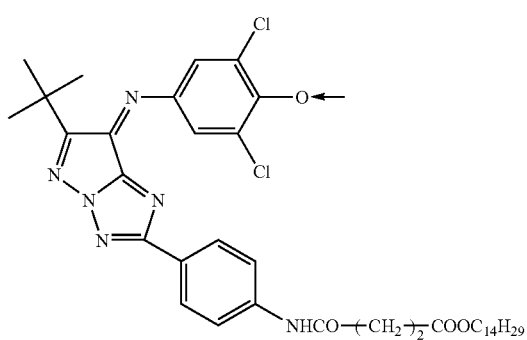

-continued
PD-37 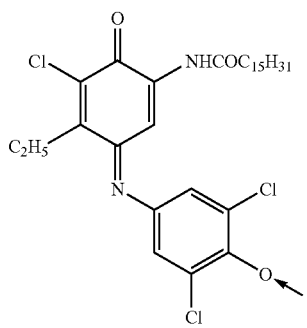
PD-38 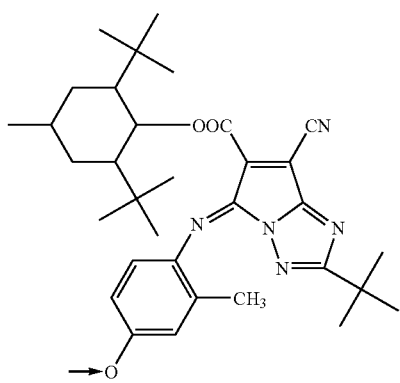
PD-39 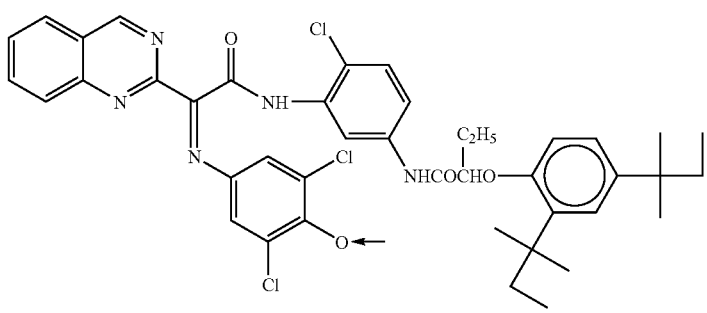
PD-40 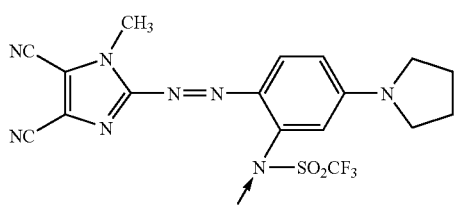
PD-41 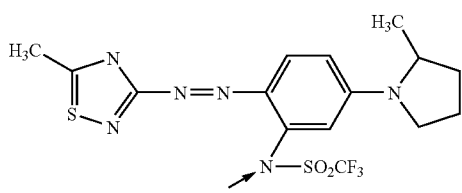
PD-42 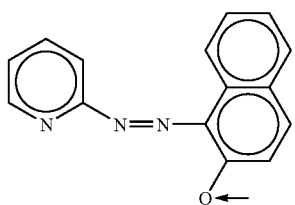

-continued
PD-43
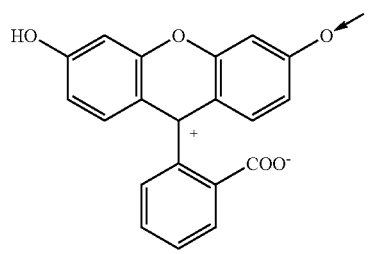
PD-44
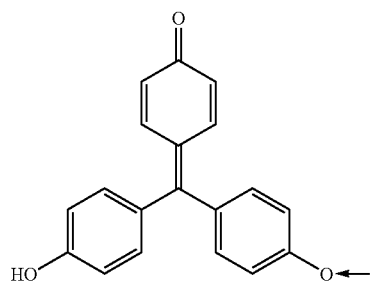
PD-45
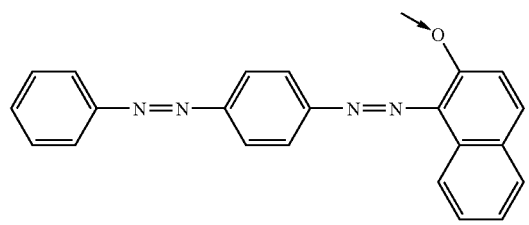
PD-46
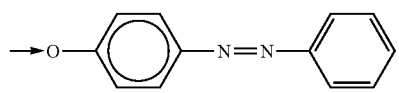
PD-47
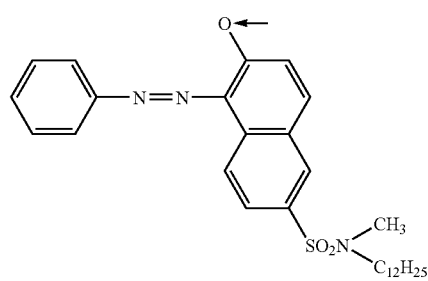
PD-48
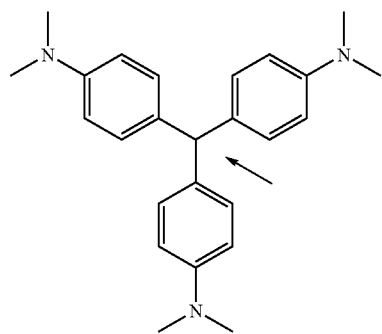

-continued
PD-49 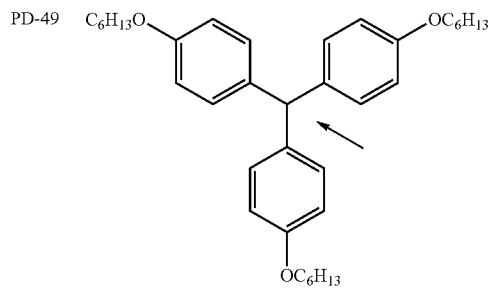
PD-50 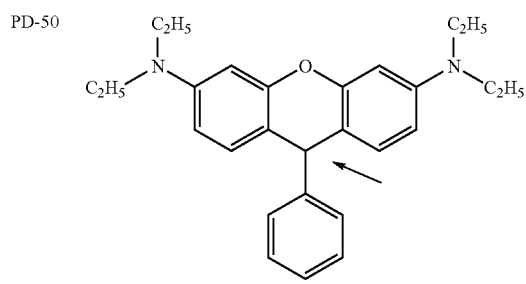
PD-51 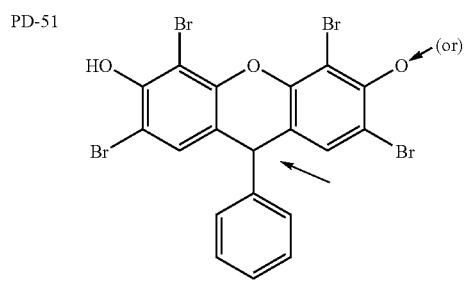
PD-52 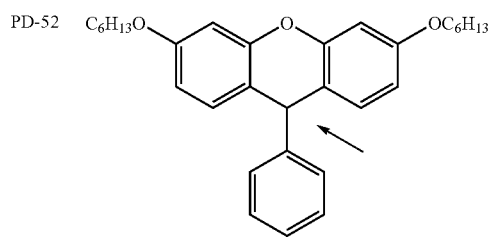
PD-53 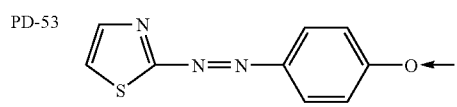
PD-54 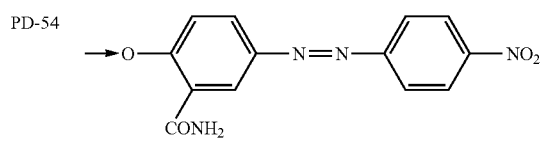
PD-55 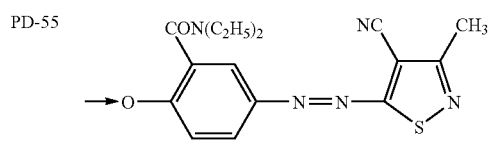

-continued
PD-56 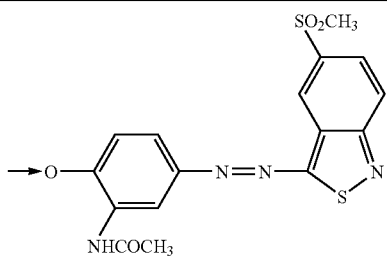
PD-57 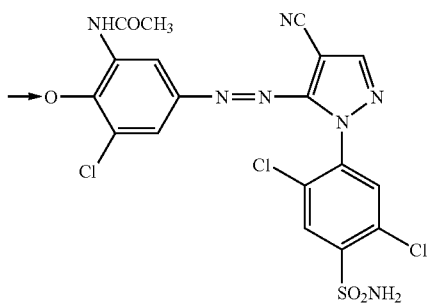
PD-58 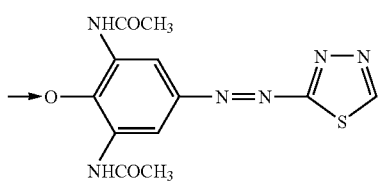
PD-59 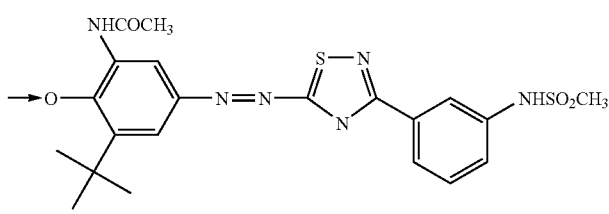
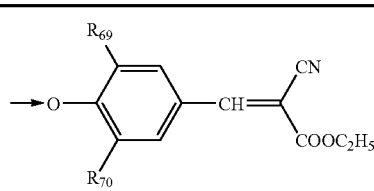
| | $R_{69}$ | $R_{70}$ |
|---|---|---|
| PD-60 | H | H |
| PD-61 | Cl | H |
| PD-62 | Cl | Cl |
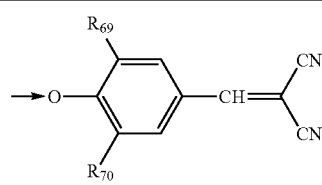
| | $R_{69}$ | $R_{70}$ |
|---|---|---|
| PD-63 | H | H |
| PD-64 | Cl | H |
| PD-65 | Cl | Cl |

As for the covalent bond with A1, PD may be covalently bonded with any portion of A1 as long as it is on the dye chromophore, but is preferably covalently bonded with A1 at the atom shown by an arrow in the examples above.

The dye precursor of formula (2) is preferably a compound represented by any one of formulae (3-1) to (3-6).

In formulae (3-1) to (3-6), PD has the same meaning as in formula (2).

In formula (3-1), $R_{71}$ represents a hydrogen atom or a substituent (preferred examples of the substituent are the same as those of the substituent described for $R_3$), preferably an alkyl group or an aryl group, more preferably a t-butyl group, a methyl group or a phenyl group, and further preferably a methyl group or a t-butyl group.

$R_{72}$ represents a substituent (preferred examples of the substituent are the same as those of the substituent described for $R_3$), preferably an electron-withdrawing group, more preferably a nitro group, a sulfamoyl group, a carbamoyl group, an alkoxycarbonyl group, a cyano group or a halogen atom. Each a71 independently represents an integer of 0 to 5 and when a71 is 2 or more, multiple $R_{72}$s may be the same or different and may combine with each other to form a ring. a71 is preferably 1 or 2 and $R_{72}$ is preferably substituted to the 2- or 4-position.

In formula (3-2), $R_{73}$ represents a substituent (preferred examples of the substituent are the same as those of the substituent described for $R_3$), preferably an electron-withdrawing group, more preferably a nitro group, a sulfamoyl group, a carbamoyl group, an alkoxycarbonyl group, a cyano group or a halogen atom, still more preferably a nitro group. Each a72 independently represents an integer of 0 to 5 and when a72 is 2 or more, multiple $R_{73}$s may be the same or different and may combine with each other to form a ring. a72 is preferably 1 or 2. When a72 is 1, $R_{73}$ is preferably substituted to the 2-position, and when a72 is 2, $R_{73}$ is preferably substituted to the 2-position and 4-position or the 2-position and 6-position, more preferably to the 2-position and 6-position.

a73 represents 0 or 1.

In formula (3-3), $R_{74}$ to $R_{77}$ each independently represents an alkyl group and preferably, all represent a methyl group.

In formula (3-4), $R_{78}$ and $R_{79}$ each independently represents a substituent (preferred examples of the substituent are the same as those of the substituent described for $R_3$), and $R_{79}$ preferably represents an alkoxy group, more preferably a methoxy group. a74 and a75 each independently represents an integer of 0 to 5 and when a74 and a75 each is 2 or more, multiple $R_{78}$s or $R_{79}$s may be the same or different and may combine with each other to form a ring. a74 and a75 each is preferably an integer of 0 to 2, a74 is more preferably 0 or 1 and a73 is more preferably 2. When a75 is 2, $R_{79}$ preferably substituted to the 3-position and 5-position.

a76 represents 0 or 1.

In formula (3-5), $R_{80}$ and $R_{81}$ each independently represents a hydrogen atom or a substituent (preferred examples of the substituent are the same as those of the substituent described for $R_3$), and $R_{80}$ and $R_{81}$ may combine to form a ring. The ring formed is preferably a benzene ring or a norbornene ring. When a ring is not formed, $R_{80}$ and $R_{18}$ are preferably both a hydrogen atom.

In formula (3-6), $R_{82}$ and $R_{83}$ each independently represents a substituent (preferred examples of the substituent are the same as those of the substituent described for $R_3$), preferably an alkyl group, an alkenyl group or an aryl group. $R_{82}$ and $R_{83}$ preferably combine with each other to form a ring and the ring formed is preferably a fluorene ring, a dibenzopyran ring or a tetrahydronaphthalene ring.

The dye precursor represented by formula (2) is more preferably a compound represented by formula (3-1), (3-2) or (3-4).

Preferred examples of the dye precursor represented by formulae (3-1) to (3-6) for use in the present invention are set forth below, but the present invention is not limited thereto.

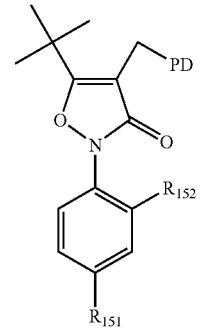

| | $R_{151}$ | $R_{152}$ | PD |
|---|---|---|---|
| E-1 | —CONHC$_2$H$_5$ | —NO$_2$ | PD-1 |
| E-2 | —SO$_2$NHC$_2$H$_5$ | " | PD-7 |
| E-3 | —CONHC$_2$H$_5$ | " | PD-4 |
| E-4 | " | " | PD-23 |
| E-5 | " | " | PD-24 |
| E-6 | —SO$_2$NHC$_2$H$_5$ | " | PD-25 |
| E-7 | —CONHC$_2$H$_5$ | —H | PD-26 |
| E-8 | —OC$_8$H$_{17}$ | —Cl | PD-28 |
| E-9 | —CONHC$_{16}$H$_{33}$ | —CN | PD-36 |
| E-10 | —C$_8$H$_{17}$ | —NO$_2$ | PD-37 |
| E-11 | —SO$_2$N(C$_2$H$_5$)$_2$ | " | PD-33 |
| E-12 | " | " | PD-62 |
| E-13 | " | " | PD-65 |
| E-14 | " | " | PD-32 |
| E-15 | " | " | PD-35 |
| E-16 | " | " | PD-42 |
| E-17 | " | " | PD-54 |
| E-18 | " | " | PD-53 |
| E-19 | " | " | PD-58 |

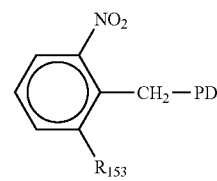

| | $R_{153}$ | PD |
|---|---|---|
| E-20 | H | PD-21 |
| E-21 | " | PD-10 |
| E-22 | —NO$_2$ | PD-4 |
| E-23 | H | PD-16 |
| E-24 | " | PD-24 |
| E-25 | —NO$_2$ | PD-23 |
| E-26 | H | PD-30 |
| E-27 | —NO$_2$ | PD-26 |
| E-28 | " | PD-29 |
| E-29 | " | PD-35 |
| E-30 | H | PD-39 |
| E-31 | " | PD-55 |
| E-32 | —NO$_2$ | PD-53 |
| E-33 | " | PD-65 |
| E-34 | H | PD-57 |

-continued

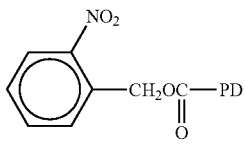

| | PD |
|---|---|
| E-35 | PD-4 |
| E-36 | PD-29 |
| E-37 | PD-35 |
| E-38 | PD-23 |
| E-39 | PD-53 |
| E-40 | PD-44 |

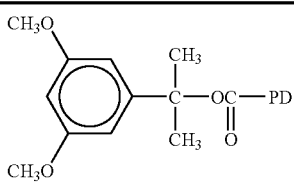

| | PD |
|---|---|
| E-41 | PD-16 |
| E-42 | PD-23 |
| E-43 | PD-31 |
| E-44 | PD-61 |
| E-45 | PD-42 |

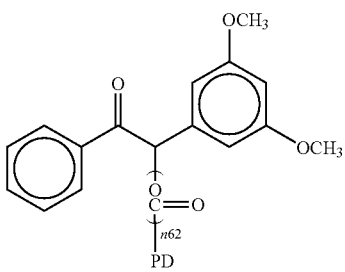

| | PD | $n_{62}$ |
|---|---|---|
| E-46 | PD-60 | 0 |
| E-47 | PD-30 | 0 |
| E-48 | PD-35 | 0 |
| E-49 | PD-52 | 1 |

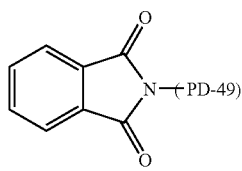

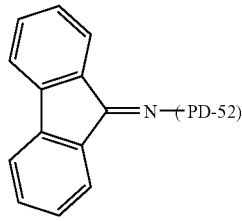

When the dye precursor for use in the present invention is at least a dye precursor represented by formula (2), (3-1), (3-2), (3-3), (3-4), (3-5) or (3-6), if desired, the hologram recording material of the present invention preferably further contains a base for the purpose of dissociating the produced dissociation-type dye. The base may be either an organic base or an inorganic base and preferred examples thereof include alkylamines, anilines, imidazoles, pyridines, carbonates, hydroxide salts, carboxylates and metal alkoxide. Also, polymers containing such a base are preferably used.

The case where the dye precursor for use in the present invention is a compound capable of undergoing a reaction due to electron transfer with the excited state of the sensitizing dye or the colored material and changing the absorption form is described below.

The compounds capable of causing such a change are generically named a so-called "electrochromic compound".

Preferred examples of the electrochromic compound for use as the dye precursor in the present invention include polypyrroles (preferably, for example, polypyrrole, poly(N-methylpyrrole), poly(N-methylindole) and polypyrrolo-pyrrole), polythiophenes (preferably, for example, polythiophene, poly(3-hexylthiophene), polyisothianaphthene, polydithienothiophene, poly(3,4-ethylenedioxy)thiophene), polyanilines (preferably, for example, polyaniline, poly(N-naphthylaniline), poly(o-phenylenediamine), poly(aniline-m-sulfonic acid), poly(2-methoxyaniline), poly(o-aminophenol) and poly(diallylamine)), poly(N-vinylcarbazole), Co pyridinoporphyrazine complex, Ni phenanthroline complex and Fe basophenanthroline complex.

In addition, electrochromic materials such as viologens, polyviologens, lanthanoid diphthalocyanines, styryl dyes, TNFs, TCNQ/TTF complexes, Ru trisbipyridyl complexes are also preferred.

When the dye precursor is a compound capable of undergoing a reaction due to electron transfer with the excited state of the sensitizing dye or the colored material and changing the absorption form, the dye precursor for use in the present invention is preferably at least a dye precursor represented by formula (7).

In formula (7), $R_{131}$ represents a hydrogen atom, an alkyl group, an alkenyl group, a cycloalkyl group, an aryl group or a heterocyclic group (preferred examples of these substituents are the same as those described for $R_{24}$), preferably an alkyl group.

$X_{131}$ represents —O—, —S—, —NR$_{135}$— or —CR$_{136}$R$_{137}$—, $R_{135}$ represents a hydrogen atom, an alkyl group, an alkenyl group, a cycloalkyl group, an aryl group or a heterocyclic group (preferred examples of these substituents are the same as those described for $R_{24}$), preferably an alkyl group. $R_{136}$ and $R_{137}$ each independently represents an alkyl group, an alkenyl group or an aryl group (preferred examples of these substituents are the same as those described for $R_{24}$), preferably an alkyl group, more preferably both represent a methyl group. $X_{131}$ preferably represents —CR$_{136}$R$_{137}$—.

$R_{132}$ and $R_{133}$ each independently represents a hydrogen atom or a substituent (preferred examples of the substituent are the same as those described for $R_{24}$), preferably a hydrogen atom.

$R_{134}$ represents a substituent (preferred examples of the substituent are the same as those described for $R_{24}$), preferably an alkyl group, an aryl group, a halogen atom, an alkoxy group, a sulfo group, a carboxyl group, an alkoxycarbonyl group, a carbamoyl group or a cyano group.

n131 represents an integer of 0 to 4, preferably 0 or 1.

Preferred examples of the dye precursor represented by formula (7) for use in the present invention are set forth below, but the present invention is not limited thereto.

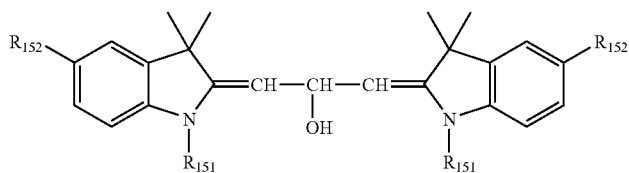
|       | $R_{151}$          | $R_{152}$ |
|-------|--------------------|-----------|
| ES-1  | —CH$_3$            | —H        |
| ES-2  | —C$_8$H$_{17}$     | —H        |
| ES-3  | —C$_4$H$_9$        | —Cl       |
| ES-4  | —C$_2$H$_5$        | —CONH$_2$ |
| ES-5  | —(CH$_2$)$_3$—SO$_3$Na | —COOH |
| ES-6  | —CH$_2$COOH        | —CH$_3$   |
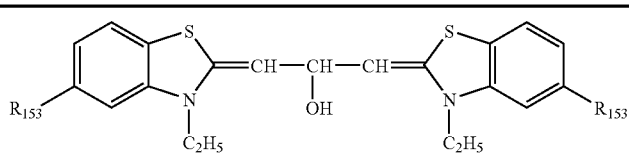
|       | $R_{153}$ |
|-------|-----------|
| ES-7  | —Ph       |
| ES-8  | —Cl       |
| ES-9  | —CH$_3$   |
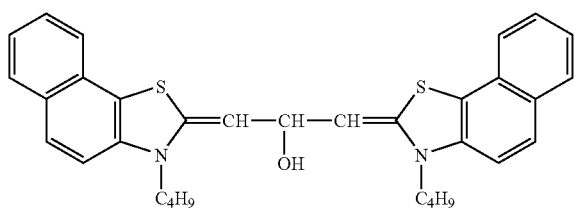
ES-10
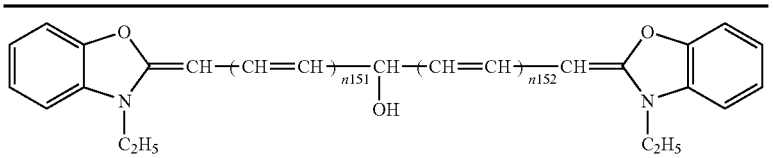
|       | $n_{151}$ | $R_{152}$ |
|-------|-----------|-----------|
| ES-11 | 0         | 0         |
| ES-12 | 1         | 0         |
| ES-13 | 1         | 1         |
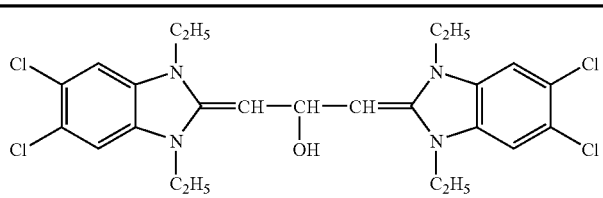
ES-14

The dye precursor for use in the present invention may be a commercially available product or may be synthesized by a known method.

In the hologram recording material of the present invention, an electron-donating compound having an ability of reducing the radical cation of the sensitizing dye or the colored material, or an electron-accepting compound having an ability of oxidizing the radical anion of the sensitizing dye or the colored material can be preferably used.

Preferred examples of the electron-donating compound include alkylamines (preferably, for example, triethylamine, tributylamine, trioctylamine, N,N-dimethyldodecylamine, triethanolamine and triethoxyethylamine), anilines (preferably, for example, N,N-dioctylaniline, N,N-dimethylaniline, 4-methoxy-N,N-dibutylaniline and 2-methoxy-N,N-dibutylaniline), phenylenediamines (preferably, for example, N,N, N',N'-tetramethyl-1,4-phenylenediamine, N,N,N',N'-tetramethyl-1,2-phenylenediamine, N,N,N',N'-tetraethyl-1,3-phenylenediamine, N,N'-dibutylphenylenediamine), triphenylamines (preferably, for example, triphenylamine, tri (4-methoxyphenyl)amine, tri(4-dimethylaminophenyl) amine and TPD), carbazoles (preferably, for example, N-vinylcarbazole and N-ethylcarbazole), phenothiazines (preferably, for example, N-methylphenothiazine and N-phenylphenothiazine), phenoxazines (preferably, for example, N-methylphenoxazine and N-phenylphenoxazine), phenazines (preferably, for example, N,N'-dimethylphenazine and N,N'-diphenylphenazine), hydroquinones (preferably, for example, hydroquinone, 2,5-dimethylhydroquinone, 2,5-dichlorohydroquinone, 2,3,4,5-tetrachlorohydroquinone, 2,6-dichloro-3,5-dicyanohydroquinone, 2,3-dichloro-5,6-dicyanohydroquinone, 1,4-dihydroxynaphthalene and 9,10-dihydroxyanthracene), catechols (preferably, for example, catechol and 1,2,4-trihydroxybenzene), alkoxybenzenes (preferably, for example, 1,2-dimethoxybenzene, 1,2-dibutoxybenzene, 1,2,4-tributoxybenzene and 1,4-dihexyloxybenzene), aminophenols (preferably, for example, 4-(N,N-diethylamino)phenol and N-octylaminophenol), imidazoles (preferably, for example, imidazole, N-methylimidazole, N-octylimidazole and N-butyl-2-methylimidazole), pyridines (preferably, for example, pyridine, picoline, lutidine, 4-tert-butylpyridine, 4-octyloxypyridine, 4-(N,N-dimethylamino)pyridine, 4-(N,N-dibutylamino)pyridine and 2-(N-octylamino)pyridine), metallocenes (preferably, for example, ferrocene, titanocene and ruthenocene), metal complexes (preferably, for example, Ru bisbipyridine complexes, Cu phenanthroline complexes, Cu trisbipyridine complexes, Fe EDTA complexes and other complexes of Ru, Fe, Re, Pt, Cu, Co, Ni, Pd, W, Mo, Cr, Mn, Ir and Ag), fine particulate semiconductors (preferably, for example, Si, CdSe, GaP, PbS and ZnS).

The electron-donating compound is more preferably a phenothiazine compound, and most preferably N-methylphenothiazine.

Preferred examples of the electron-accepting compound include aromatic compounds having introduced thereinto an electron-withdrawing group (preferably, for example, 1,4-dinitrobenzene, 1,4-dicyanobenzene, 4,5-dichloro-1,2-dicyanobenzene, 4-nitro-1,2-dicyanobenzene, 4-octanesulfonyl-1,2-dicyanobenzene and 1,10-dicyanoanthracene), heterocyclic compounds or heterocyclic compounds having introduced thereinto an electron-withdrawing group (preferably, for example, pyrimidine, pyrazine, triazine, dichloropyrazine, 3-cyanopyrazole, 4,5-dicyano-1-methyl-2-octanoylaminoimidazole, 4,5-dicyanoimidazole, 2,4-dimethyl-1,3,4-thiadiazole, 5-chloro-3-phenyl-1,2,4-thiadiazole, 1,3,4-oxadiazole, 2-chlorobenzothiazole, N-butyl-1,2,4-triazole), N-alkylpyridinium salts (preferably, for example, N-butylpyridinium iodide, N-butylpyridinium bis(trifluoromethanesulfonyl)imide, N-butyl-3-ethoxycarbonyl-pyridinium butanesulfonate, N-octyl-3-carbamoylpyridinium bis(trifluoromethanesulfonyl)imide, N,N-dimethylviologen di(hexafluorophosphate) and N,N-diphenylviologen bis(bis (trifluoromethanesulfonyl)imide), benzoquinones (preferably, for example, benzoquinone, 2,5-dimethylbenzoquinone, 2,5-dichlorobenzoquinone, 2,3,4,5-tetrachlorobenzoquinone, 2,6-dichloro-3,5-dicyanobenzoquinone, 2,3-dichloro-5,6-dicyanobenzoquinone, naphthoquinone and anthraquinone), imides (preferably, for example, N,N'-dioctylpyromellitimide and 4-nitro-N-octylphthalimide), metal complexes (preferably, for example, Ru trisbipyridine complexes, Ru bisbipyridine complexes, Co trisbipyridine complexes, Cr trisbipyridine complexes, $PtCl_6$ complexes and other complexes of Ru, Fe, Re, Pt, Cu, Co, Ni, Pd, W, Mo, Cr, Mn, IR and Ag) and fine particulate semiconductors (preferably, for example, $TiO_2$, $Nb_2O_5$, ZnO, $SnO_2$, $Fe_2O_3$ and $WO_3$).

The oxidation potential of the electron-donating compound is preferably baser (in the minus side) than the oxidation potential of the sensitizing dye or the colored material, or than the reduction potential of the excited state of the sensitizing dye or the colored material, and the reduction potential of the electron-accepting compound is preferably nobler (in the plus side) than the reduction potential of the sensitizing dye or the colored material, or than the oxidation potential of the excited state of the sensitizing dye or the colored material.

The polymerizable compound for use in the hologram recording material of the present invention is described below.

In the hologram recording material of the present invention, the polymerizable compound and the binder are preferably differing in refractive index. By virtue of this difference, the compositional ratio of the polymerizable compound and a polymerized reaction product thereof to the binder becomes non-uniform between the interference bright part (amplification part) and the interference dark part (non-amplification part) upon photopolymerization occurring in the second step (depending on the case, also in the first step), whereby the recording of an interference fringe providing a refractive index modulation can be performed.

As for the difference in a refractive index between the polymerizable compound and the binder, the polymerizable compound may have a larger refractive index or the binder may have a larger refractive index, but the polymerizable compound preferably has a larger refractive index than that of the binder.

In order to form a large refractive index modulation, the difference in a refractive index between the polymerizable compound and the binder is preferably large in bulk and the difference in a refractive index is preferably 0.01 or more, more preferably 0.05 or more, still more preferably 0.1 or more.

For this purpose, it is preferred that either one of the polymerizable compound and the binder contains at least one aryl group, aromatic heterocyclic group, chlorine atom, bromine atom, iodine atom or sulfur atom and the remaining does not contain such a group or atom. More preferably, the polymerizable compound contains at least one aryl group, aromatic heterocyclic group, chlorine atom, bromine atom, iodine atom or sulfur atom and the binder does not contain such a group or atom.

Also, in order to form a large refractive index modulation, it is preferred that the polymerizable compound is easily movable in the hologram recording material.

The polymerizable compound for use in the present invention is a compound capable of causing addition polymerization under the action of radical or acid (Broensted acid or Lewis acid) generated upon irradiation with a light on the sensitizing dye (or colored material) and polymerization initiator and thereby undertaking oligomerization or polymerization.

The polymerizable compound for use in the present invention may be monofunctional or polyfunctional, may comprise one-component or multiple components, or may be a monomer, a prepolymer (e.g., dimer, oligomer) or a mixture thereof, but is preferably a monomer.

The form thereof may be liquid or solid at room temperature, but a liquid monomer having a boiling point of 100° C. or more or a mixture of a liquid monomer having a boiling point of 100° C. or more and a solid monomer is preferred.

The polymerizable compounds for use in the present invention are roughly classified into a polymerizable compound capable of radical polymerization and a polymerizable compound capable of cationic or anionic polymerization.

Preferred examples of the polymerizable compound are described below for respective cases, that is, a polymerizable compound capable of radical polymerization and a polymerizable compound capable of cationic or anionic polymerization, by grouping each polymerizable compound into A) refractive index: polymerizable compound>binder, and B) refractive index: binder>polymerizable compound. Preferred Examples of Radical Polymerizable Compound in A) Refractive Index: Polymerizable Compound>Binder:

In this case, the radical polymerizable compound preferably has a high refractive index and the radical polymerizable compound having a high refractive index for use in the present invention is preferably a compound having at least one ethylenically unsaturated double bond within the molecule and further containing at least one aryl group, aromatic heterocyclic group, chlorine atom, bromine atom, iodine atom or sulfur atom. Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the radical polymerizable monomer having a high refractive index include styrene, 2-chlorostyrene, 2-bromostyrene, methoxystyrene, phenyl acrylate, p-chlorophenyl acrylate, 2-phenylethyl acrylate, 2-phenoxyethyl acrylate, 2-phenoxyethyl methacrylate, phenol ethoxylate acrylate, 2-(p-chlorophenoxy)ethyl acrylate, benzyl acrylate, 2-(1-naphthyloxy)ethyl acrylate, 2,2-di(p-hydroxyphenyl)propane diacrylate or dimethacrylate, 2,2-di(p-hydroxyphenyl)propane dimethacrylate, polyoxyethyl-2,2-di(p-hydroxyphenyl)propane dimethacrylate, di(2-methacryloxyethyl)ether of bisphenol-A, ethoxylated bisphenol-A diacrylate, di(3-acryloxy-2-hydroxypropyl)ether of bisphenol-A, di(2-acryloxyethyl)ether of bisphenol-A, di(3-acryloxy-2-hydroxypropyl)ether of tetrachloro-bisphenol-A, di(2-methacryloxyethyl)ether of tetrachlorobisphenol-A, di(3-methacryloxy-2-hydroxypropyl)ether of tetrabromo-bisphenol-A, di(2-methacryloxyethyl)ether of tetrabromo-bisphenol-A, di(3-methacryloxy-2-hydroxypropyl)ether of diphenolic acid, 1,4-benzenediol dimethacrylate, 1,4-diisopropenylbenzene, 1,3,5-triisopropenylbenzene, benzoquinone monomethacrylate, 2-[β-(N-carbazyl)propionyl-oxy]ethyl acrylate, phenylthioacrylate and 4-iodophenyl acrylate. Among these, more preferred are 2-phenoxyethyl acrylate, 2-phenoxyethyl methacrylate, phenolethoxylate acrylate, 2-(p-chlorophenoxy)ethyl acrylate, p-chlorophenyl acrylate, phenyl acrylate, 2-phenylethyl acrylate, di(2-acryloxyethyl)ether of bisphenol-A, ethoxylated bisphenol-A diacrylate and 2-(1-naphthyloxy)ethyl acrylate.

The polymerizable compound useful in the present invention is liquid, but this can be used by mixing it with a second solid polymerizable compound such as N-vinylcarbazole, ethylenically unsaturated carbazole monomer disclosed in H. Kamogawa et al., *Journal of Polymer Science: Polymer Chemistry Edition*, Vol. 18, pp. 9-18 (1979), 2-naphthyl acrylate, pentachlorophenyl acrylate, 2,4,6-tribromophenyl acrylate, bisphenol-A diacrylate, 2-(2-naphthyloxy)ethyl acrylate and N-phenylmaleimide. Preferred Examples of Radical Polymerizable Compound in B) Refractive Index: Binder>Polymerizable Compound:

In this case, the radical polymerizable compound preferably has a low refractive index and the radical polymerizable compound having a low refractive index for use in the present invention is preferably a compound having at least one ethylenically unsaturated double bond within the molecule and not containing at all an aryl group, an aromatic heterocyclic group, a chlorine atom, a bromine atom, an iodine atom and a sulfur atom.

Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the radical polymerizable monomer having a lowrefractive index include tert-butyl acrylate, cyclohexyl acrylate, iso-bornyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, 1,4-cyclohexyldiol diacrylate, 2,2-dimethylolpropane diacrylate, glycerol diacrylate, trimethylolpropane diacrylate, pentaerythritol triacrylate, polyoxyethylated trimethylolpropane triacrylate or trimethacrylate and its analogous compounds disclosed in U.S. Pat. No. 3,380,831, pentaerythritol tetraacrylate, triethylene glycol diacrylate, triethylene glycol dimethacrylate, polyoxypropyltrimethylolpropane diacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-propanediol dimethacrylate, pentaerythritol trimethacrylate, pentaerythritol tetramethacrylate, trimethylolpropane trimethacrylate, 1,5-pentanediol dimethacrylate, diallyl fumarate, 1H,1H-perphlorooctyl acrylate, 1H,1H,2H,2H-perphlorooctyl methacrylate and 1-vinyl-2-pyrrolidinone. Among these, more preferred are decanediol diacrylate, isobornyl acrylate, triethylene glycol diacrylate, diethylene glycol diacrylate, triethylene glycol dimethacrylate, ethoxyethoxyethyl acrylate, triacrylate ester of ethoxylated trimethylolpropane, and 1-vinyl-2-pyrrolidine.

The useful polymerizable compound is liquid, but this compound may be used by mixing it with a second solid polymerizable compound monomer such as N-vinylcaprolactam.

The cationic polymerizable compound for use in the present invention is a compound of which polymerization is initiated by the sensitizing dye or colored material and an acid generated from the cationic polymerization initiator, and the anionic polymerizable compound for use in the present invention is a compound of which polymerization is initiated by the sensitizing dye or colored material and a base generated from the anionic polymerization initiator. Examples thereof include the compounds described in J. V. Crivello, *Chemtech.* Oct., page 624 (1980), JP-A-62-149784, *Nippon Secchaku Gakkai Shi (Journal of The Adhesion Society of Japan)*, Vol. 26, No. 5, pp. 179-187 (1990).

The cationic polymerizable compound for use in the present invention is preferably a compound having at least one or more oxylane ring, oxetane ring, vinyl ether group or N-vinylcarbazole moiety within the molecule, more preferably a compound having an oxylane ring moiety.

The anionic polymerizable compound for use in the present invention is preferably a compound having at least one oxylane ring, oxetane ring, vinyl ether group, N-vinylcarbazole moiety, ethylenic double bond moiety with an electron-withdrawing substituent, lactone moiety, lactam moiety, cyclic urethane moiety, cyclic urea moiety or cyclic siloxane moiety within the molecule, more preferably a compound having an oxylane ring moiety.

Preferred Examples of Cationic or Anionic Polymerizable Compound in A) Refractive Index: Polymerizable Compound>Binder:

In this case, the cationic or anionic polymerizable compound preferably has a high refractive index and the cationic or anionic polymerizable compound having a high refractive index for use in the present invention is preferably a compound having at least one oxylane ring, oxetane ring, vinyl ether group or N-vinylcarbazole moiety within the molecule and further containing at least one aryl group, aromatic heterocyclic group, chlorine atom, bromine atom, iodine atom or sulfur atom, more preferably at least one aryl group. Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the high-refractive index cationic or anionic polymerizable monomer having an oxylane ring include phenylglycidyl ether, p-tert-butylphenylglycidyl ether, diglycidyl phthalate, resorcin diglycidyl ether, dibromophenylglycidyl ether, dibromoneopentyl glycol diglycidyl ether, 4,4'-bis(2,3-epoxypropoxy-perfluoroisopropyl)diphenyl ether, p-bromostyrene oxide, bisphenol-A-diglycidyl ether, tetrabromo-bisphenol-A-diglycidyl ether, bisphenol-F-diglycidyl ether and 1,3-bis(3',4'-epoxycyclohexyl)ethyl)-1,3-diphenyl-1,3-dimethyl-disiloxane.

In addition, the compounds shown below are also preferred as the high-refractive index cationic or anionic polymerizable monomer.

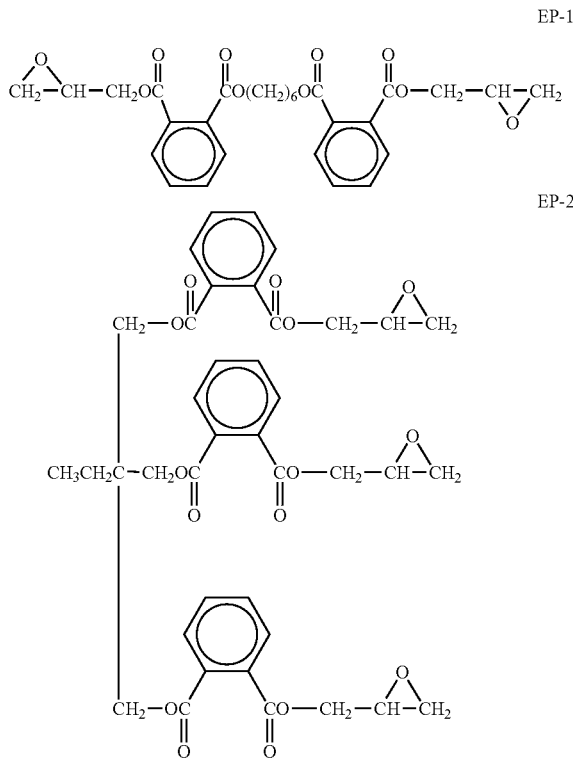

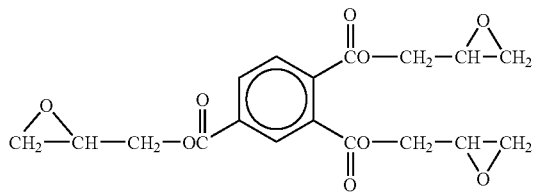

Specific examples of the high-refractive index cationic or anionic polymerizable monomer having an oxetane ring include the compound described above as specific examples of the high-refractive cationic or anionic polymerizable monomer having an oxylane ring, where the oxylane ring is replaced by an oxetane ring.

Specific examples of the high-refractive index cationic or anionic polymerizable monomer having a vinyl ether group moiety include vinyl-2-chloroethyl ether, 4-vinyl ether styrene, hydroquinone vinyl ether, phenylvinyl ether, bisphenol A divinyl ether, tetrabromo-bisphenol A divinyl ether, bisphenol F divinyl ether, phenoxyethylene vinyl ether and p-bromophenoxyethylene vinyl ether.

In addition, N-vinylcarbazole is also preferred as the high-refractive index cationic polymerizable monomer.

Preferred Examples of Cationic or Anionic Polymerizable Compound in B) Refractive Index: Binder>Polymerizable Compound:

In this case, the cationic or anionic polymerizable compound preferably has a low refractive index and the cationic or anionic polymerizable compound having a low refractive index for use in the present invention is preferably a compound having at least one ethylenically unsaturated double bond within the molecule and not containing at all an aryl group, an aromatic heterocyclic group, a chlorine atom, a bromine atom, an iodine atom and a sulfur atom. Also, this compound is preferably a liquid having a boiling point of 100° C. or more.

Specific examples thereof include the polymerizable monomers described below and prepolymers (e.g., dimer, oligomer) comprising such a polymerizable monomer.

Specific examples of the low-refractive index cationic or anionic polymerizable monomer having an oxylane ring include glycerol diglycidyl ether, glycerol triglycidyl ether, diglycerol triglycidyl ether, diglycerol polyglcidyl ether, pentaerythritol polyglycidyl ether, 1,4-bis(2,3-epoxypropoxyperfluoroisopropyl)cyclohexane, sorbitol tetraglycidyl ether, trimethylolpropane diglycidyl ether, trimethylolpropane monoglycidyl ether, trimethylolpropane triglycidyl ether, 1,6-hexanediol diglycidyl ether, ethylene glycol diglycidyl ether, ethylene glycol monoglycidyl ether, polyethylene glycol diglycidyl ether, propylene glycol diglycidyl ether, propylene glycol monoglycidyl ether, neopentyl glycol diglycidyl ether, neopentyl glycol monoglycidyl ether, diglycidyl adipate, 1,2,7,8-diepoxyoctane, 1,6-dimethylol perfluorohexane diglycidyl ether, vinylcyclohexene dioxide, 3,4-epoxycyclohexylmethyl-3',4'-epoxycyclohexane carboxylate, 3,4-epoxycyclohexyloxylane, bis(3,4-epoxycyclohexyl)adipate, bis(3,4-epoxy-6-methyl-cyclohexylmethyl) adipate, 2,2-bis[4-(2,3-epoxypropoxy)cyclohexyl]-propane, 2,2-bis[4-(2,3-epoxypropoxy)cyclohexyl]hexafluoropropane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxy-bis(3,4- epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl)adipate, di-2,3-epoxycyclopentyl ether, vinyl glycidyl ether, allyl glycidyl ether and 2-ethylhexyl glycidyl ether.

In addition, the compounds shown below are also preferred as the low-refractive index cationic or anionic polymerizable monomer.

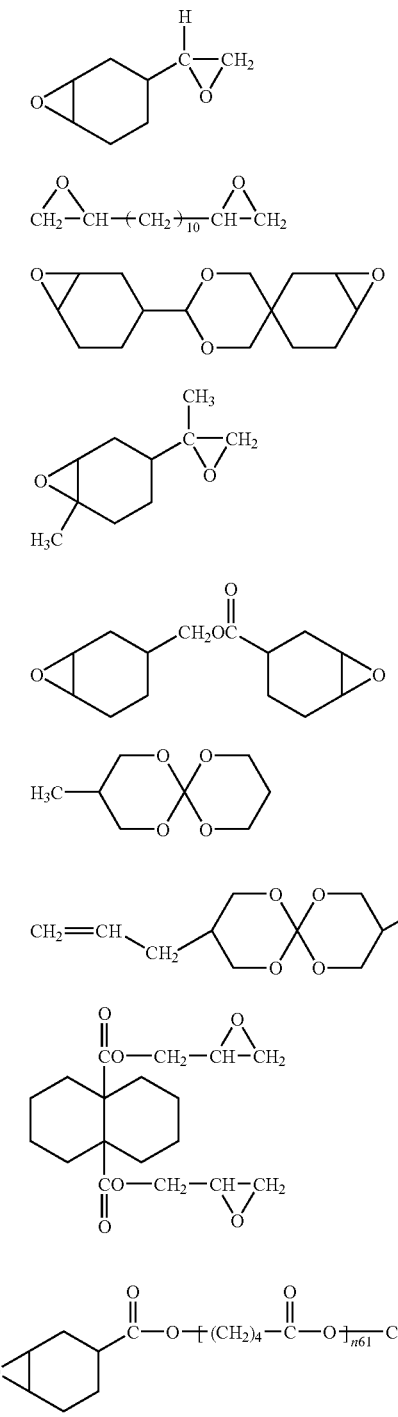

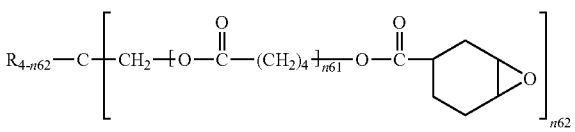

wherein n61 is an integer of 1 to 5, n62 is 3 or 4, R is an ethyl group or a hydroxymethyl group, and n61 has the same meaning as above.

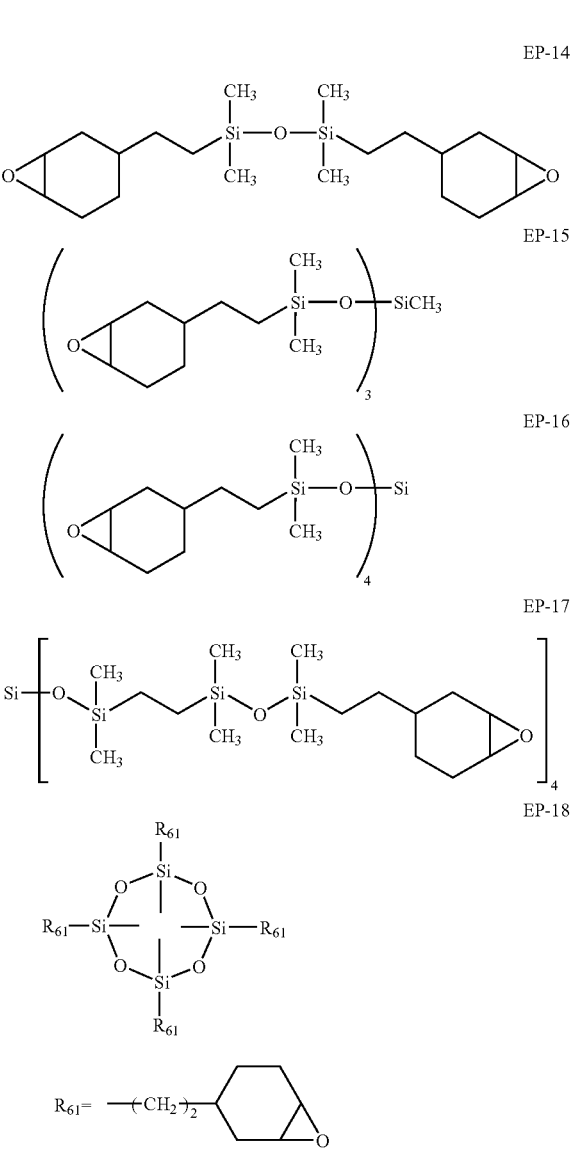

Specific examples of the low-refractive index cationic or anionic polymerizable monomer having an oxetane ring include the compounds described above as specific examples of the low-refractive index cationic or anionic polymerizable monomer having an oxylane ring, where the oxylane ring is replaced by an oxetane ring.

Specific examples of the low-refractive index cationic or anionic polymerizable monomer having a vinyl ether group moiety include vinyl-n-butyl ether, vinyl-tert-butyl ether, ethylene glycol divinyl ether, ethylene glycol monovinyl ether, propylene glycol divinyl ether, propylene glycol monovinyl ether, neopentyl glycol divinyl glycol, neopentyl glycol monovinyl glycol, glycerol divinyl ether, glycerol trivinyl ether, triethylene glycol divinyl ether, trimethylolethane trivinyl ether, trimethylolpropane monovinyl ether, trimethylolpropane divinyl ether, trimethylolpropane trivinyl ether, diglycerol trivinyl ether, sorbitol tetravinyl ether, allyl vinyl ether, 2,2-bis(4-cyclohexanol)propane divinyl ether and 2,2-bis(4-cyclohexanol)trifluoropropane divinyl ether.

In the hologram recording material of the present invention, the binder is usually used for the purpose of improving the film-forming property of a composition before polymerization, the uniform film thickness and the storage stability. The binder preferably has good compatibility with the polymerizable compound, the polymerization initiator and the sensitizing dye or colored material.

The binder is preferably a solvent-soluble thermoplastic polymer and these polymers can be used individually or in combination.

The binder may also be a reactive binder capable of undergoing a reaction upon radical or cationic polymerization. In this case, the binder is preferably a reactive oligomer having an ethylenically unsaturated group, an oxylane ring or the like.

As described above, the binder and the polymerizable compound for use in the present invention are preferably differing in refractive index and the polymerizable compound may have a larger refractive index or the binder may have a larger refractive index, but the polymerizable compound preferably has a larger refractive index than that of the binder.

For this purpose, it is preferred that either one of the polymerizable compound and the binder contains at least one aryl group, aromatic heterocyclic group, chlorine atom, bromine atom, iodine atom or sulfur atom and the remaining does not contain such a group or atom. More preferably, the polymerizable compound contains at least one aryl group, aromatic heterocyclic group, chlorine atom, bromine atom, iodine atom or sulfur atom and the binder does not contain such a group or atom.

Examples of the binder are described below by grouping it into A) refractive index: polymerizable compound>binder and B) refractive index: binder>polymerizable compound.

Preferred Examples of Binder in A) Refractive Index: Polymerizable Compound>Binder:

Specific preferred examples of the low-refractive index binder include acrylates or α-alkyl acrylate esters and their acidic polymers and interpolymers (for example, polymethyl methacrylate, polyethyl methacrylate and copolymer of methyl methacrylate with other alkyl (meth)acrylate), polyvinyl esters (for example, polyvinyl acetate, polyvinyl acetate/acrylate, polyvinyl acetate/methacrylate, and hydrolysis-type polyvinyl acetate), ethylene/vinyl acetate copolymers, saturated or unsaturated polyurethanes, butadiene and isoprene polymers and copolymers, high molecular weight polyethylene oxides of polyglycol having a weight average molecular weight of 4,000 to 1,000,000, epoxidates (for example, epoxidate having an acrylate or methacrylate group), polyamides (for example, N-methoxymethyl polyhexamethylene adipamide), cellulose esters (for example, cellulose acetate, cellulose acetate succinate and cellulose acetate butyrate), cellulose ethers (for example, methyl cellulose, ethyl cellulose, ethyl benzyl cellulose), polycarbonates, polyvinyl acetals (for example, polyvinyl butyral and polyvinyl formal), polyvinyl alcohols, polyvinyl-pyrrolidones, acid-containing polymers and copolymers disclosed in U.S. Pat. Nos. 3,458,311 and 4,273,857, and amphoteric polymer binders disclosed in U.S. Pat. No. 4,293,635. Among these, more preferred are a cellulose acetate butyrate polymer, a cellulose acetate lactate polymer, a polymethyl methacrylate, an acryl-base polymer or interpolymer containing methyl methacrylate/methacrylic acid and methyl methacrylate/acrylic acid copolymers, a terpolymer of methyl methacrylate/C2-C4 alkyl acrylate or methacrylate/acrylic acid or methacrylic acid, a polyvinyl acetate, a polyvinyl acetal, a polyvinyl butyral, a polyvinyl formal and a mixture thereof.

In addition, a fluorine atom-containing polymer is also preferred as the low-refractive index binder. The polymer is preferably an organic solvent-soluble polymer containing a fluoroolefin as an essential component and containing, as a copolymerization component, one or more unsaturated monomer selected from an alkyl vinyl ether, an alicyclic vinyl ether, a hydroxyvinyl ether, an olefin, a haloolefin, an unsaturated carboxylic acid or its ester, and a vinyl carboxylate. The weight average molecular weight thereof is preferably from 5,000 to 200,000 and the fluorine atom content is preferably from 5 to 70 weight %.

As the fluoroolefin in the fluorine atom-containing polymer, for example, tetrafluoroethylene, chlorotrifluoroethylene, vinyl fluoride or vinylidene fluoride is used. As for another copolymerization component, examples of the alkyl vinyl ether include ethyl vinyl ether, isobutyl vinyl ether and n-butyl vinyl ether, examples of the alicyclic vinyl ether include cyclohexyl vinyl ether and derivatives thereof, examples of the hydroxyvinyl ether include hydroxybutyl vinyl ether, examples of the olefin and haloolefin include ethylene, propylene, isobutylene, vinyl chloride and vinylidene chloride, examples of the vinyl carboxylate include vinyl acetate and n-vinyl butyrate, and examples of the unsaturated carboxylic acid and an ester thereof include unsaturated carboxylic acids such as (meth)acrylic acid and crotonic acid, C1-C18 alkyl esters of (meth)acrylic acid, such as methyl (meth)acrylate, ethyl (meth)acrylate, propyl (meth)acrylate, isopropyl (meth)acrylate, butyl (meth)acrylate, hexyl (meth)acrylate, octyl (meth)acrylate and lauryl (meth)acrylate, C2-C8 hydroxyalkyl esters of (meth)acrylic acid, such as hydroxyethyl (meth)acrylate and hydroxypropyl (meth)-acrylate, N,N-dimethylaminoethyl (meth)acrylate and N,N-diethylaminoethyl (meth)acrylate. These radical polymerizable monomers may be used individually or in combination of two or more thereof and if desired, a part of the monomer may be replaced by another radical polymerizable monomer such as styrene, α-methylstyrene, vinyltoluene and (meth)acrylonitrile. Other than these, monomer derivatives such as carboxylic acid group-containing fluoroolefin and glycidyl group-containing vinyl ether can also be used.

Specific examples of the fluorine atom-containing polymer include organic solvent-soluble "Lumiflon" series (for example, Lumiflon LF200, weight average molecular weight: about 50,000, produced by Asahi Glass Company) having a hydroxyl group. In addition, organic solvent-soluble fluorine atom-containing polymers are commercially available also from Daikin Kogyo Co., Ltd., Central Glass Co., Ltd. and Penwalt Corp., and these can also be used.

Other preferred examples include silicon compounds such as poly(dimethylsiloxane), and aromatic-free silicon oils.

Furthermore, the epoxy oligomer compounds shown below can also be used as the low-refractive index reactive binder.

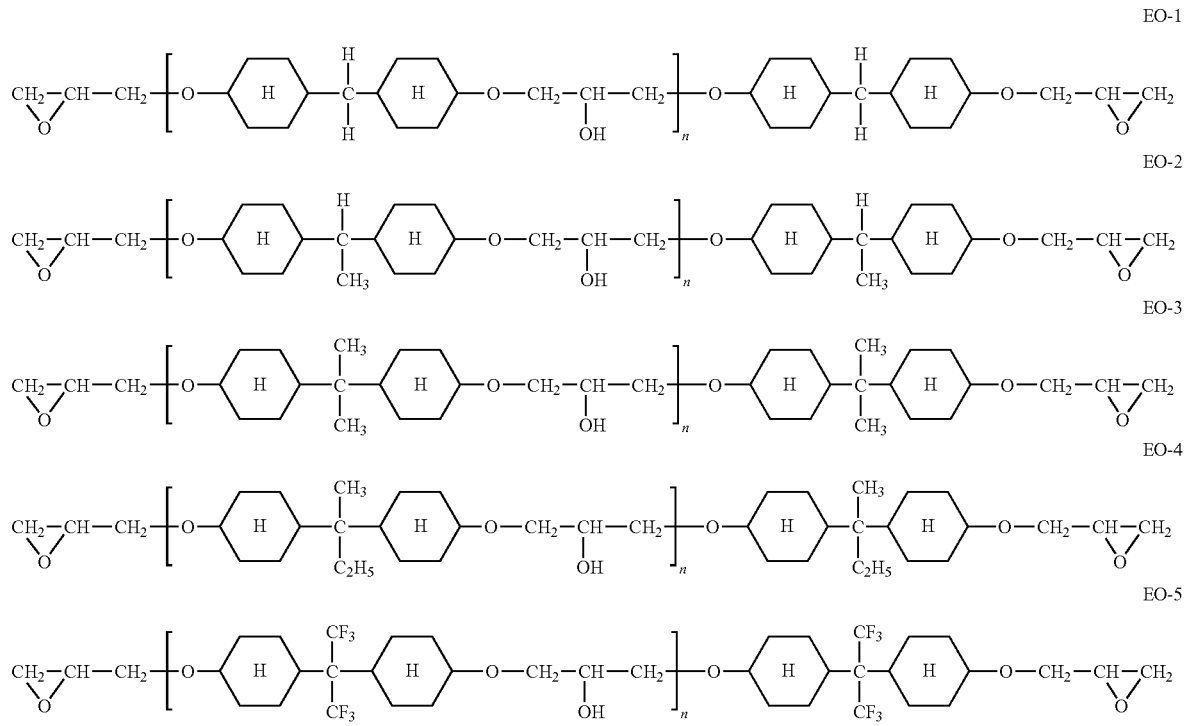

wherein n is preferably 1 to 100, more preferably 1 to 10.

Preferred Examples of Binder in B) Refractive Index: Binder>Polymerizable Compound:

Specific preferred examples of the high-refractive index binder include polystyrene polymers and copolymers with, for example, acrylonitrile, maleic anhydride, acrylic acid, methacrylic acid or an ester thereof, vinylidene chloride copolymers (e.g., vinylidene chloride/acrylonitrile copolymer, vinylidene chloride/methacrylate copolymer, vinylidene chloride/vinyl acetate copolymer), polyvinyl chloride and copolymers thereof (e.g., polyvinyl chloride/acetate, vinyl chloride/acrylonitrile copolymer), polyvinyl benzal synthetic rubbers (e.g., butadiene/acrylonitrile copolymer, acrylonitrile/butadiene/styrene copolymer, methacrylate/acrylonitrile/butadiene/styrene copolymer, 2-chlorobutadiene-1,3 polymer, chlorinated rubber, styrene/butadiene/styrene, styrene/isoprene/styrene block copolymer), copolyesters (for example, polymethylene glycol represented by the formula: $HO(CH_2)_nOH$ (wherein n is an integer of 2 to 10), those produced from a reaction product of (1) hexahydroterephthalic acid, sebacic acid and terephthalic acid, (2) terephthalic acid, isophthalic acid and sebacic acid, (3) terephthalic acid and sebacic acid, or (4) terephthalic acid and isophthalic acid, and a mixture of copolyesters produced from (5) the glycol and (i) terephthalic acid, isophthalic acid and sebacic acid or (ii) terephthalic acid, isophthalic acid, sebacic acid and adipic acid), poly-N-vinylcarbazole and copolymers thereof, carbazole-containing polymers disclosed in H. Kamogawa et al., *Journal of Polymer Science: Polymer Chemistry Edition*, Vol. 18, pp. 9-18 (1979) and polycarbonates comprising a bisphenol and a carbonate ester. Among these, more preferred are polystyrene, poly(styrene/acrylonitrile), poly(styrene/methyl methacrylate), polyvinyl benzal and a mixture thereof.

In the hologram recording material of the present invention, additives such as chain transfer agent, heat stabilizer, plasticizer and solvent may be appropriately used, if desired Other preferred examples include silicon compounds such as poly(methylphenylsiloxane) and 1,3,5-trimethyl-1,1,3,5,5-pentaphenyltrisiloxane, and aromatic-rich silicon oils.

In addition, the epoxy oligomer compounds shown below can also be used as the high-refractive index reactive binder.

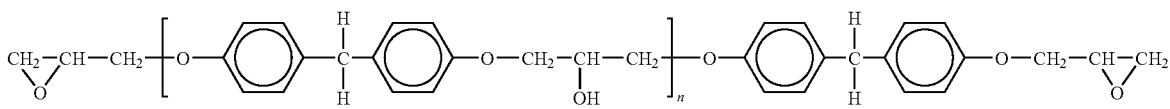

-continued

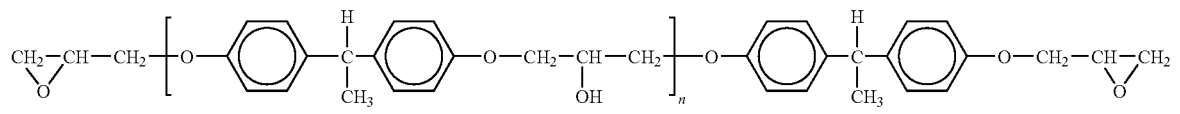
EO-7

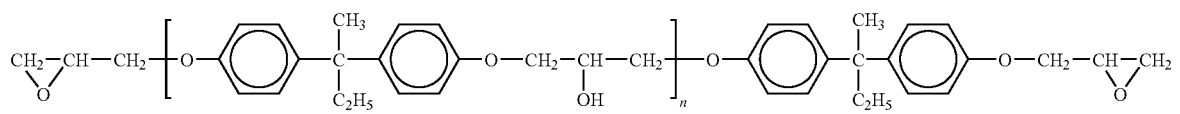
EO-8

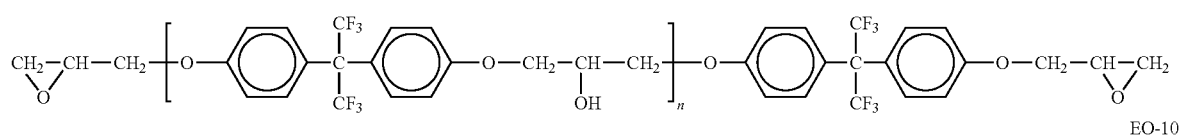
EO-9

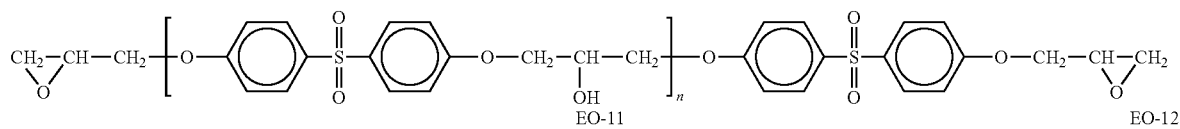
EO-10

EO-11

EO-12

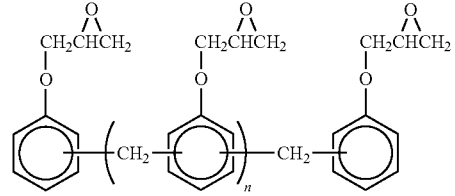

EO-13

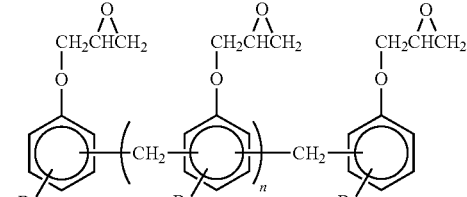

EO-14

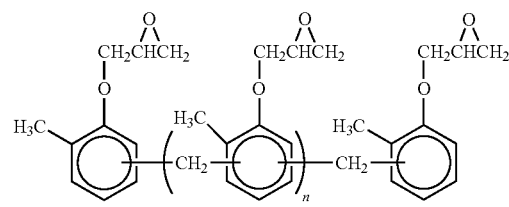

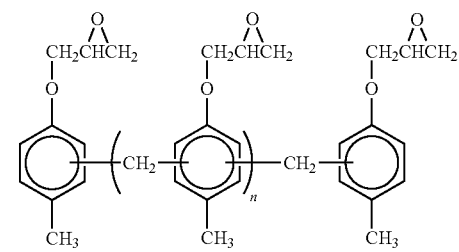

wherein n is preferably 1 to 100, more preferably 1 to 10.

In the hologram recording material of the present invention, a chain transfer agent is preferably used in some cases. Preferred examples of the chain transfer agent include thiols such as 2-mercaptobenzoxazole, 2-mercaptobenzothiazole, 2-mercaptobenzimidazole, 4-methyl-4H-1,2,4-triazole-3-thiol, 4,4-thiobisbenzenethiol, p-bromobenzenethiol, thiocyanuric acid, 1,4-bis(mercaptomethyl)benzene and p-toluenethiol, thiols described in U.S. Pat. No. 4,414,312 and JP-A-64-13144, disulfides described in JP-A-2-291561, thiones described in U.S. Pat. No. 3,558,322 and JP-A-64-17048, and O-acylthiohydroxamate and N-alkoxypyridine thiones described in JP-A-2-291560.

Particularly, in the case where the polymerization initiator is a 2,4,5-triphenylimidazolyl dimer, a chain transfer agent is preferably used.

The amount of the chain transfer agent used is preferably from 1.0 to 30 weight % based on the entire composition.

In the hologram recording material of the present invention, a heat stabilizer may be added for the purpose of enhancing the storage stability.

Useful examples of the heat stabilizer include hydroquinone, phenidone, p-methoxyphenol, alkyl- or aryl-substituted hydroquinone or quinone, catechol, tert-butyl catechol, pyrogallol, 2-naphthol, 2,6-di-tert-butyl-p-cresol, phenothiazine and chloranil. In addition, dinitroso dimers described in U.S. Pat. No. 4,168,982 by Pazos are also useful.

The plasticizer is used for varying the adhesive property, flexibility, hardness and other various mechanical properties of the hologram recording material. Examples of the plasticizer include triethylene glycol dicaprylate, triethylene glycol bis(2-ethylhexanoate), tetraethylene glycol diheptanoate, diethyl sebacate, dibutyl suberate, tris(2-ethylhexyl)phosphate, tricresyl phosphate and dibutyl phthalate.

Generally, the percentage of each component in the hologram recording material of the present invention is preferably in the following range based on the entire weight of the composition:

Binder:

preferably from 0 to 90 weight %, more preferably from 35 to 75 weight %,

Polymerizable compound:
    preferably from 5 to 60 weight %, more preferably from 15 to 50 weight %,
Polymerization initiator:
    preferably from 0.01 to 10 weight %, more preferably from 0.1 to 7 weight %,
Dye precursor group:
    preferably from 0.5 to 30 weight %, more preferably from 1 to 20 weight %,
Sensitizing dye:
    preferably from 0.01 to 10 weight %, more preferably from 0.1 to 3 weight %, and
Electron-donating compound or electron-accepting compound:
    preferably from 0 to 30 weight %, more preferably from 0 to 20 weight %.

The hologram recording material of the present invention may be prepared by an ordinary method.

For example, the film formation of the hologram recording material of the present invention may be performed by a method of dissolving the binder and respective components in a solvent or the like and coating the obtained solution with use of a spin coater, a bar coater or the like.

Examples of the solvent include a ketone-base solvent such as methyl ethyl ketone, methyl isobutyl ketone, acetone and cyclohexanone, an ester-base solvent such as ethyl acetate, butyl acetate, ethylene glycol diacetate, ethyl lactate and cellosolve acetate, a hydrocarbon-base solvent such as cyclohexane, toluene and xylene, an ether-base solvent such as tetrahydrofuran, dioxane and diethyl ether, a cellosolve-base solvent such as methyl cellosolve, ethyl cellosolve, butyl cellosolve and dimethyl cellosolve, an alcohol-base solvent such as methanol, ethanol, n-propanol, 2-propanol, n-butanol and diacetone alcohol, a fluorine-base solvent such as 2,2,3,3-tetrafluoropropanol, a halogenated hydrocarbon-base solvent such as dichloromethane, chloroform and 1,2-dichloroethane, an amide-base solvent such as N,N-dimethylformamide and a nitrile-base solvent such as acetonitrile and propionitrile.

The hologram recording material of the present invention may be directly coated on a substrate by using a spin coater, a roll coater or a bar coater or may be cast as a film and then laminated on a substrate by an ordinary method, whereby the hologram recording material can be completed.

The term "substrate" as used herein means an arbitrary natural or synthetic support, suitably a material which can be present in the form of a soft or rigid film, sheet or plate.

Preferred examples of the substrate include polyethylene terephthalate, resin-undercoated polyethylene terephthalate, polyethylene terephthalate subjected to flame or electrostatic discharge treatment, cellulose acetate, polycarbonate, polymethyl methacrylate, polyester, polyvinyl alcohol and glass.

The solvent used can be removed by evaporation at the drying. For the removal by evaporation, heating or reduced pressure may be used.

The film formation of the hologram recording material of the present invention may also be performed by melting the binder containing respective components at a temperature higher than the glass transition temperature or melting point of the binder, and melt-extruding or injection-molding the obtained melt. At this time, a reactive crosslinking binder may be used as the binder to cure the film by causing crosslinking after extrusion or molding and thereby increase the film strength. Examples of the crosslinking reaction which can be used here include a radical polymerization reaction, a cationic polymerization reaction, a condensation polymerization reaction and an addition polymerization reaction. Furthermore, the methods described, for example, in JP-A-2000-250382 and JP-A-2000-172154 can also be preferably used.

In addition, a method of dissolving respective components in a monomer solution for forming the binder, causing thermal polymerization or photopolymerization of the monomer to form a polymer and using the polymer as the binder can also be preferably used. Examples of the polymerization method which can be used here include, similarly to the above, a radical polymerization reaction, a cationic polymerization reaction, a condensation polymerization reaction and an addition polymerization reaction.

Furthermore, a protective layer for blocking oxygen may be formed on the hologram recording material. The protective layer may be formed by laminating a plastic-made film or plate such as polyolefin (e.g., polypropylene, polyethylene), polyvinyl chloride, polyvinylidene chloride, polyvinyl alcohol, polyethylene terephthalate and cellophane film, with use of electrostatic adhesion or an extruder, or by coating a solution of such a polymer. Also, a glass plate may be laminated. Between the protective layer and the photosensitive film and/or between the substrate and the photosensitive film, a pressure-sensitive adhesive or a liquid substance may be allowed to be present so as to increase the air tightness.

In the case of using the hologram recording material of the present invention for a holographic optical memory, the hologram recording material is preferably free from shrinkage or the like before and after the hologram recording in view of improving the S/N ratio at the signal reproduction.

For this purpose, in the hologram recording material of the present invention, for example, an expanding agent described in JP-A-2000-86914 or a shrinkage-resistant binder described in JP-A-2000-250382, JP-A-2000-172154 and JP-A-11-344917 is preferably used.

It is also preferred to control the interference fringe spacing by using a diffusing element described in JP-A-3-46687, JP-A-5-204288 and JP-T-9-506441.

In the hologram recording material of the present invention, the following combinations are preferred:

1) a combination where the polymerization initiator is an acid generator, the polymerizable compound is a cationic polymerizable compound, and the dye precursor comprises an acid-induced color forming dye precursor and an acid generator serving also as the polymerization initiator;

2) a combination where the polymerization initiator is a generator of generating an acid and a radical, the polymerizable compound is a radical polymerizable compound, and the dye precursor comprises an acid-induced color forming dye precursor and an acid generator serving also as the polymerization initiator;

3) a combination where the polymerization initiator is a base generator, the polymerizable compound is an anionic polymerizable compound, and the dye precursor comprises a base-induced color forming dye precursor and a base generator serving also as the polymerization initiator;

4) a combination where the polymerization initiator is a radical generator, the polymerizable compound is a radical polymerizable compound, and the dye precursor is a compound represented by formula (7);

5) a combination where the polymerization initiator is a cation generator, the polymerizable compound is a cationic polymerizable compound, and the dye precursor is a compound represented by formula (7);

6) a combination where the polymerization initiator is a radical generator, the polymerizable compound is a radical polymerizable compound, and the dye precursor contains a compound represented by formula (2); and 7) a combination where the polymerization initiator is an anion generator, the polymerizable compound is an anionic polymerizable compound, and the dye precursor contains a compound represented by formula (2).

In the case of conventional normal photopolymers as described in Patent Documents 1 to 3 and 5 to 8, when multiplex recording is performed, recording in the later stage of multiplex recording takes place in the portion where the polymerization is fairly proceeding, as a result, a long exposure time is necessary for recording the same signal (the sensitivity decreases) as compared with the early stage of multiplex recording and this is a serious problem in view of system design. That is, the range of causing linear increase of the refractive index modulation amount for the exposure amount is very narrow.

On the other hand, in the method of the present invention, a polymerization reaction is scarcely caused at the holographic exposure (first step) and the refractive index modulation is produced as a result of polymerization proceeded all at once by the entire surface exposure in the second step, so that the multiplex recording can be performed many times. Furthermore, the multiplex recording can be performed while keeping constant the exposure amount throughout the multiplex recording at any recording, that is, while causing the refractive index modulation amount to linearly increase for the exposure amount, so that a wide dynamic range can be taken. In this way, the method of the present invention employing a system of an amplification of a latent image is highly advantageous in view of suitability for such multiplex recording.

This is preferred from the standpoint of, for example, realizing a high-capacity recording medium, simplifying the recording system and improving the S/N ratio.

Moreover, in the hologram recording method of the present invention comprising a first step of forming a latent image upon holographic exposure and a second step of forming an interference fringe by amplifying the latent image to provide a refractive index modulation, the recording can be performed with very high sensitivity as compared with known systems.

Furthermore, as compared with the recording method disclosed in Patent Document 4 where the change in orientation of a compound having birefringence such as azobenzene polymer is utilized, in the system of the present invention, the quantum yield is high to ensure high sensitivity and in addition, since the sensitizing dye is decomposed at the time of hologram recording or fixing by heat or light after recording or in the first or second step, to enable nondestructive reproduction, excellent preservability is also attained.

As described in the foregoing pages, the hologram recording material of the present invention gives an utterly new recording system capable of drastically overcoming those problems to be solved, in particular, capable of satisfying high sensitivity and at the same time, satisfying good preservability, dry processing and multiplex recording properties, and this hologram recording material is preferably used particularly for an optical recording medium (holographic optical memory).

In the case of using the hologram recording material of the present invention for an optical recording medium, the hologram recording material during storage is preferably stored in a light-shielding cartridge. It is also preferable to provide the hologram recording material, on a front surface and/or a rear surface thereof, with a light-shielding filter capable of intercepting a part of ultraviolet, visible and infrared wavelength ranges other than the wavelength of the recording light and the reproducing light.

In case of employing the hologram recording material of the present invention as an optical recording medium, such optical recording medium can be of any shape such as a disk, a card or a tape.

Other then the optical recording medium, the hologram recording material of the present invention can be preferably used for a three-dimensional display hologram, a holographic optical element (HOE, for example, on-vehicle head-up display (HUD), pickup lens for optical disk, head mount display, color filter for liquid crystal, reflection-type liquid crystal reflector, lens, diffraction grating, interference filter, coupler for optical fiber, polariscope for facsimile and window glass for building), a cover of book, magazine or the like, a display such as POP, and a gift, and for the purpose of anticounterfeit security, can also be preferably used for a credit card, a bank bill, a package and the like.

The present invention is described below by referring to Examples, but the present invention is not limited thereto.

EXAMPLE 1

Under red light, a sensitizing dye, an electron-donating compound, dye precursor group+a polymerization initiator, a polymerizable compound and a binder shown in Table 1 were dissolved in a methylene chloride of 2 to 5 times amount (acetone, acetonitrile or methanol being also employed if necessary) to prepare Hologram Recording Materials 101 to 106. Percentages are shown in wt. %.

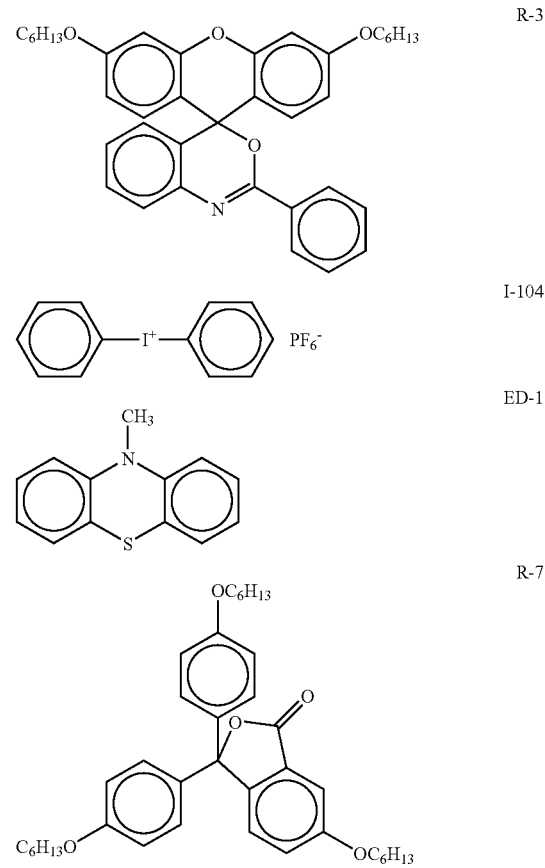

-continued

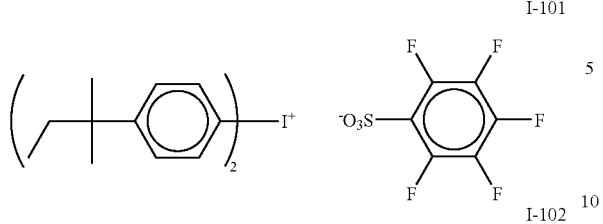

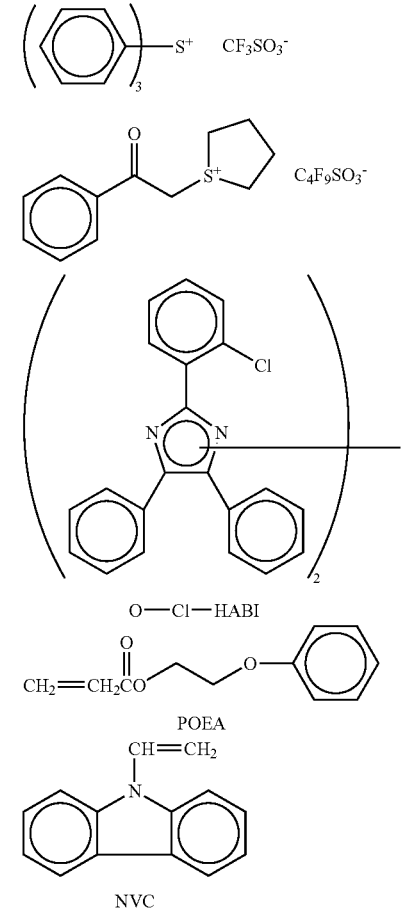

-continued

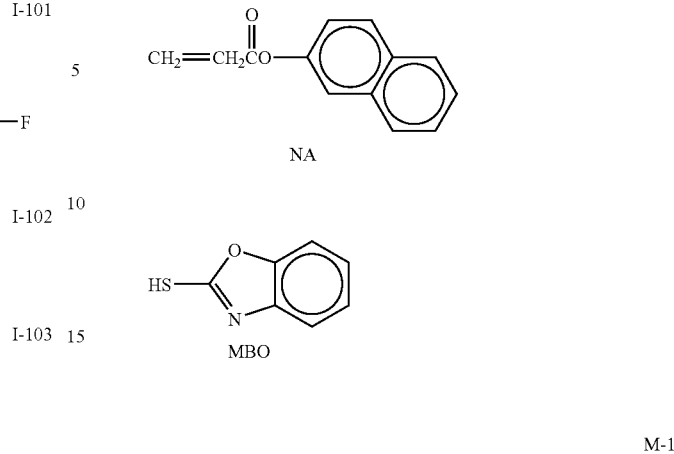

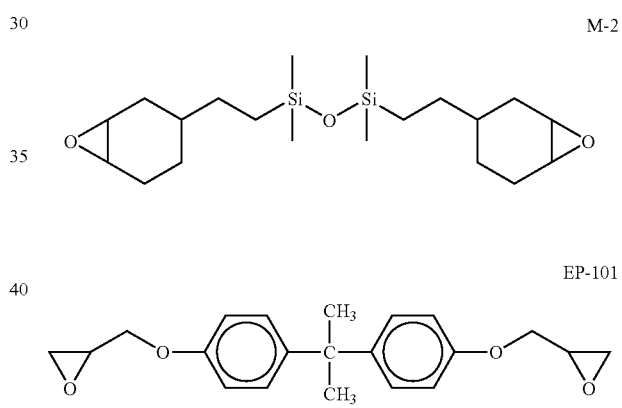

TABLE 1

| Sample | Sensitizing Dye | Electron-donating Compound | Dye Precursor Group Polymerization Initiator | Polymerizable Compound | Binder |
| --- | --- | --- | --- | --- | --- |
| 101 | D-118 (0.8%) | ED-1 (10%) | R-3 (5%) + I-104 (20%) | M-1 (32.2%) | Polydimethyl-siloxane (32%) |
| 102 | D-117 (0.4%) | ED-1 (10%) | R-3 (5%) + I-104 (20%) | POEA:NVC = 2:1 (32.6%) | polyvinyl acetal (32%) |
| 103 | D-115 (0.2%) | ED-1 (10%) | PB-3 (20%) + DD-47 (5%) | M-2 (32.8%) | poly(methylphenyl)-siloxane (32%) |
| 104 | D-118 (0.8%) | ED-1 (10%) | ES-1 (10%) + O—Cl-HABI (3%) | POEA:NA = 4:1 (36.2%) | cellulose acetate butyrate (40%) |
| 105 | D-117 (0.4%) | ED-1 (10%) | E-12 (20%) + O—Cl-HABI (1.8%) + MBO (1.2%) | POEA:NVC = 2:1 (30.6%) | polymethyl methacrylate (36%) |
| 106 | D-118 (0.8%) | ED-1 (10%) | E-25 (20%) + PB-3 (3%) | EP-101 (33.2%) | EO-1 (33%) |

Hologram Recording Materials 101 to 106 each was blade coated on a glass substrate (superposed coating if necessary) to a thickness of about 80 μm to form a photosensitive layer and then, dried under heat at 40° C. for 3 minutes to remove the solvent by distillation. On the photosensitive layer, a cellulose triacetate (TAC) film was covered to complete Hologram Recording Materials 101 to 106.

Also as a comparative example, there was prepared a hologram recording material of radical polymerization photopolymer type, described in Example 1 of JP-A-6-43634.

Each hologram recording material was subjected to recording by exposure with a two-beam optical system for the transmission hologram recording shown in FIG. 1 while using a YAG laser double wave (532 nm, output: 2 W) as the light source. The angle made by the object light and the reference light was 30°. The beam had a diameter of 0.6 cm and an intensity of 8 mW/cm$^2$ and the exposure was performed by varying the holography exposure time in the range from 0.1 to 40 seconds (as an irradiation energy, from 0.8 to 320 mJ/cm$^2$). By passing a beam of He—Ne laser at 632 nm to the center of exposure region at a Bragg angle (first step), the ratio of the diffracted light to the incident light (diffraction efficiency) was measured in actual time. Also, a light in the wavelength region from 370 to 410 nm was irradiated on the entire surface of each hologram recording material (second step) and the diffraction efficiency was measured.

The diffraction efficiency after holographic exposure of the first step, the maximum diffraction efficiency and the shrink rate (a ratio of film thickness before and after the recording) after light irradiation of the second step, determined as above for each of Hologram Recording Materials 101 to 106, are shown in Table 2.

TABLE 2

| Sample | Diffraction Efficiency after First Step, η | Maximum Diffraction Efficiency after Second Step, η | Amplification Factor* |
|---|---|---|---|
| 101 | 15% | 71% | 6.3 |
| 102 | 14% | 74% | 6.7 |
| 103 | 13% | 70% | 6.1 |
| 104 | 14% | 71% | 6.6 |
| 105 | 13% | 70% | 5.7 |
| 106 | 14% | 71% | 5.6 |

*A value obtained by dividing an irradiation light intensity necessary for giving a maximum diffraction efficiency only by the first step without using the second step by an irradiation light intensity necessary for the first step when the second step is used.

As seen from Table 2, in the hologram recording material of the present invention, the light intensity of irradiation in the first step can be as small as 1/5 to 1/7 as compared with the case of not using the second step. Since batch exposure can be performed in the second step, the recorded refractive index modulation can be amplified in the second step resulting from polymerization using the colored material which forms a latent image in the first step and therefore, the first step can be shortened, namely, high sensitivity can be achieved. Needless to say, high sensitivity by virtue of such amplification cannot be achieved in known materials.

It is also seen that in the hologram recording material of the present invention, Δn (calculated based on the Kogelnik's equation from the refractive index modulation amount, diffraction efficiency and film thickness) linearly increases according to the exposure amount (mJ/cm$^2$) both after the first step and after the second step, which is advantageous for multiplex recording.

In practice, the hologram recording material of the present invention was subjected to a multiplex hologram recording, by a multiplex recording of 10 times in a same position with an exposure amount each equal to 1/10 of the exposure amount in the first step and with a reference light angle changed by 2° for each exposure (first step), followed by a flush irradiation with a light of a wavelength range of 370 to 410 nm (second step). And it was confirmed that each object light could be reproduced by a reproducing light irradiation changed by 2° for each time. Thus the hologram recording material of the present invention is capable of multiplex recording with a same exposure amount, thus being suitable for multiplex recording. Stated differently, the hologram recording material of the present invention is capable of multiplex recording, thus achieving a recording of a high density (capacity).

On the other hand, in the hologram recording materials of JP-A-6-43634 and other known photopolymer methods, the polymerization of photopolymer progresses to retard the monomer displacement required for recording, in a latter period of the multiplex recording, thus requiring a larger exposure amount for a same recording in comparison with an early period of the multiplex recording, and constituting a difficulty in increasing the level of multiplicity or the recording density.

In the hologram recording method of the present invention, since the hologram recording (in the first step) is performed by using color formation as a latent image instead of polymerization, the above problem does not happen and the hologram recording method of the present invention is superior to other known photopolymer method.

The same effects were obtained even when in Hologram Recording Materials (Samples) 101 to 106, the sensitizing dye was changed to D-1, D-8, D-17, D-22, D-31, D-33, D-34, D-46, D-49, D-50, D-55, D-74, D-87, D-91, D-93, D-94, D-95, D-97, D-100, D-101, D-107, D-116, D-117, D-119, D-120, D-121 or D-122, even when in Samples 101 and 102, the acid generator (serving also as the cationic or radical polymerization initiator) was changed to 2-(4'-methoxyphenyl)-4,6-bis(trichloromethyl)-1,3,5-triazine, 4-diethylaminophenyldiazonium tetrafluoroborate, di(tert-butylphenyl) iodonium tetra(pentafluorophenyl)borate, tris-(4-methylphenyl)sulfonium tetra(pentafluorophenyl)borate, triphenylsulfonium methanesulfonate, triphenylsulfonium perfluoropentanoate, bis(1-(4-diphenylsulfonium)phenylsulfide ditriflate, benzoin tosylate, 2,6-dinitrobenzyl tosylate, N-tosylphthalic acid imide, I-101, I-102 or I-102 and even when in Samples 101 and 102, the acid-induced color forming dye precursor of the dye precursor group was changed to R-1, R-2, R-4, R-6 or R-7.

Also, the same effects were obtained even when in Samples 103 and 106, the base generator (serving also as the anionic polymerization initiator) of the dye precursor group was changed to PB-4, PB-8, PB-10, PB-12, PB-13, PB-19, PB-22, PB-32, PB-33 or PB-52, and even when in Sample 103, the base-induced color forming dye precursor (non-dissociated form of dissociation-type dye) was changed to DD-1, DD-4, DD-7, DD-10, DD-16, DD-23, DD-25, DD-35, DD-39, DD-44, D-47, D-48 or D-49.

Furthermore, the same effects were obtained even when in Samples 104 and 105, the radical polymerization initiator was changed to Irgacure 651, I-2, I-4, I-12, I-18, I-19, I-22, I-32, CDM-HABI, TCTM-HABI, tetrabutylammonium n-butyltriphenylborate or the like.

In addition, the same effects were obtained even when in Samples 105 and 106, the dye precursor was changed to E-4, E-5, E-13, E-15, E-16, E-18, E-24, E-25, E-28, E-29, E-32, E-33 E-37, E-38, E-42 or E-44.

In these, the light used for performing the entire surface exposure was at an optimal wavelength for each system.

The present application claims foreign priority based on Japanese Patent Application No. JP2003-300057, filed Aug. 25 of 2003, the contents of which is incorporated herein by reference.

What is claimed is:

1. A hologram recording method, which comprises:
a first step of producing a latent image by holographic exposure of a hologram recording material, wherein the hologram recording material comprising a dye precursor that is a combination comprising at least an acid-induced color forming dye precursor and an acid generator; and
a second step of causing a polymerization reaction due to the latent image, so as to form a first interference fringe providing a refractive index modulation, wherein the latent image is a second interference fringe, the first interference fringe having a diffraction efficiency which is at least 5 times larger than that of the second interference fringe;
wherein each of the first step and the second step is dry process;
wherein the first step is a step of producing a colored material to form the latent image, the colored material having no absorption of a hologram reproducing light; and
the second step is a step of causing the polymerization reaction upon irradiating the colored material with a light which has a wavelength different from that of the holographic exposure, so as to form the first interference fringe providing the refractive index modulation,
wherein the light irradiated in the second step has a wavelength where a sensitizing dye, capable of being excited upon the holographic exposure in the first step, has a molar absorption coefficient of 5,000 or less.

2. The hologram recording method as claimed in claim 1, wherein in the second step, the light irradiation is a non-imagewise exposure.

3. The hologram recording method as claimed in claim 1, wherein the second step is a step of causing the polymerization reaction while the colored material is self sensitized or self amplified upon irradiating the colored material with a light which has a wavelength different from that of the holographic exposure, so as to form the first interference fringe providing the refractive index modulation.

4. The hologram recording method as claimed in claim 1, which comprises fixing a sensitizing dye, capable of being excited upon the holographic exposure in the first step, by decomposing the sensitizing dye in the first step, the second step or a subsequent fixing step of at least one of light irradiation and heat application.

5. The hologram recording method as claimed in claim 1, which comprises fixing a colored material to form the latent image, the colored material having no absorption of a hologram reproducing light, by decomposing the colored material in the second step or a subsequent fixing step of at least one of light irradiation and heat application.

6. A hologram recording method as claimed in claim 1, which is a method for recording a volume phase hologram.

7. A hologram recording method as claimed in claim 1, wherein in the first step, a multiplex hologram recording is performed by effecting the holographic exposure 10 times or more so as to the latent image.

8. A hologram recording method as claimed in claim 7, wherein the multiplex hologram recording is performed under the common exposure amount.

9. A hologram recording material used in a hologram recording method according to claim 1, the hologram recording material comprising:
a sensitizing dye capable of absorbing a light upon holographic exposure in the first step to be transformed into a first excited state;
a dye precursor capable of forming a colored material as a result of one of electron transfer and energy transfer from the first excited state of the sensitizing dye; or from a second excited state of the colored material, the second excited state of the colored material being formed in the second step, wherein the dye precursor is a combination comprising at least an acid-induced color forming dye precursor, an acid generator and an acid-increasing agent;
wherein the colored material has an absorption at a longer wavelength than a wavelength where the dye precursor has an absorption; and the colored material has no absorption of a hologram reproducing light;
a polymerizable compound;
a polymerization initiator capable of initiating polymerization of the polymerizable compound as a result of one of electron transfer and energy transfer from the first excited state of the sensitizing dye or from the second excited state of the colored material; and
a binder; and
an electron-donating compound having an ability of reducing a radial cation of the sensitizing dye, wherein the electron-donating compound is a phenothiazine compound.

10. The hologram recording material as claimed in claim 9, wherein the polymerizable compound and the binder differ in refractive index; and
the polymerizable compound is capable of being photopolymerized to record a interference fringe in the hologram recording material, wherein when the polymerizable compound is photopolymerized to provide a polymerized compound, a composition ratio of the polymerizable compound or the polymerized compound to the binder is different between a bright portion of the interference fringe and a dark portion of the interference fringe, so as to form a interference fringe providing a refractive index modulation.

11. The hologram recording material as claimed in claim 9, which is for an optical recording medium.

12. The optical recording medium, which comprises: a hologram recording material as claimed in claim 9; and a light-shielding cartridge, wherein the optical recording material is stored in a light-shielding cartridge during storage.

13. The hologram recording material as claimed in claim 9, which is for a three-dimensional display.

14. The hologram recording material as claimed in claim 9, which is for a holographic optical device.

15. The hologram recording material as claimed in claim 9, wherein the acid-increasing agent is a compound represented by the following formula (4-1), (4-2), (4-3), (4-4), (4-5) or (4-6):

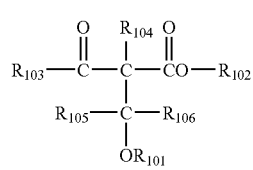

Formula (4-1)

-continued

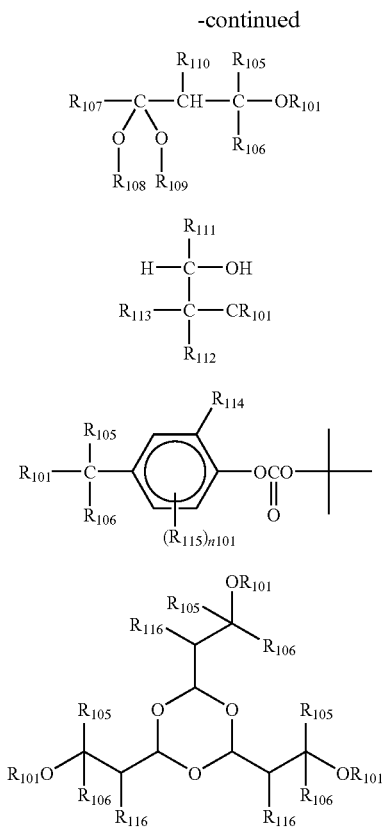

Formula (4-2)

Formula (4-3)

Formula (4-4)

Formula (4-5)

-continued

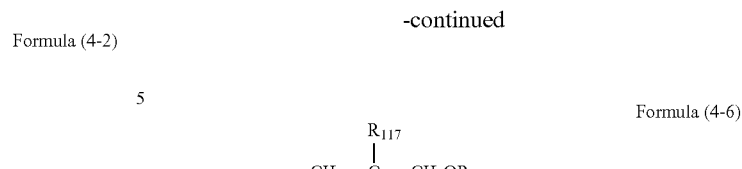

Formula (4-6)

wherein $R_{101}$ represents a group of forming an acid having a pKa of 5 or less in the form of $R_{101}OH$; $R_{102}$ represents a 2-alkyl-2-propyl group, a 2-aryl-2-propyl group, a cyclohexyl group, a tetrahydropyranyl group or a bis(p-alkoxyphenyl)methyl group; $R_{103}$, $R_{104}$, $R_{115}$ and $R_{117}$ each independently represents a substituent; $R_{105}$, $R_{106}$, $R_{107}$, $R_{110}$, $R_{113}$ and $R_{116}$ each independently represents a hydrogen atom or a substituent; $R_{118}$ and $R_{119}$ each independently represents an alkyl group and may combine with each other to form a ring; $R_{111}$ and $R_{112}$ represent alkyl groups which combine with each other to form a ring; $R_{114}$ represents a hydrogen atom or a nitro group; and n101 represents an integer of 0 to 3.

16. The hologram recording material as claimed in claim 15, wherein in formulae (4-1) to (4-6), $R_{101}$ is a group of being a sulfonic acid or an electron-withdrawing group-substituted carboxylic acid in the form of $R_{101}OH$.

* * * * *